(12) United States Patent
Chen et al.

(10) Patent No.: US 11,688,647 B2
(45) Date of Patent: Jun. 27, 2023

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Bwo-Ning Chen, Keelung (TW);
Xu-Sheng Wu, Hsinchu (TW);
Chang-Miao Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 156 days.

(21) Appl. No.: 17/387,931

(22) Filed: Jul. 28, 2021

(65) Prior Publication Data

US 2021/0358814 A1     Nov. 18, 2021

Related U.S. Application Data

(62) Division of application No. 16/699,496, filed on Nov. 29, 2019, now Pat. No. 11,081,401.

(51) Int. Cl.
*H01L 21/8238* (2006.01)
*H01L 27/092* (2006.01)
*H01L 29/66* (2006.01)
*H01L 21/02* (2006.01)

(52) U.S. Cl.
CPC ........... *H01L 21/823821* (2013.01); *H01L 21/02126* (2013.01); *H01L 21/02337* (2013.01); *H01L 21/02348* (2013.01); *H01L 21/823828* (2013.01); *H01L 21/823878* (2013.01); *H01L 27/0924* (2013.01); *H01L 29/66545* (2013.01)

(58) Field of Classification Search
CPC ....................... H01L 27/0924; H01L 29/66545
See application file for complete search history.

(56) References Cited

U.S. PATENT DOCUMENTS

| | | | |
|---|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |

(Continued)

*Primary Examiner* — Farun Lu
(74) *Attorney, Agent, or Firm* — Maschoff Brennan

(57) ABSTRACT

A semiconductor device includes an N-type fin-like field effect, a P-type fin-like field effect transistor, a shallow trench isolation (STI) structure, a first interlayer dielectric (ILD) layer, and a second ILD layer. The N-type fin-like field effect transistor includes a first semiconductor fin, a gate structure across the first semiconductor fin, and a first source/drain feature in contact with the first semiconductor fin. The P-type fin-like field effect transistor includes a second semiconductor fin, the gate structure across the second semiconductor fin, and a second source/drain feature in contact with the second semiconductor fin. The structure surrounds the first and second semiconductor fins. The first interlayer dielectric (ILD) layer covers the first source/drain feature. The second ILD layer covers the second source/drain feature, wherein a porosity of the second ILD layer is greater than a porosity of the first ILD layer.

20 Claims, 71 Drawing Sheets

(56) References Cited

U.S. PATENT DOCUMENTS

| | | |
|---|---|---|
| 9,812,363 B1 | 11/2017 | Liao et al. |
| 9,859,380 B2 | 1/2018 | Lee et al. |
| 2017/0373058 A1 | 12/2017 | Tsau et al. |
| 2018/0301384 A1* | 10/2018 | Ching ................... H01L 21/845 |

* cited by examiner

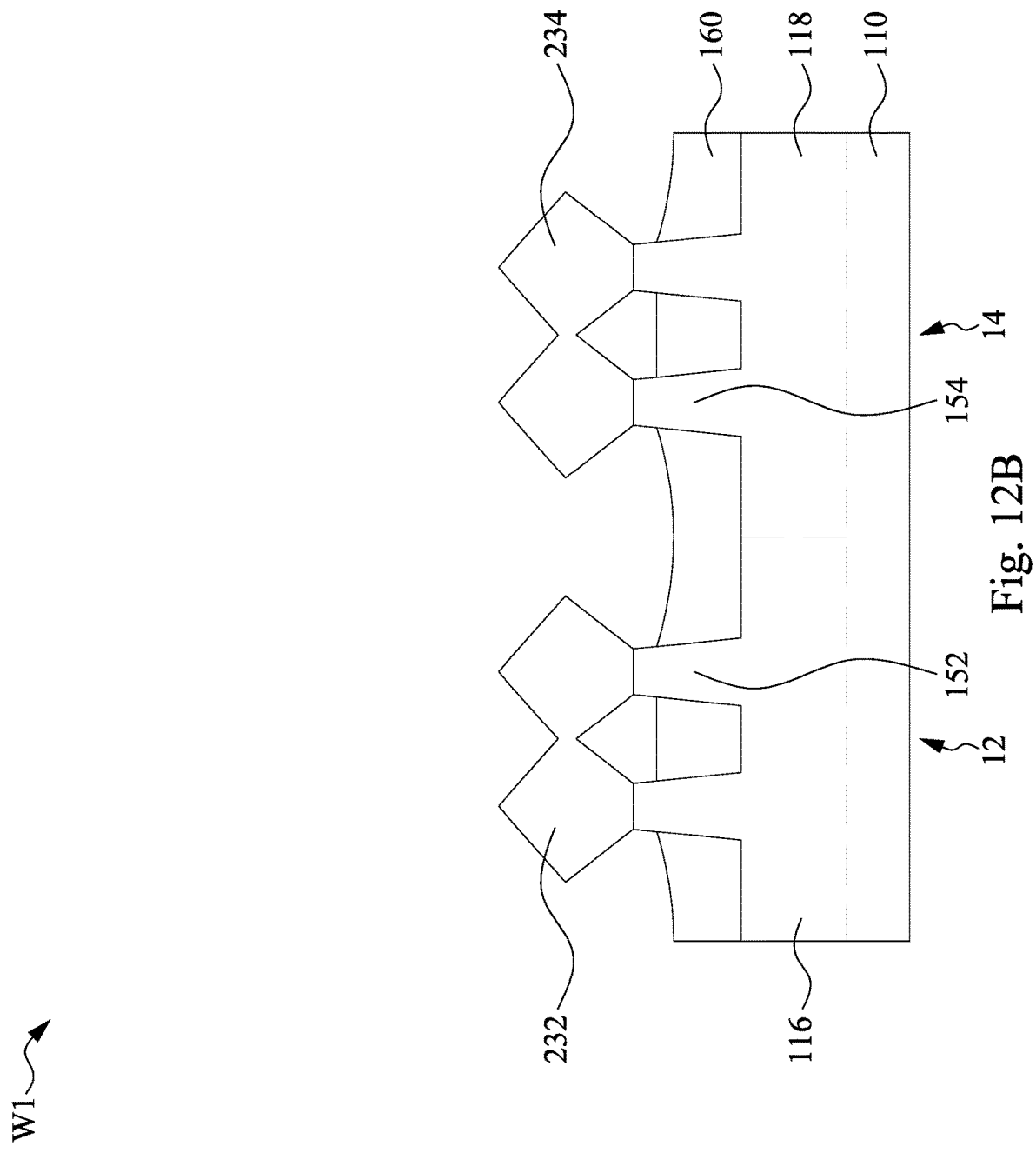

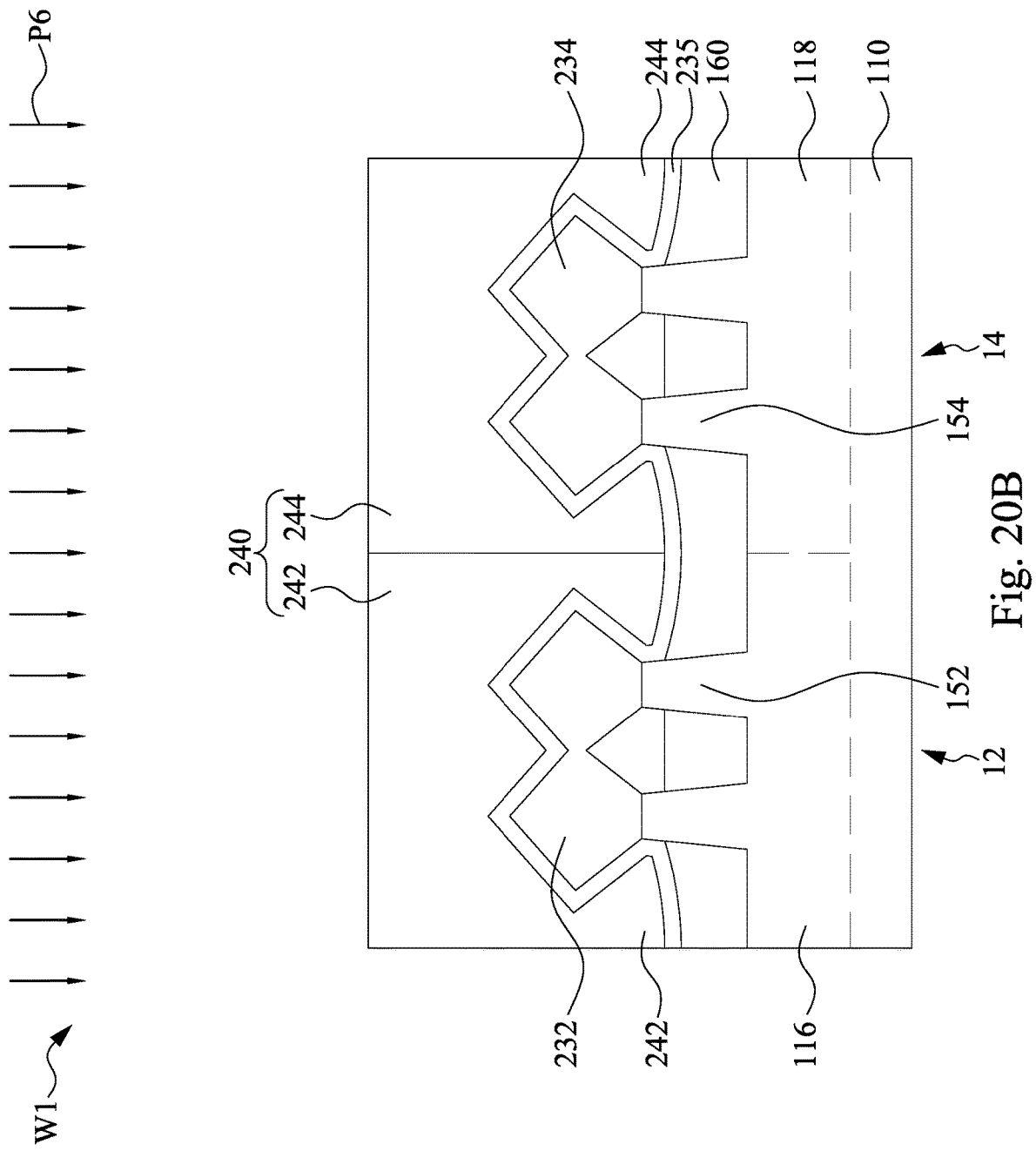

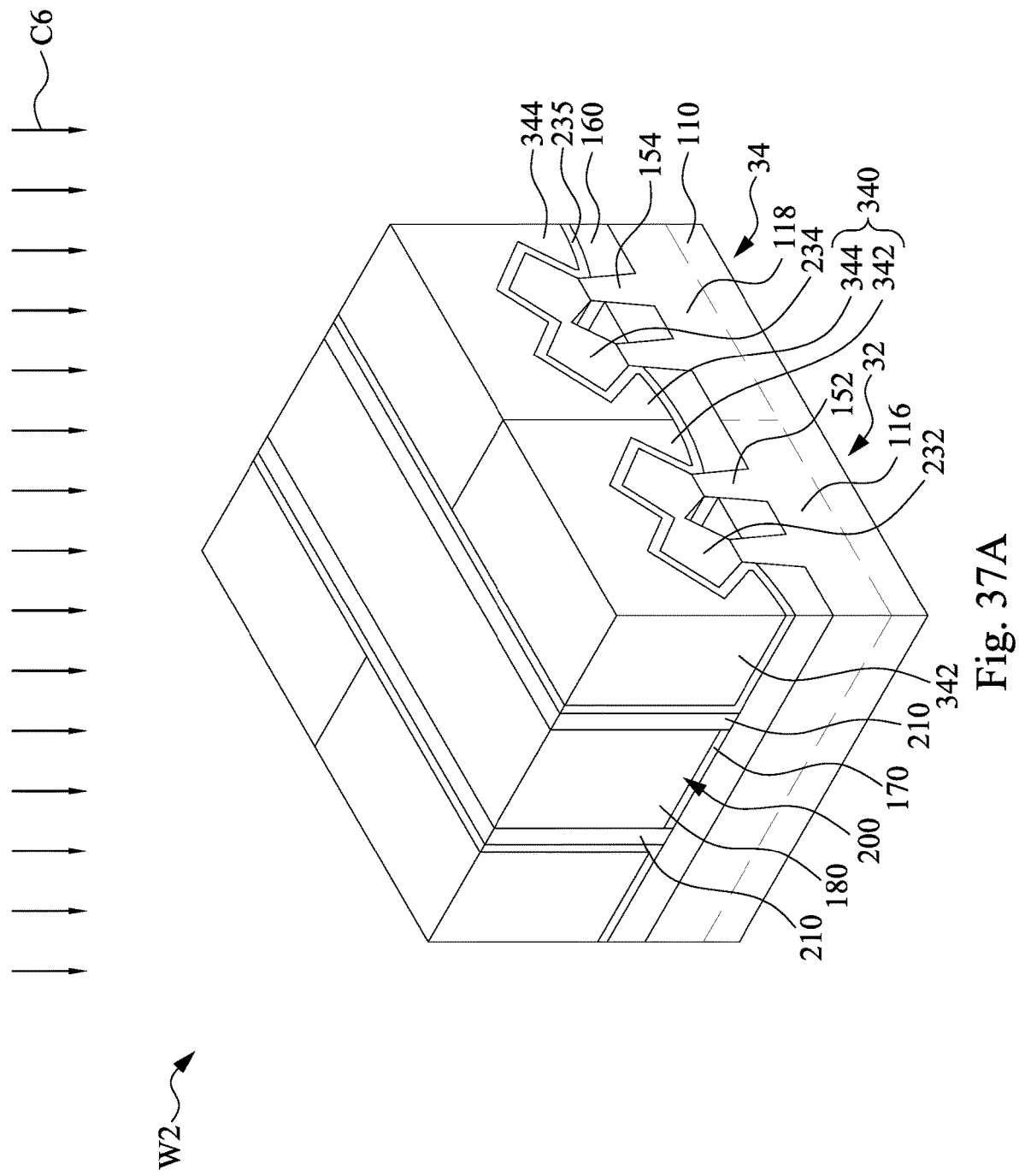

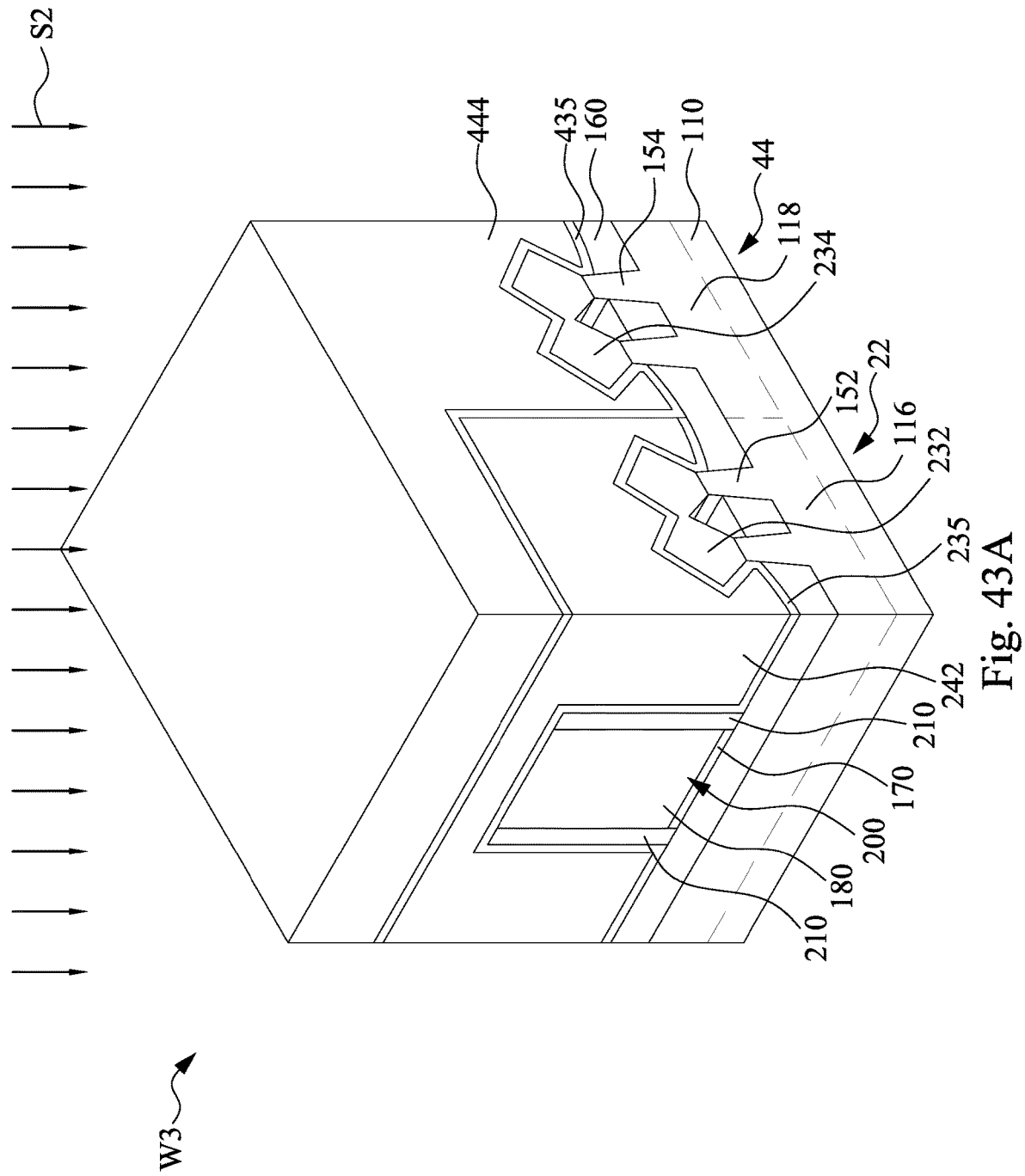

SEMICONDUCTOR DEVICE AND METHOD FOR MANUFACTURING THE SAME

RELATED APPLICATION

The present application is a Divisional Application of the U.S. application Ser. No. 16/699,496, filed Nov. 29, 2019, now U.S. Pat. No. 11,081,401, issued Aug. 3, 2021, which is herein incorporated by reference in it entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
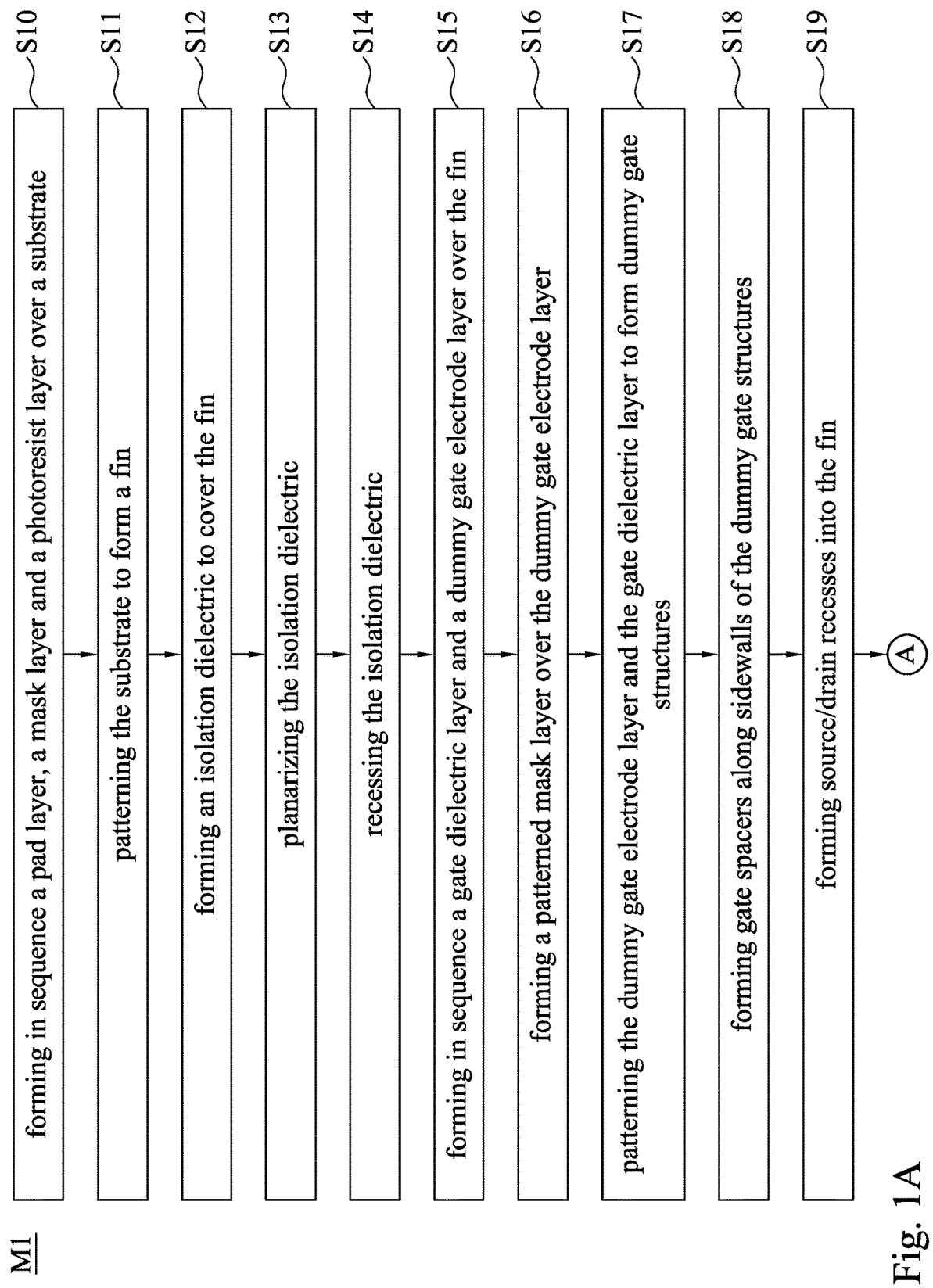
FIGS. 1A to 1B illustrate a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
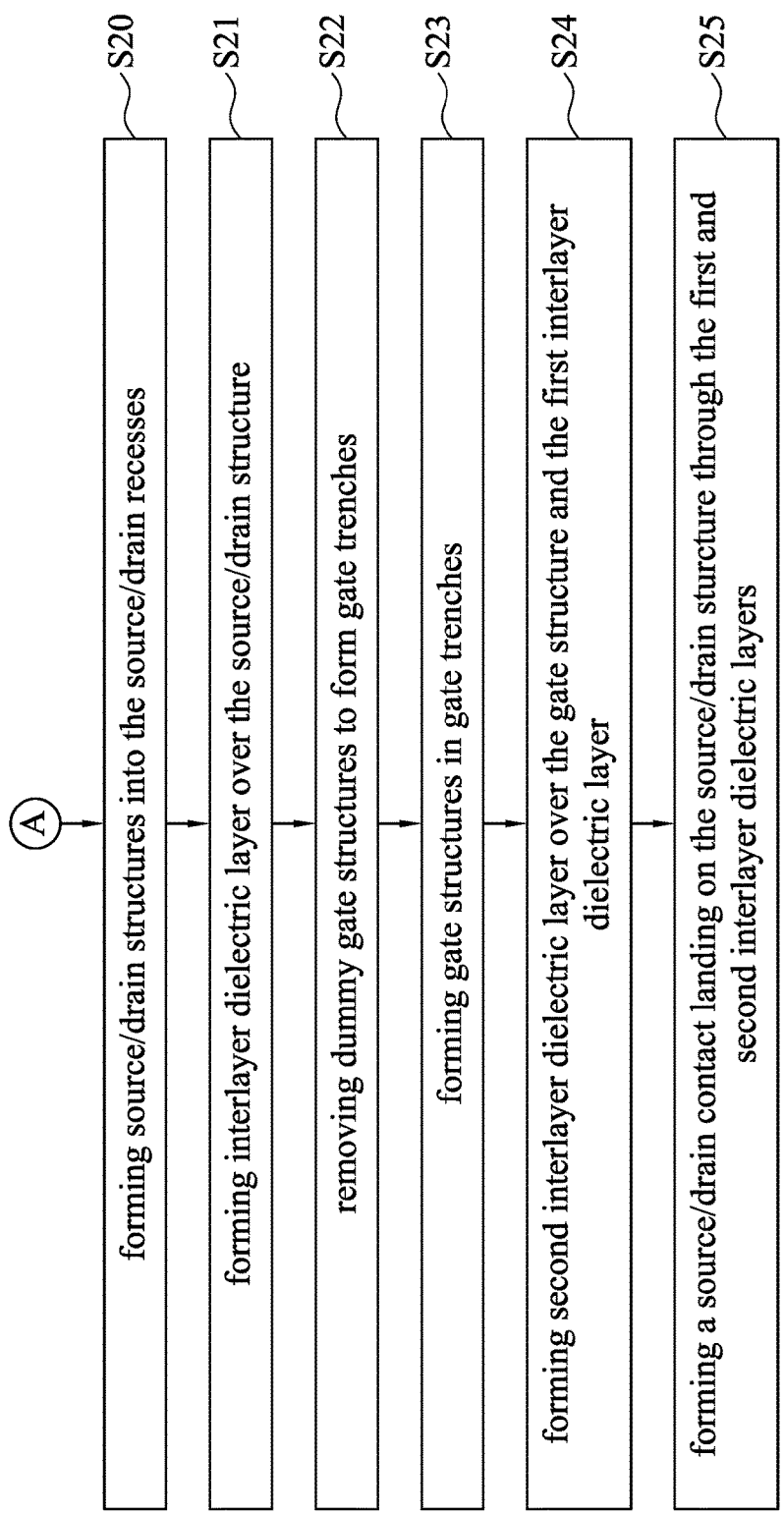

Referring now to FIGS. 1A and 1B, illustrated are an exemplary method M1 for fabrication of a semiconductor device in accordance with some embodiments. The method M1 includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M1 includes fabrication of a FinFET device. However, the fabrication of FinFET device is merely example for describing the manufacturing process according to some embodiments of the present disclosure.

Figure 2:
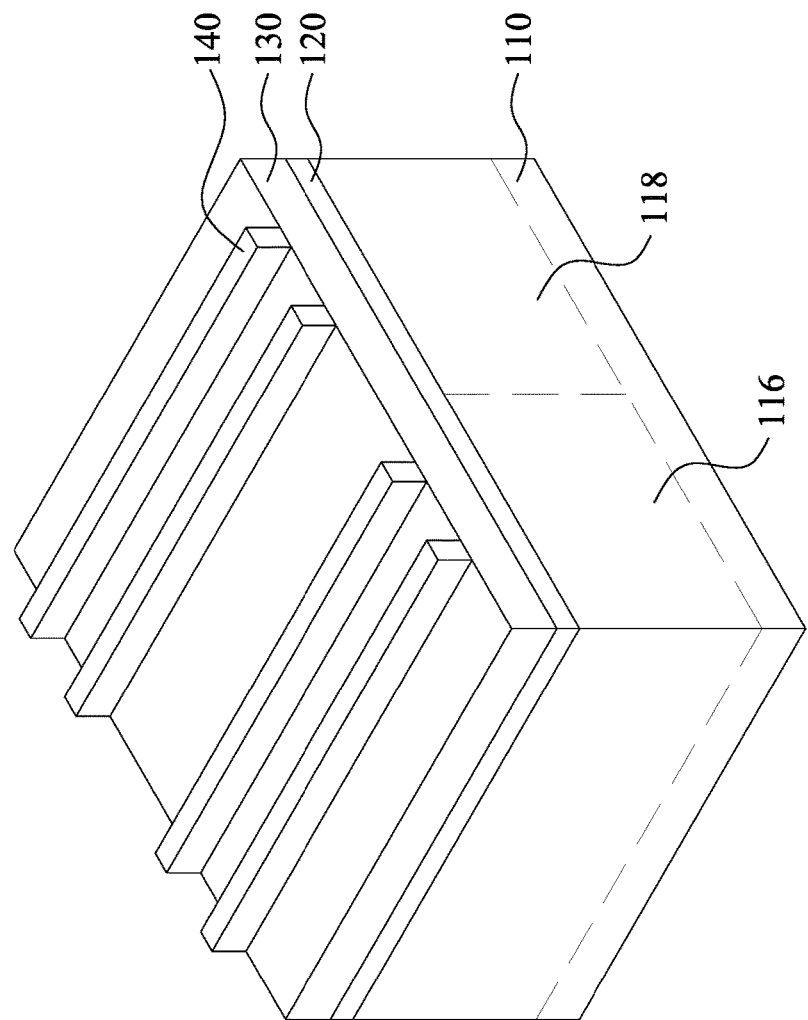
FIGS. 2 to 28 illustrate a wafer at various stages of the method in FIGS. 1A and 1B according to some embodiments of the present disclosure.

FIGS. 2 to 28 illustrate a wafer W1 at various stages of the method M1 according to some embodiments of the present disclosure. The method M1 begins at block S10 where a pad layer, a mask layer and a photoresist layer are formed in sequence over a substrate. Referring to FIG. 2, in some embodiments of block S10, a wafer W1 undergoes a series of deposition and photolithography processes, such that a pad layer 120, a mask layer 130 and a patterned photoresist layer 140 are formed on a substrate 110 of the wafer W1. In some embodiments, the substrate 110 is a semiconductor substrate, such as a bulk semiconductor, a semiconductor-on-insulator (SOI) substrate, or the like. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 2, a P-type well 116 and an N-type well 118 in the substrate 110 which divide the substrate 110 into separate regions for different types of devices or transistors. Example materials of the P-type well 116 and the N-type well 118 include, but are not limited to, semiconductor materials doped with various types of p-type dopants and/or n-type dopants. In some embodiments, the P-type well 116 includes p-type dopants, and the N-type well 118 includes n-type dopants. In the example configuration in FIG. 2, the N-type well 118 is a region for forming p-channel metal-oxide semiconductor (PMOS) transistors, and the P-type well 116 is a region for forming n-channel metal-oxide semiconductor (NMOS) transistors. The described conductivity of the well regions 116 and 118 herein is an example. Other arrangements are within the scope of various embodiments.

In some embodiments, the pad layer 120 is a thin film including silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photoresist layer 140 is formed on the mask layer 130 and is then patterned, forming openings in the photoresist layer 140, so that regions of the mask layer 130 are exposed.

Figure 3:
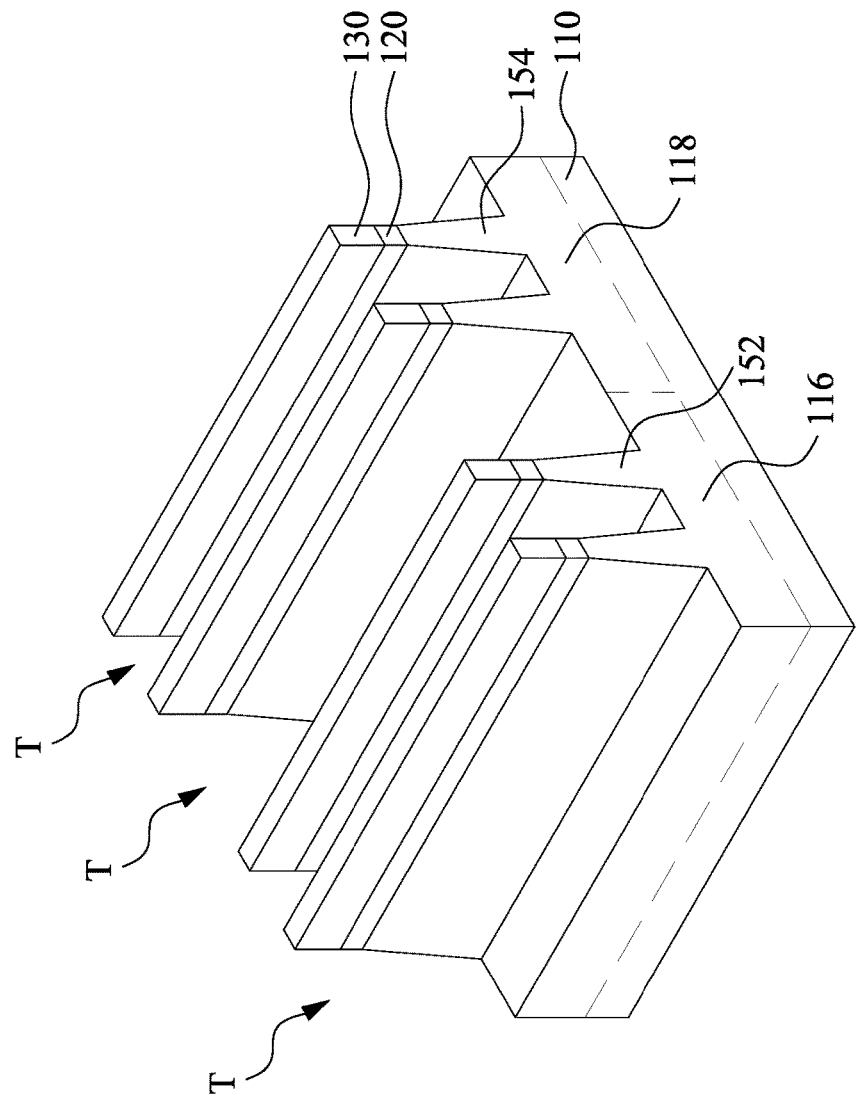

Returning to FIG. 1A, the method M1 then proceeds to block S11 where the substrate is patterned to form one or more fins. With reference to FIG. 3, in some embodiments of block S11, the mask layer 130 and pad layer 120 are etched through the photoresist layer 140, exposing the underlying P-type well 116 and the underlying N-type well 118. The exposed P-type well 116 and the exposed N-type well 118 are then etched, forming trenches T. Portions of the P-type well 116 between neighboring trenches T can be referred to as semiconductor fins 152. Portions of the N-type well 118 between neighboring trenches T can be referred to as semiconductor fins 154. After etching the P-type well 116 and the N-type well 118, the photoresist layer 140 is removed. Next, a cleaning step may be optionally performed to remove a native oxide of the semiconductor substrate 110. The cleaning may be performed using diluted hydrofluoric (HF) acid, for example. According to the various aspects of the present disclosure, the semiconductor fins 152 and 154 extend along a first direction. In some embodiments, the semiconductor fin 152 and 154 may also be referred to as oxide-definition (OD) regions.

Figure 4:
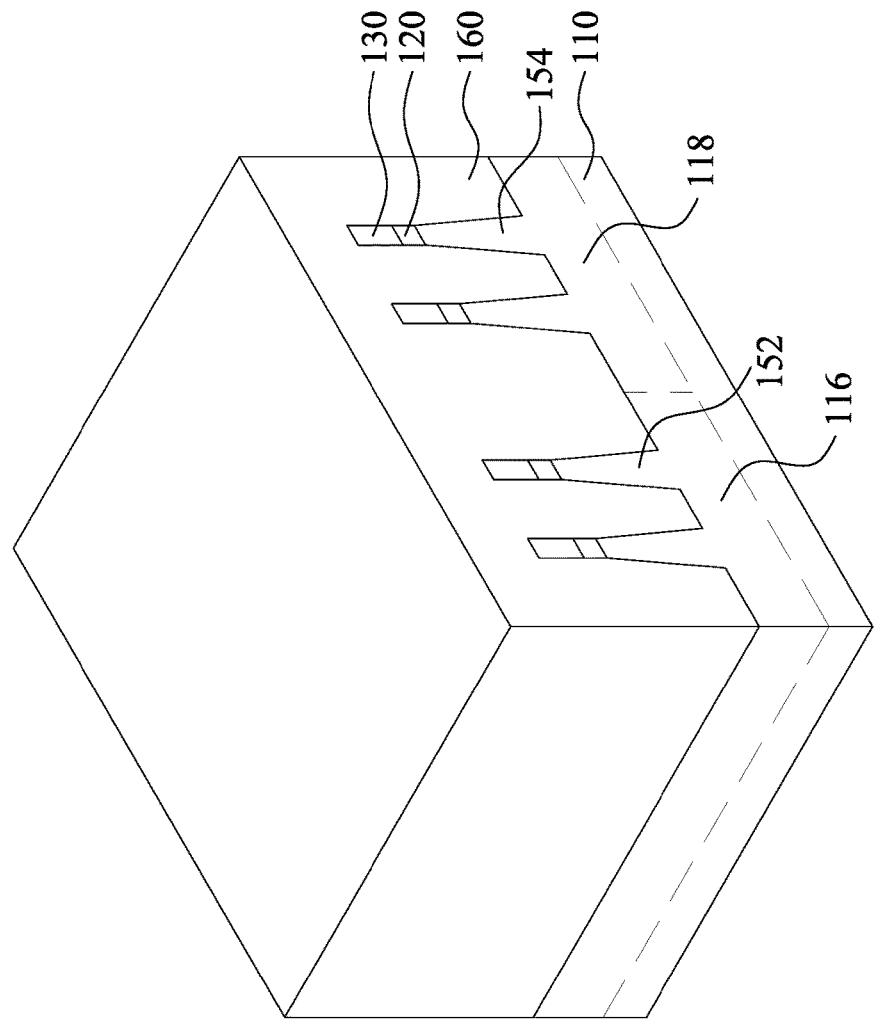

Returning to FIG. 1A, the method M1 then proceeds to block S12 where an isolation dielectric is formed to cover the fin. With reference to FIG. 4, an isolation dielectric 160 is formed to overfill the trenches T and cover the semiconductor fins 152 and 154. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 5:
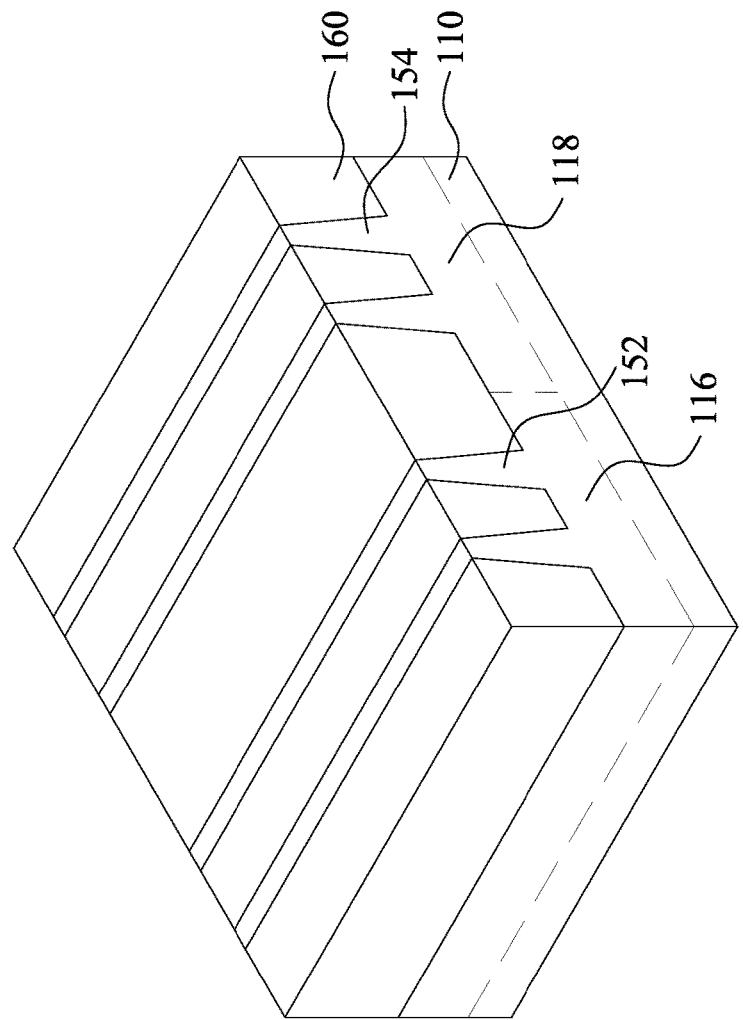

Returning to FIG. 1A, the method M1 then proceeds to block S13 where a planarization process is performed to the isolation dielectric. With reference to FIG. 5, a planarization process such as chemical mechanical polish (CMP) is performed to remove the excess isolation dielectric 160 over the semiconductor fins 152 and 154. In some embodiments, the planarization process may also remove the mask layer 130 and the pad layer 120 such that top surfaces of the semiconductor fins 152 and 154 are exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 6:
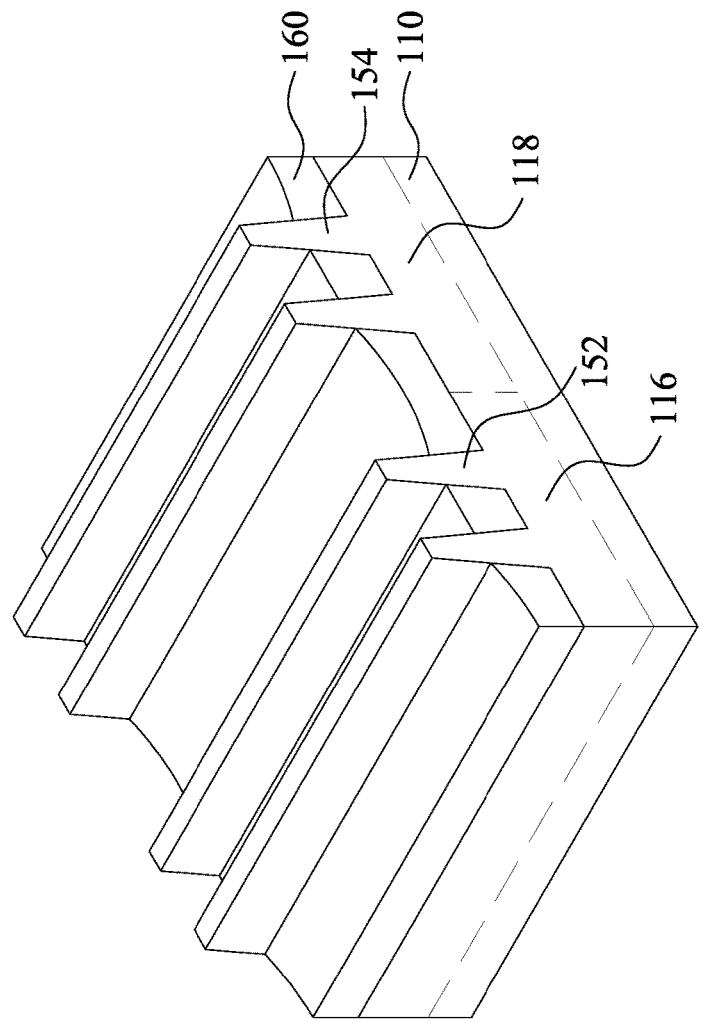

Returning to FIG. 1A, the method M1 then proceeds to block S14 where the isolation dielectric is recessed. With reference to FIG. 6, the isolation dielectric 160 is recessed, for example, through an etching operation, in which diluted HF, SiCoNi (including HF and $NH_3$), or the like, may be used as the etchant. After recessing the isolation dielectric 160, a portion of the semiconductor fin 152 and a portion of the semiconductor fin 154 are higher than a top surface of the isolation dielectric 160. In some embodiments, the isolation dielectric 160 has a curved surface. Moreover, it seems that a curvature of the isolation dielectric 160 between the semiconductor fin 152 and the semiconductor fin 154 is greater than a curvature of the isolation dielectric 160 between the semiconductor fins 152, and greater than a curvature of the isolation dielectric 160 between the semiconductor fins 154. In some embodiments, a top surface of the isolation dielectric 160 between the semiconductor fin 152 and the semiconductor fin 154 is concave. In some embodiments, a top surface of the isolation dielectric 160 between the semiconductor fins 152 or between the semiconductor fins 154 is convex. Moreover, it seems that a top surface of the isolation dielectric 160 between the semiconductor fin 152 and the semiconductor fin 154 is lower than a top surface of the isolation dielectric 160 between the semiconductor fins 152 or between the semiconductor fins 154.

It is understood that the blocks S10-S14 described above are merely an example of how the semiconductor fins 152 and 154 and the STI structure 160 are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fins 152 and 154 can be recessed, and a material different from the recessed semiconductor fins 152 and 154 is epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 152 or the semiconductor fin 154 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also be used to refer to processes in which the device or substrate being processed is not exposed to an external environment (e.g., external to the processing system).

Figure 7:
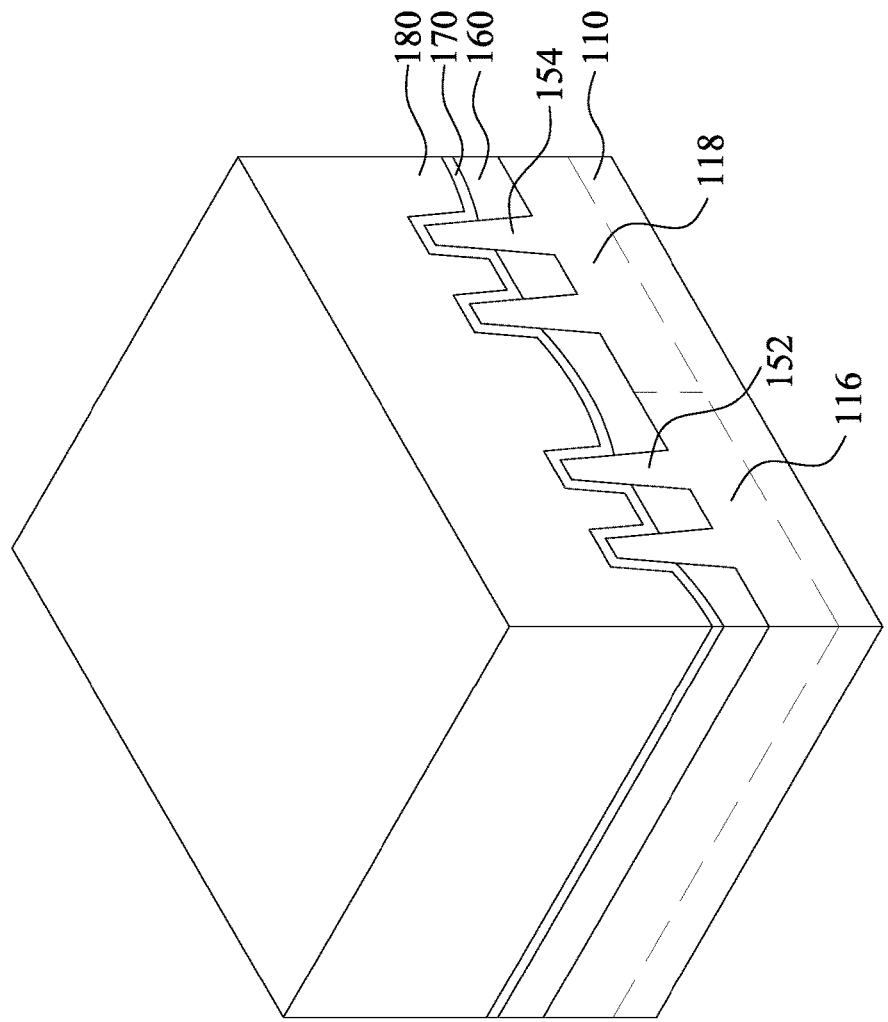

Returning to FIG. 1A, the method M1 then proceeds to block S15 where a gate dielectric layer and a dummy gate electrode layer are formed in sequence over the fin. With reference to FIG. 7, a gate dielectric layer 170 is blanket formed over the P-type well 116 and the N-type well 118 to cover the semiconductor fins 152 and 154 and the isolation dielectric 160, and a dummy gate electrode layer 180 is formed over the gate dielectric layer 170. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

In some embodiments, the dummy gate electrode layer 180 may include polycrystalline-silicon (poly-Si), polycrystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 8:
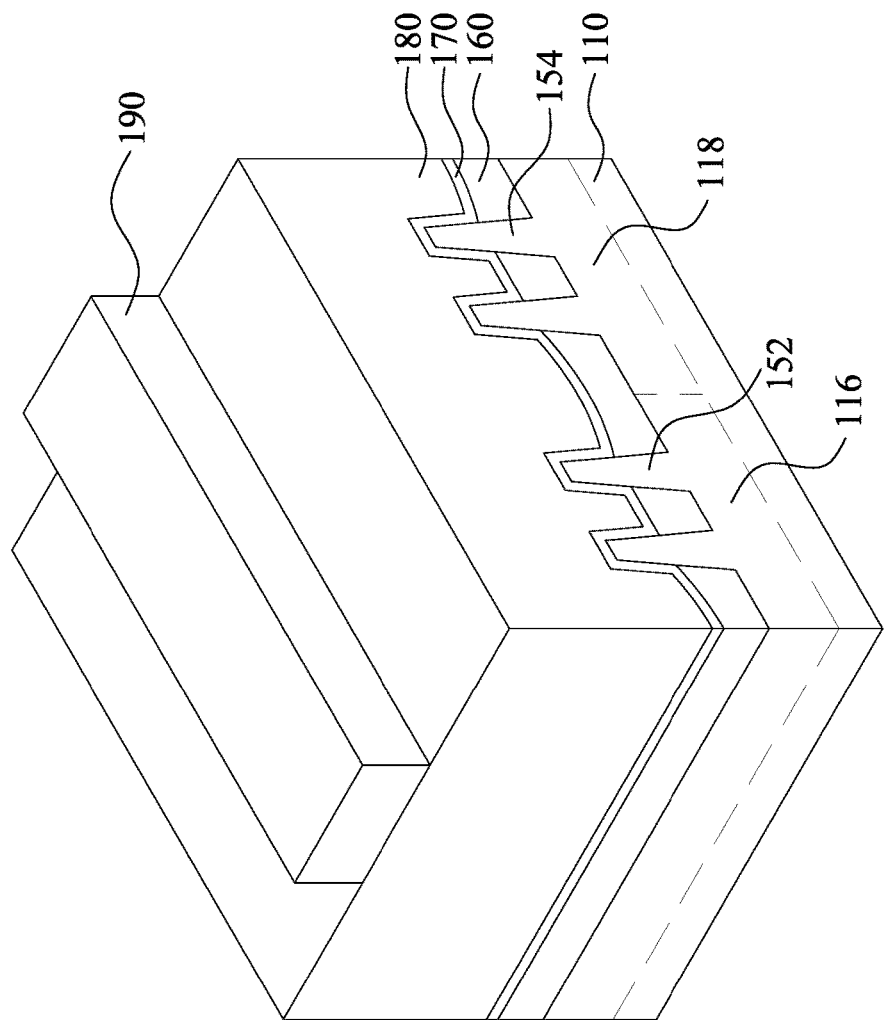

Returning to FIG. 1A, the method M1 then proceeds to block S16 where a patterned mask layer is formed over the dummy gate electrode layer. With reference to FIG. 8, in some embodiments of block S16, a patterned mask layer 190 is formed over the dummy gate electrode layer 180 and then patterned to form separated mask portions. The patterned mask layer 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 9:
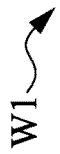
Figure 9:
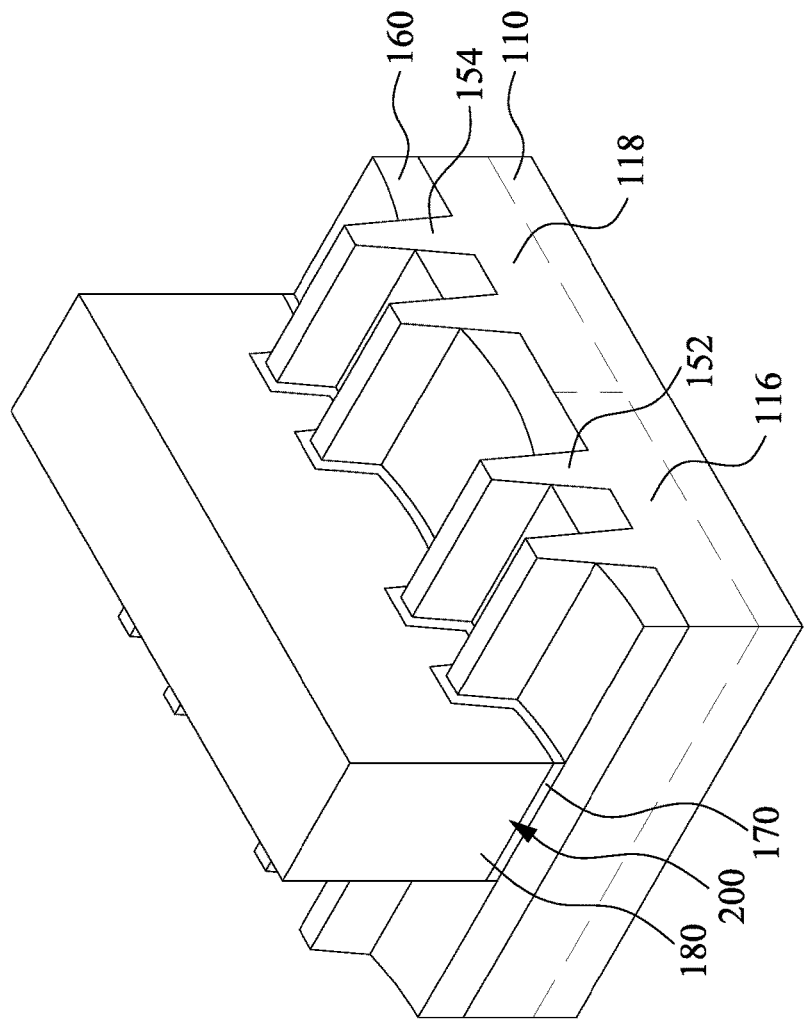

Returning to FIG. 1A, the method M1 then proceeds to block S17 where the dummy gate electrode layer and the gate dielectric layer are patterned to form dummy gate structures. With reference to FIG. 9, in some embodiments of block S17, one or more etching processes are performed to form dummy gate structures 200 wrapping around the semiconductor fins 152 and 154 using the patterned mask 190 as an etching mask, and the patterned mask layer 190 is removed after the etching. Each dummy gate structure includes a gate dielectric layer 170 and a dummy gate electrode layer 180 over the gate dielectric layer 170. The dummy gate structures 200 have substantially parallel longitudinal axes that are substantially perpendicular to a longitudinal axis of the semiconductor fins 152 and 154. The dummy gate structures 200 will be replaced with a replacement gate structure using a "gate-last" or replacement-gate process.

Figure 10:
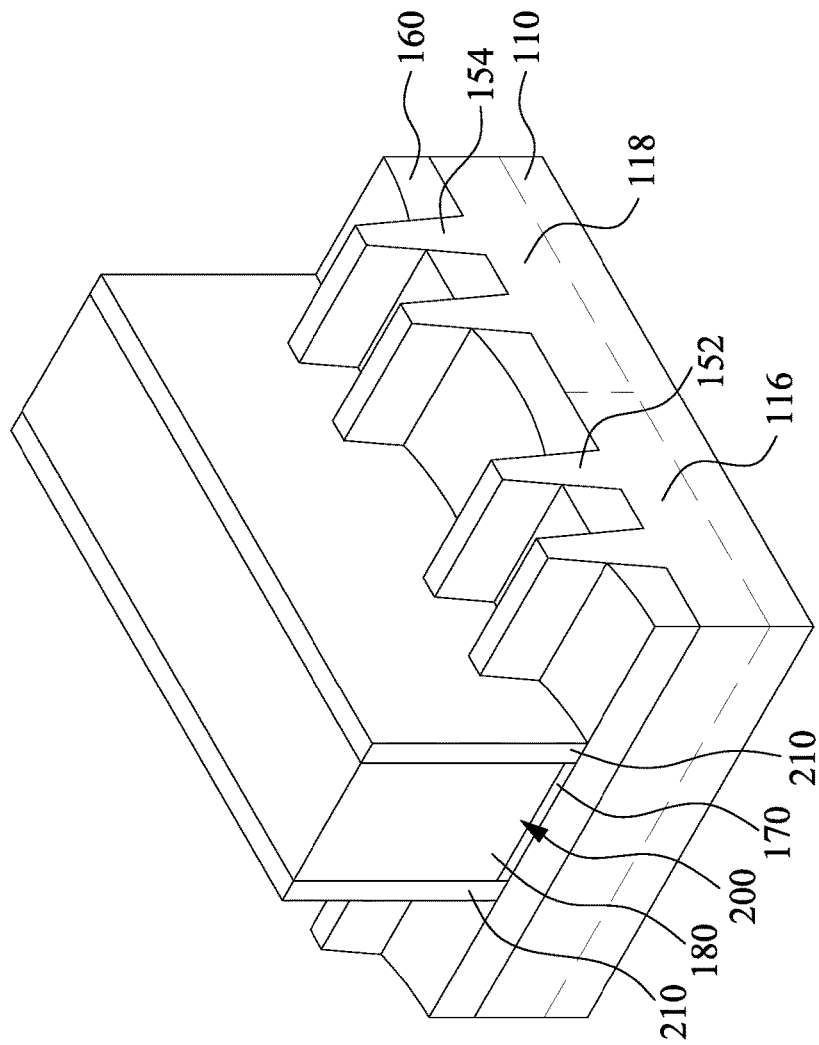

Returning to FIG. 1A, the method M1 then proceeds to block S18 where gate spacers are formed along sidewalls of the dummy gate structures. With reference to FIG. 10, in some embodiments of block S18, gate spacers 210 are formed along sidewalls of the dummy gate structures 200. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 210 may include a single layer or multilayer structure made of different dielectric materials. The method of forming the gate spacers 210 includes blanket forming a dielectric layer on the structure shown in FIG. 9 using, for example, CVD, PVD or ALD, and then performing an etching process such as anisotropic etching to remove horizontal portions of the dielectric layer. The remaining portions of the dielectric layer on sidewalls of the dummy gate structures 200 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 11:
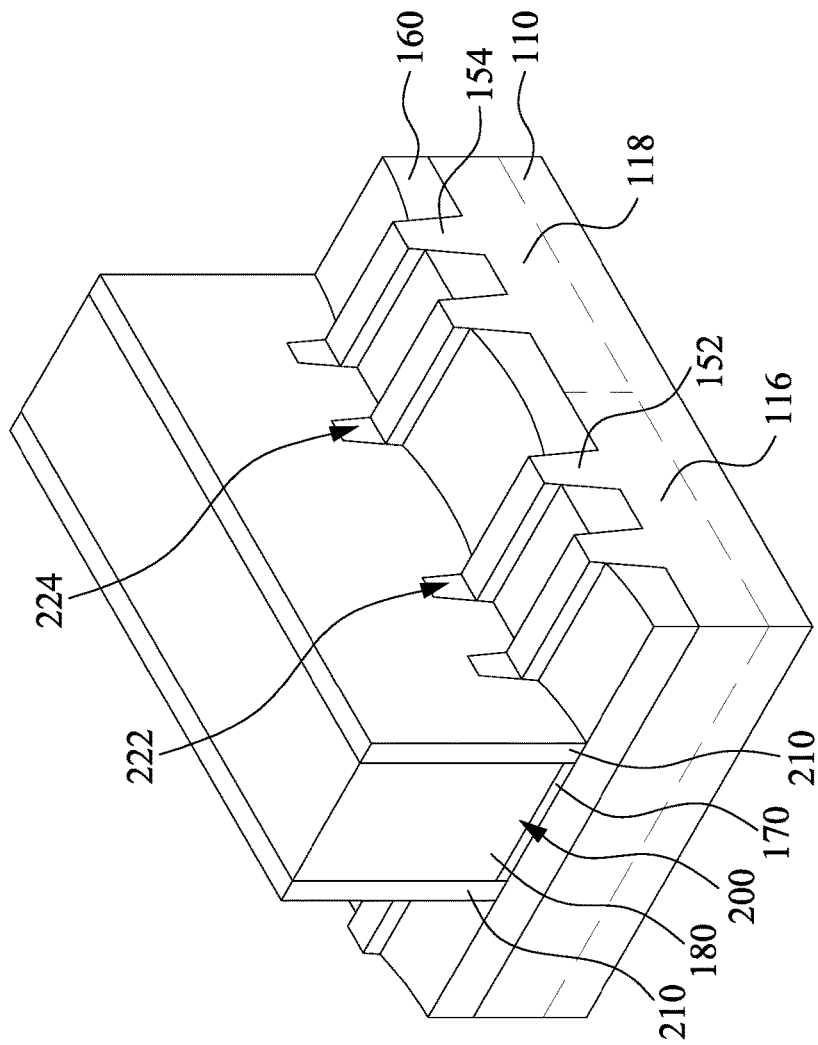

Referring to FIG. 1A, the method M1 then proceeds to block S19 where source/drain recesses are formed into the fin. With reference to FIG. 11, in some embodiments of block S19, portions of the semiconductor fins 152 and 154 not covered by the dummy gate structures 200 and the gate spacers 210 are recessed to form recesses 222 and 224.

In some embodiments, formation of the recesses 222 and 224 may include a dry etching process, a wet etching process, or combination dry and wet etching processes. This etching process may include reactive ion etch (RIE) using the dummy gate structures 200 and gate spacers 210 as masks, or by any other suitable removal process. After the etching process, a pre-cleaning process may be performed to clean the recesses 222 and 224 with hydrofluoric acid (HF) or other suitable solution in some embodiments.

Figure 12A:
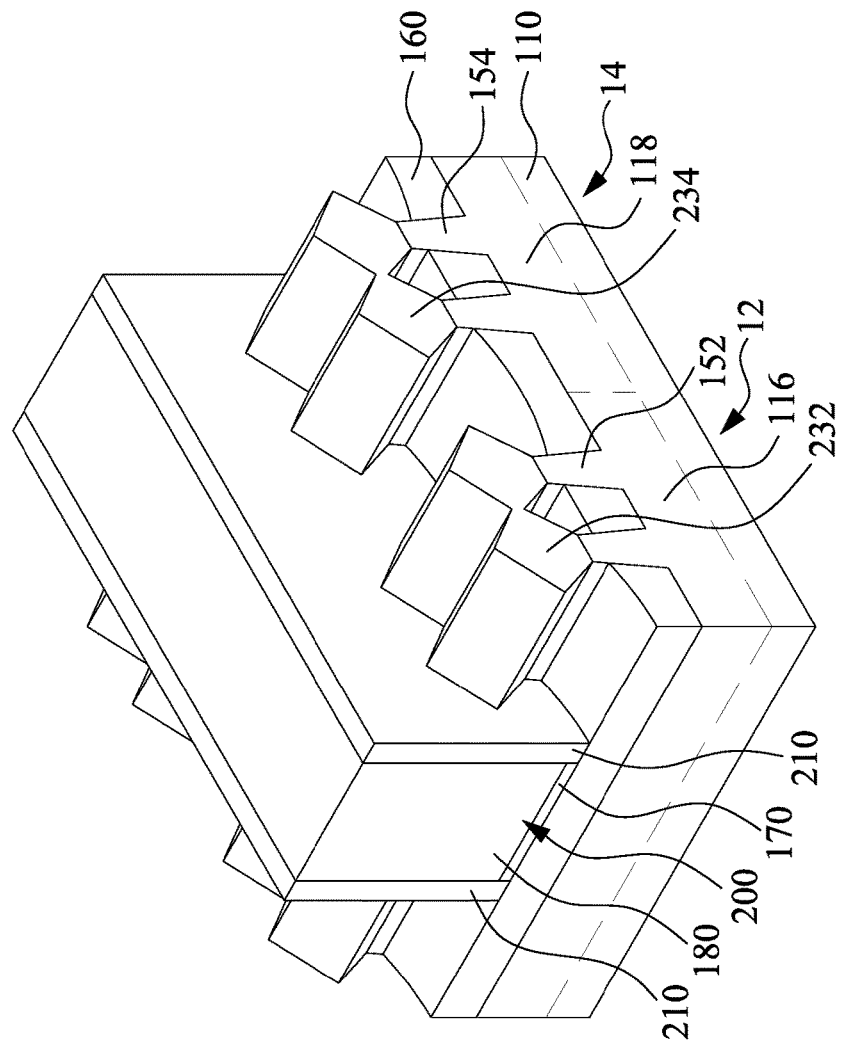

Returning to FIG. 1B, the method M1 then proceeds to block S20 where source/drain structures are formed into the recesses. With reference to FIGS. 12A and 12B, in some embodiments of block S20, epitaxial source/drain structures 232 and 234 are respectively formed in the recesses 222 and 224 (see FIG. 11) to form an n-channel metal-oxide semiconductor (NMOS) transistor 12 and a p-channel metal-oxide semiconductor (PMOS) transistors 14. In some embodiments, stress may enhance carrier mobility and performance of the MOS.

As shown in FIGS. 12A and 12B, the epitaxial source/drain structures 232 and 234 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 152 and 154. The epitaxial source/drain structures 232 and 234 can be formed in different epitaxy processes. The epitaxial source/drain structures 232 and 234 may include semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial source/drain structures 232 and 234 have suitable crystallographic orientation (e.g., a (100), (110), or (111) crystallographic orientation). In some embodiments, lattice constants of the epitaxial source/drain structures 232 and 234 are different from that of the semiconductor fins 152 and 154, so that the channel region between the epitaxial source/drain structures 232 and 234 can be strained or stressed by the epitaxial source/drain structures 232 and 234 to improve carrier mobility of the semiconductor device and enhance the device performance.

In some embodiments, the epitaxial source/drain structure 232 is an n-type epitaxy structure, and the epitaxial source/drain structure 234 is a p-type epitaxy structures. The epitaxial source/drain structure 232 may include SiP, SiC, SiPC, Si, III-V compound semiconductor materials or combinations thereof, and the pitaxial source/drain structure 234 may include SiGe, SiGeC, Ge, Si, III-V compound semiconductor materials, or combinations thereof. During the formation of the epitaxial source/drain structure 232, n-type impurities such as phosphorous or arsenic may be doped with the proceeding of the epitaxy. For example, when the epitaxial source/drain structure 232 includes SiC or Si, n-type impurities are doped. Moreover, during the formation of the epitaxial source/drain structure 234, p-type impurities such as boron or $BF_2$ may be doped with the proceeding of the epitaxy. For example, when the epitaxial source/drain structure 234 includes SiGe, p-type impurities are doped.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 152 and 154 (e.g., silicon, silicon germanium, silicon phosphate, or the like). The epitaxial source/drain structures 232 and 234 may be in-situ doped. The doping species include p-type dopants, such as boron or $BF_2$; n-type dopants, such as phosphorus or arsenic; and/or other suitable dopants including combinations thereof. If the epitaxial source/drain structures 232 and 234 are not in-situ doped, a second implantation process (i.e., a junction implant process) is performed to dope the epitaxial source/drain structures 232 and 234. One or more annealing processes may be performed to activate the epitaxial source/drain structures 230. The annealing processes include rapid thermal annealing (RTA) and/or laser annealing processes.

Returning to FIG. 1B, the method M1 then proceeds to block S21 where a contact etch stop layer (CESL) and an interlayer dielectric (ILD) layer is formed over the source/drain structures. In certain embodiments of block S21, with reference to FIGS. 13A-20B, the forming of the ILD layer 240 (See FIGS. 20A and 20B) includes deposition processes and curing processes. For example, it may perform a curing process (e.g., FIGS. 14A, 14B, 19A, and 19B) followed by a deposition step (e.g., FIGS. 13A, 13B, 18A, and 18B). In some embodiments, a planarization process (e.g., FIGS. 15A, 15B, 20A, and 20B) may follow the curing process (e.g., 14A, 14B, 19A, and 19B).

Figure 13A:
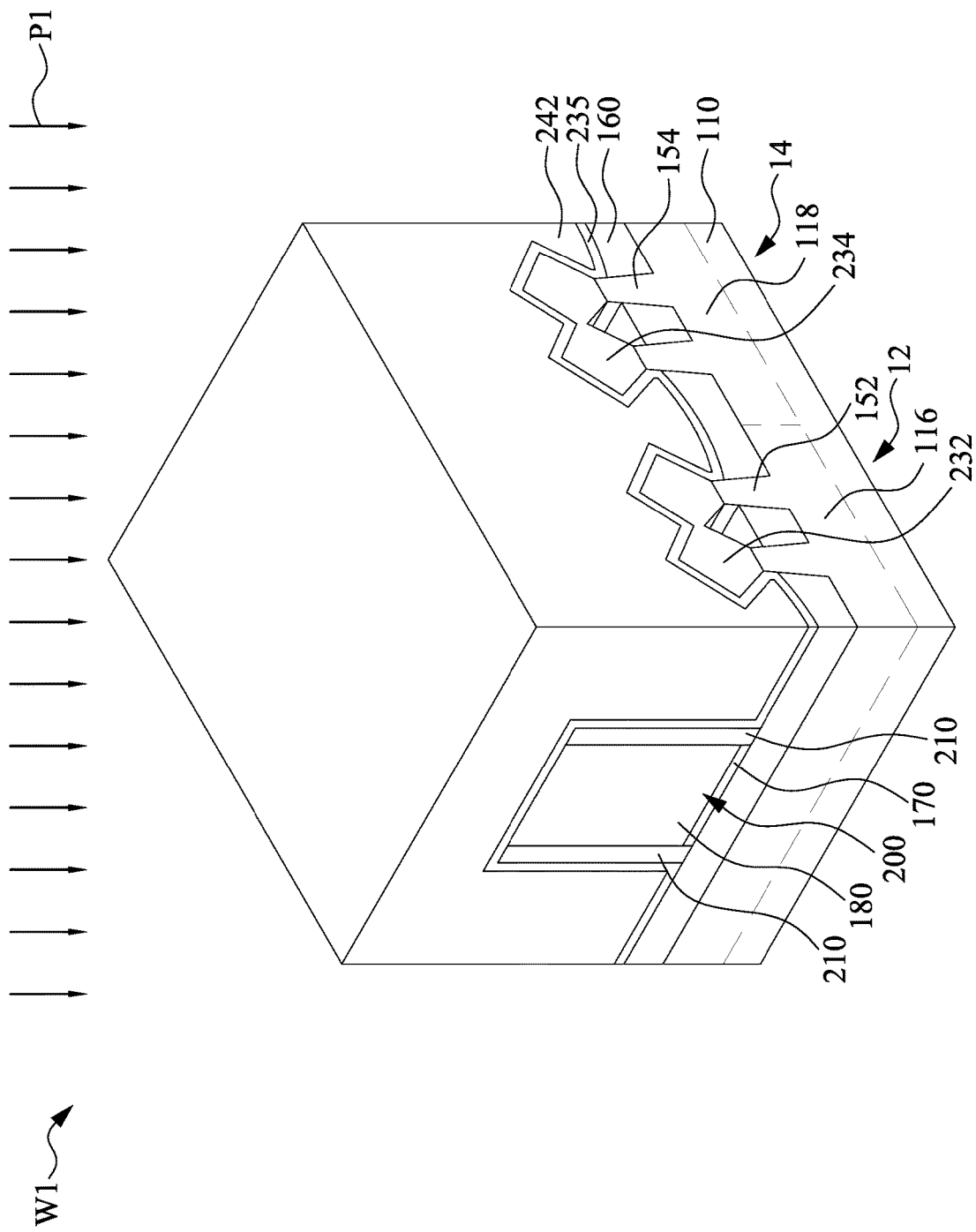
Figure 13B:
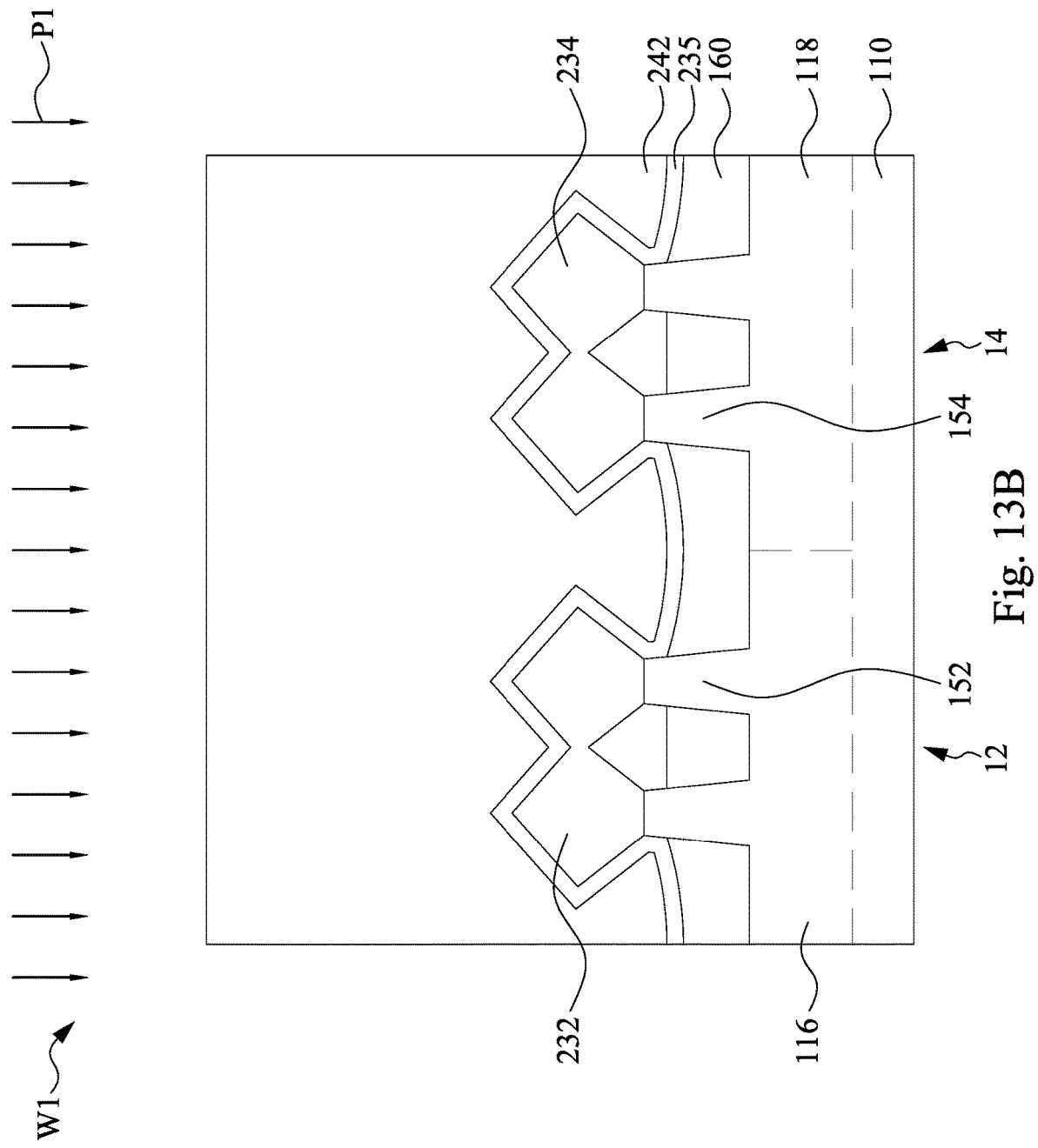

With reference to FIGS. 13A and 13B, a CESL 235 is formed over the epitaxial source/drain structures 232 and 234, the dummy gate structures 200, and the gate spacers 210, and a flowable dielectric material 242 is formed over the CESL 235 by a deposition process P1. In some embodiments, the CESL 235 includes silicon nitride, silicon oxynitride or other suitable materials. The CESL 235 can be formed using, for example, plasma enhanced CVD, low pressure CVD, ALD or other suitable techniques. In some embodiments, a processing temperature range of forming the CESL 235 may be in a range from about 300° C. to about 800° C. In some embodiments, a processing duration of forming the CESL 235 may be in a range from about 1 hr to about 3 hr.

In some embodiments, the flowable dielectric material 242 overfills the trenches T (See FIG. 3) and above a top surface of the dummy gate structures 200. The flowable dielectric material 242 can be formed by using a spin on dielectric (SOD) formation process, or by depositing a flowable dielectric by a chemical vapor deposition (CVD) process, such as radical-component CVD. The examples of flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

In some embodiments, the flowable dielectric material 242 is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or combinations thereof. In some embodiments, the silicon-containing precursor includes carbon. In some embodiments, the silicon-containing precursor includes oxygen, nitrogen, fluorine, hydrogen, or combinations thereof. In greater detail, the silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$).

In some embodiments, nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture including a combination of $NH_3$, $N_2$, and $H_2$.

The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor for forming the flowable dielectric material 242 deposited with this technique.

The deposition of the flowable dielectric material 242 may proceed while the temperature of the substrate 110 is maintained at a relatively low temperature. In some embodiments, the flowable dielectric material 242 is deposited on the substrate 110 at low temperature which is maintained by cooling the substrate 110 during the deposition. In some embodiments, the deposition may be performed at a temperature in a range from about −40° C. to about 200° C. In some embodiments, the deposition may be performed at a temperature less than about 100° C.

In some embodiments, the deposition pressure may be in a range from about 100 mTorr to about 10 Torr. In some embodiments, reaction source uses a gaseous environment including trisilylamine ($Si_3H_9N$, or TSA) and $NH_3$. In some embodiments, the flow rates of $Si_3H_9N$ and $NH_3$ are in the range of about 100 sccm to about 1000 sccm, and of about 100 sccm to about 2000 sccm, respectively.

The as-deposited flowable dielectric material 242 is capable of filling the narrow and deep gaps and prevents voids and discontinuities in the trenches T (See FIG. 3). The as-deposited flowable dielectric material 242 includes a flowable network of $SiO_AN_BH_C$ (or SiONH). In some embodiments, A is a number in a range from about 0.8 to about 2, B is a number from about 0.01 to about 1, and C is a number from about 0.01 to about 1. In some embodiments, the flowable dielectric material 242 has a thickness T1 (See FIG. 14A) above the dummy gate structures 200.

Figure 14A:
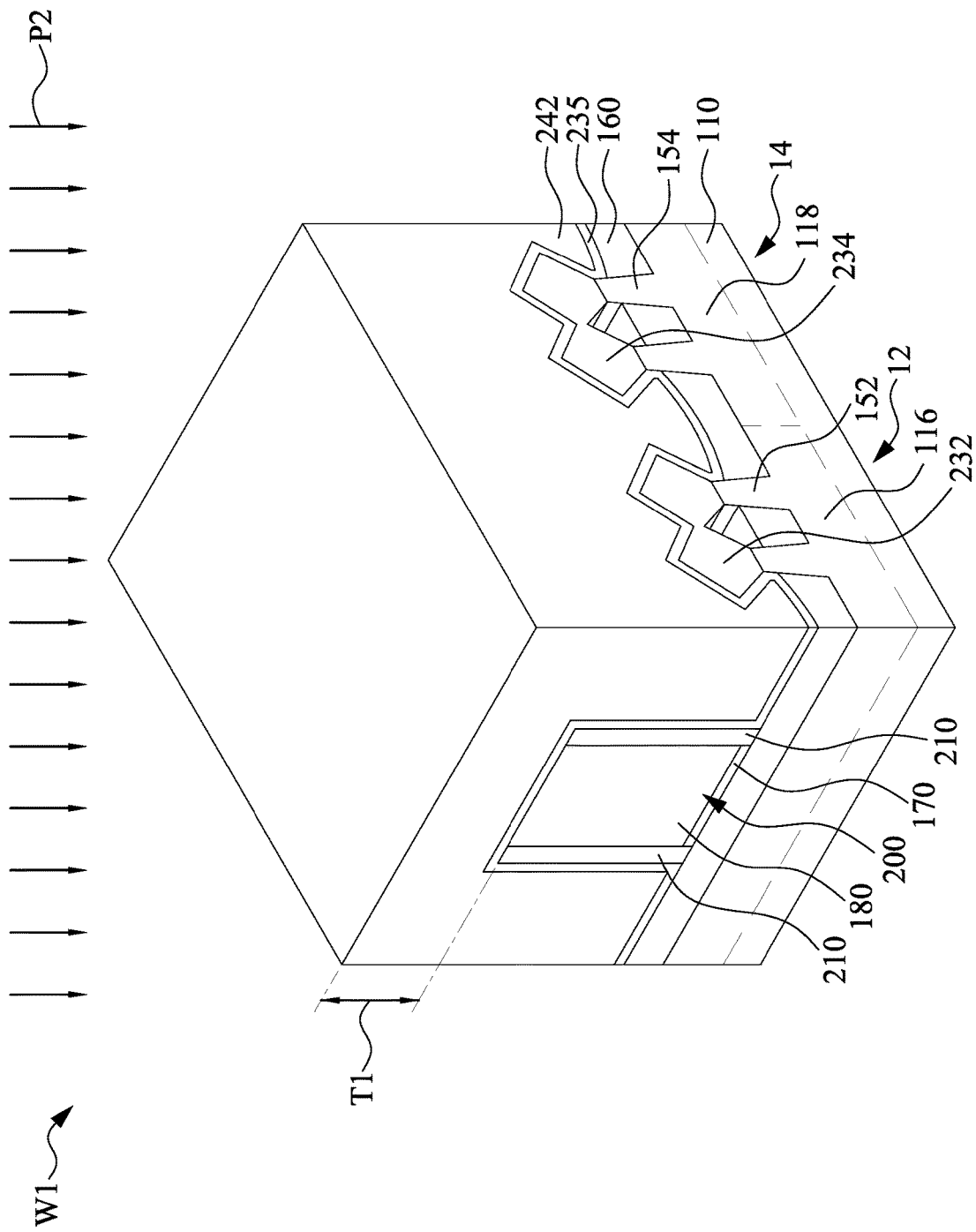
Figure 14B:
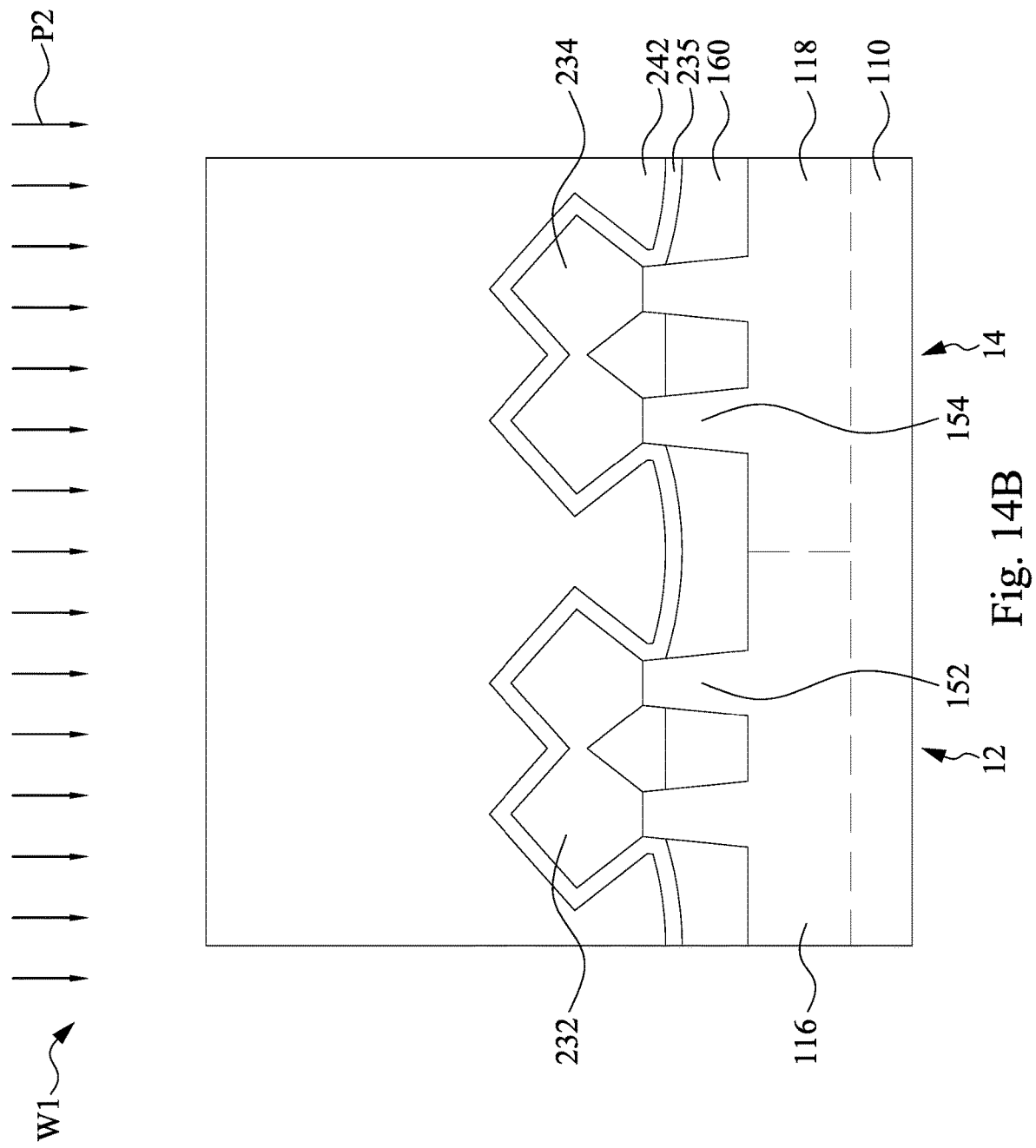

With reference to FIGS. 14A and 14B, after the flowable dielectric material 242 is deposited, an in-situ curing process P2 can be performed on the as-deposited flowable dielectric material 242. In-situ means the curing process P2 is performed in the process chamber for depositing the flowable dielectric material 242. In some embodiments, the curing process P2 can be performed in a different chamber (or ex-situ).

In some embodiments, an oxidizing anneal step of the curing process P2 is operated using ozone ($O_3$) (oxidation treatment) with a flow rate in the range from about 100 sccm to about 5000 sccm, or using steam with a flow rate in a range from about 100 sccm to about 5000 sccm. In some embodiments, a temperature for the oxidizing anneal step of the curing process P2 may be in a range from about 30° C. to about 100° C. In some embodiments, a temperature for the oxidizing anneal step of the curing process P2 may be in a range from about 0° C. to about 60° C. For example, a temperature for the oxidizing anneal step of the curing process P2 may be in a range from about 40° C. to about 60° C. An excessively temperature of the oxidizing anneal step of the curing process P2 may adversely affects the performance of the semiconductor device. Alternatively, steam can be used during the curing process, instead of $O_3$. In some embodiments, a pressure range for the oxidizing anneal step of the curing process P2 may be from about 1 Torr to about 760 Torr. In some embodiments, the duration of the oxidizing anneal step of the curing process P2 may be in a range from about 10 seconds to about 2 hrs. As such, the oxidizing anneal step of the curing process P2 increases the oxygen content of the as-deposited flowable dielectric layer 242, which is made of a network of $SiO_AN_BH_C$ (or SiONH), and most of NH ions and H ions of the flowable dielectric layer 242 can be removed.

In some embodiments, after the oxidizing anneal described above is performed, a steam anneal process step of the curing process P2 may performed on the substrate 110. In greater detail, the steam ($H_2O$) converts the SiONH network to SiOH and SiO network. In some embodiments, the steam anneal process step of the curing process P2 is conducted in a furnace. In some embodiments, the steam anneal process step of the curing process P2 may be at a temperature in a range from about 150° C. to about 1000° C. The steam anneal process step of the curing process P2 starts at about 150° C. and ramps up the temperature gradually to a predetermined temperature of about 500° C. to about 100° C. In some embodiments, the steam anneal process step of the curing process P2 may be at a temperature in a range from about 150° C. to about 650° C. The steam anneal process step of the curing process P2 starts at about 150° C. and ramps up the temperature gradually to a predetermined temperature of about 600° C. to about 650° C. An excessively temperature of the steam anneal step of the curing process P2 may adversely affects the performance of the semiconductor device. In some embodiments, the pressure of the steam anneal process step of the curing process P2 may be in a range from about 500 Torr to about 800 Torr. The flow rate of steam may be in a range from about 1 slm to about 20 slm. In some embodiments, the duration of the steam anneal process step of the curing process P2 may be in a range from about 20 minutes to about 2 hours. The steam thermal anneal converts the SiONH network in the flowable dielectric material 242 to a network of SiOH and SiO. The steam anneal process step of the curing process P2 causes the flowable dielectric material 242 to shrink. The duration and the temperature of the steam anneal process step of the curing process P2 affect the amount of shrinkage.

In some embodiments, after the steam anneal process step described above, a "dry" (without steam) thermal anneal process of the curing process P2 may be conducted to convert the SiOH and SiO network into SiO (or $SiO_2$)

network. In some embodiments, the dry anneal process step of the curing process P2 may be performed after the oxidizing anneal step and prior to the steam anneal process step. During the dry anneal process step of the curing process P2, steam is not used. In some embodiments, an inert gas, such as $N_2$, is used during the dry anneal process step of the curing process P2. In some embodiments, the peak anneal temperature of the dry anneal process step of the curing process P2 may be in a range from about 500° C. to about 1000° C. In some embodiments, the peak anneal temperature of the dry anneal process step of the curing process P2 may be in a range from about 600° C. to about 650° C. An excessively temperature of the dry anneal step of the curing process P2 may adversely affects the performance of the semiconductor device. In some embodiments, the dry anneal process step of the curing process P2 is conducted in a furnace. In some embodiments, the pressure of the dry anneal process step of the curing process P2 may be in a range from about 500 Torr to about 800 Torr. The gas or gases used for the dry anneal process step of the curing process P2 may include an inert gas, such as $N_2$, Ar, He or combinations thereof. The duration of the dry anneal process step of the curing process P2 is a range from about 30 minutes to about 3 hours. The dry anneal process step of the curing process P2 converts the network of SiOH and SiO in the flowable dielectric material 242 to a network of SiO (or $SiO_2$). As such, the dry anneal process step may also cause the flowable dielectric material 242 to shrink further. The duration and temperature of the dry anneal process step affect the amount of shrinkage.

The steam anneal step and the dry anneal process step of the curing process P2 cause the flowable dielectric material 242 to shrink. In some embodiments, the volume of the flowable dielectric material 242 shrinks in a range from about 2% to about 20%. The duration of the steam anneal step and the dry anneal process step affect the amount of shrinking. In some embodiments, after the dry anneal process step, the flowable dielectric material 242 is converted to $SiO_2$.

Due to the shrinkage of the flowable dielectric material 242, the flowable dielectric material 242 may exert a predetermined compressive stress on the epitaxial source/drain structure 232. The epitaxial source/drain structure 232 may transfer the compressive stress into the semiconductor fins 152 (i.e., channel regions). As such, the compressive stress provided by the flowable dielectric material 242 transfers to the semiconductor fins 152 via the source/drain structure 232, thereby enhancing carrier mobility and performance of the NMOS 12.

In some embodiments, an UV curing step may replace the oxidizing anneal step of the curing process P2. In some embodiments, the UV curing step may be performed in-situ with the oxidizing anneal step of the curing process P2. In some embodiments, the UV curing step and the oxidizing anneal step of the curing process P2 may be performed ex-situ. A processing temperature range of the UV curing step of the curing process P2 may be in a range from about 0° C. to about 60° C. In some embodiments, a processing temperature range of the UV curing step with the oxidizing anneal step may be in a range from about 0° C. to about 60° C. In some embodiments, a processing duration of the UV curing step of the curing process P2 may be in a range from about 10 secs to about 10 mins. In some embodiments, a processing duration of the UV curing step with the oxidizing anneal step may be in a range from about 10 secs to about 60 mins. An excessively processing temperature and/or an excessively processing duration of the UV curing step of the curing process P2 may adversely affects the performance of the semiconductor device. In some embodiments, the curing process P2 may be performed only one time after the deposition process P1 to reduce the process time. In some embodiments, the deposition process P1 and the curing process P2 can be alternately performed.

Figure 15A:
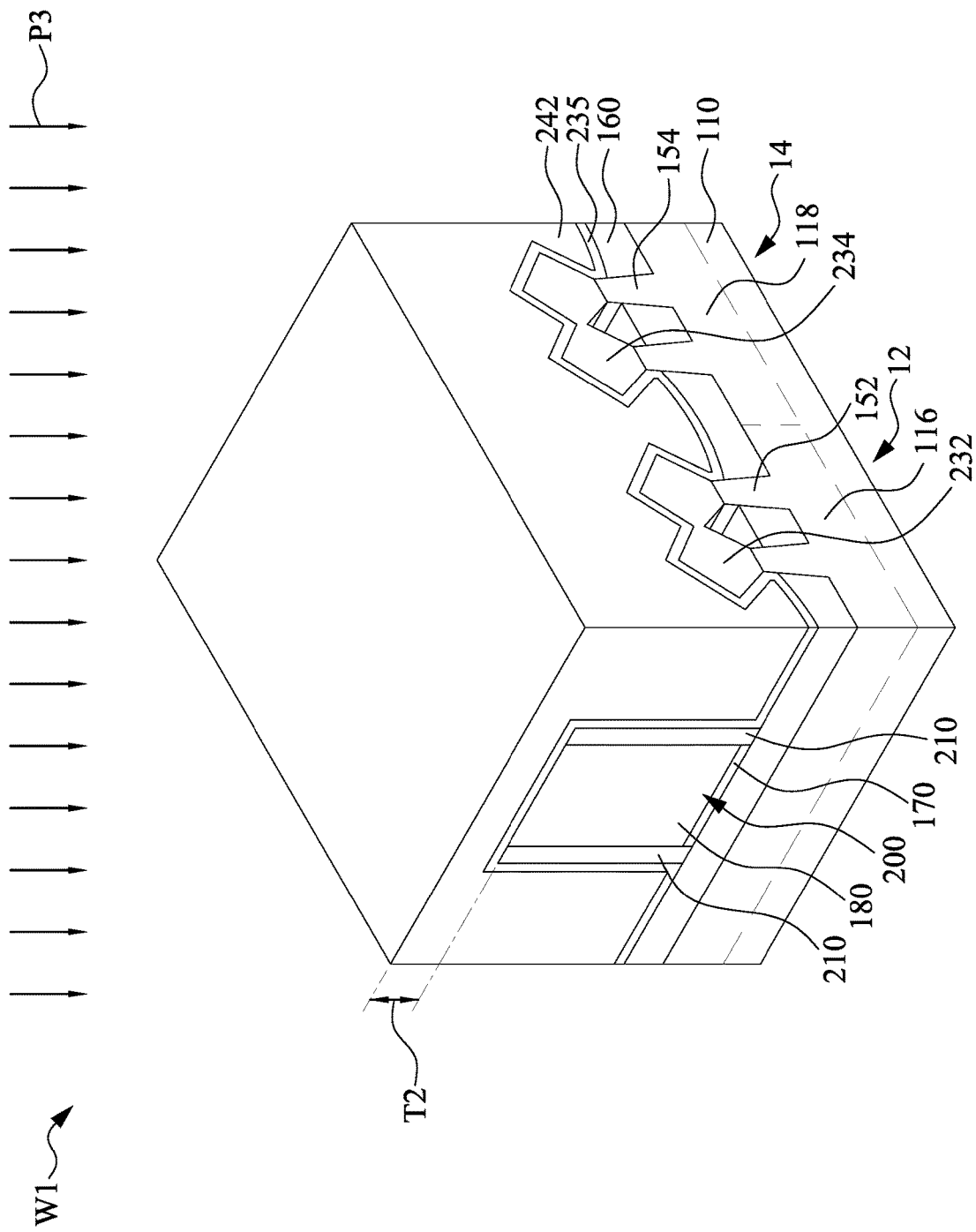
Figure 15B:
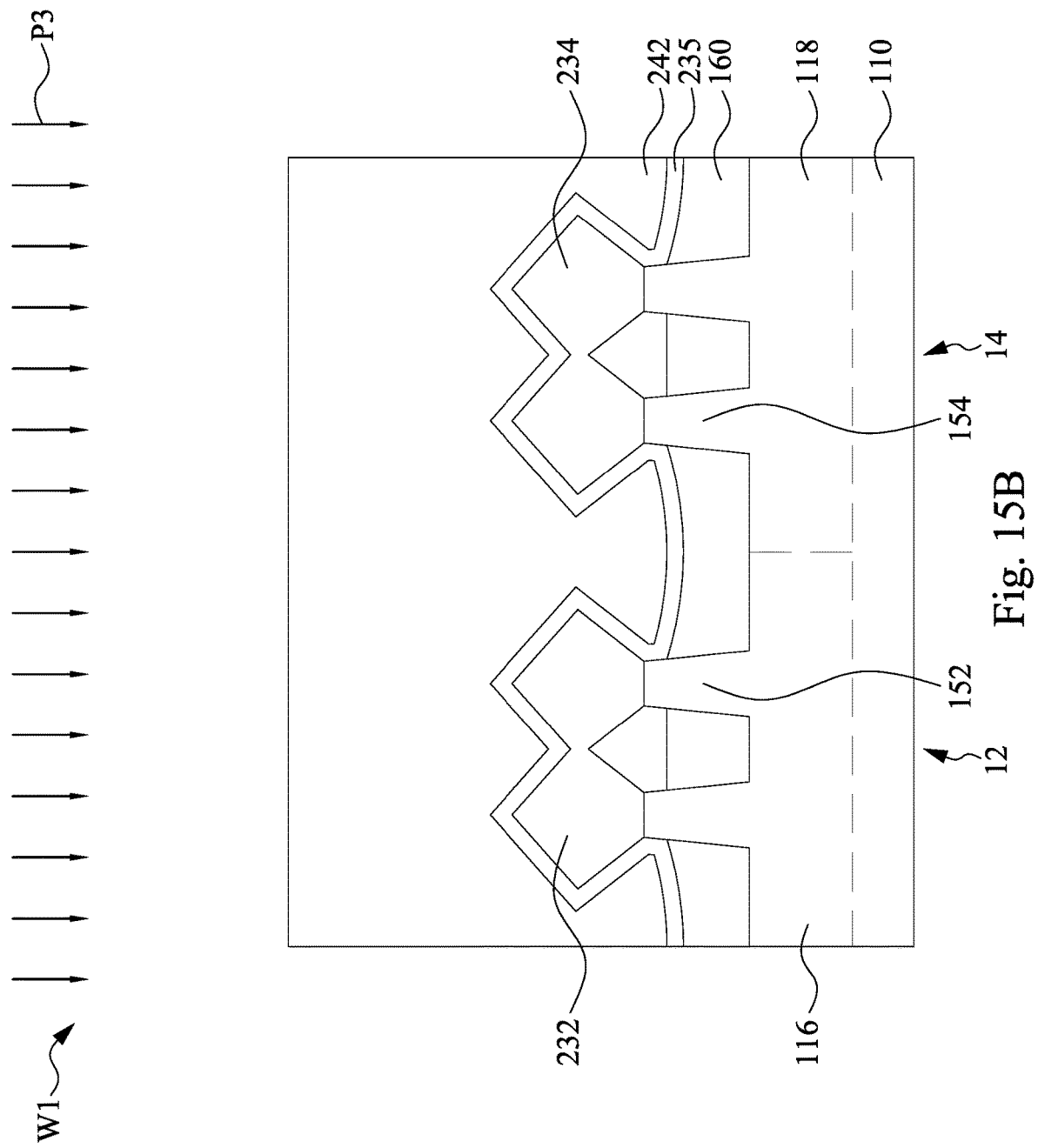

As shown in FIGS. 15A and 15B, a planarization process P3 such as chemical mechanical polish (CMP) is performed to remove a portion of the flowable dielectric material 242, such that the remained portion of the flowable dielectric material 242 remains covering the CESL 235. In some embodiments, the remained portion of the flowable dielectric material 242 has a thickness T2 less than the thickness T1 (See FIG. 14A) thereof shown in FIGS. 13A and 13B prior to the planarization process P3. In the depicted embodiment, the planarization process P3 stops before the dummy gate structure 200 is exposed. In some other embodiments, the planarization process may be performed until a top surface of the dummy gate structure 200 is exposed.

Figure 16A:
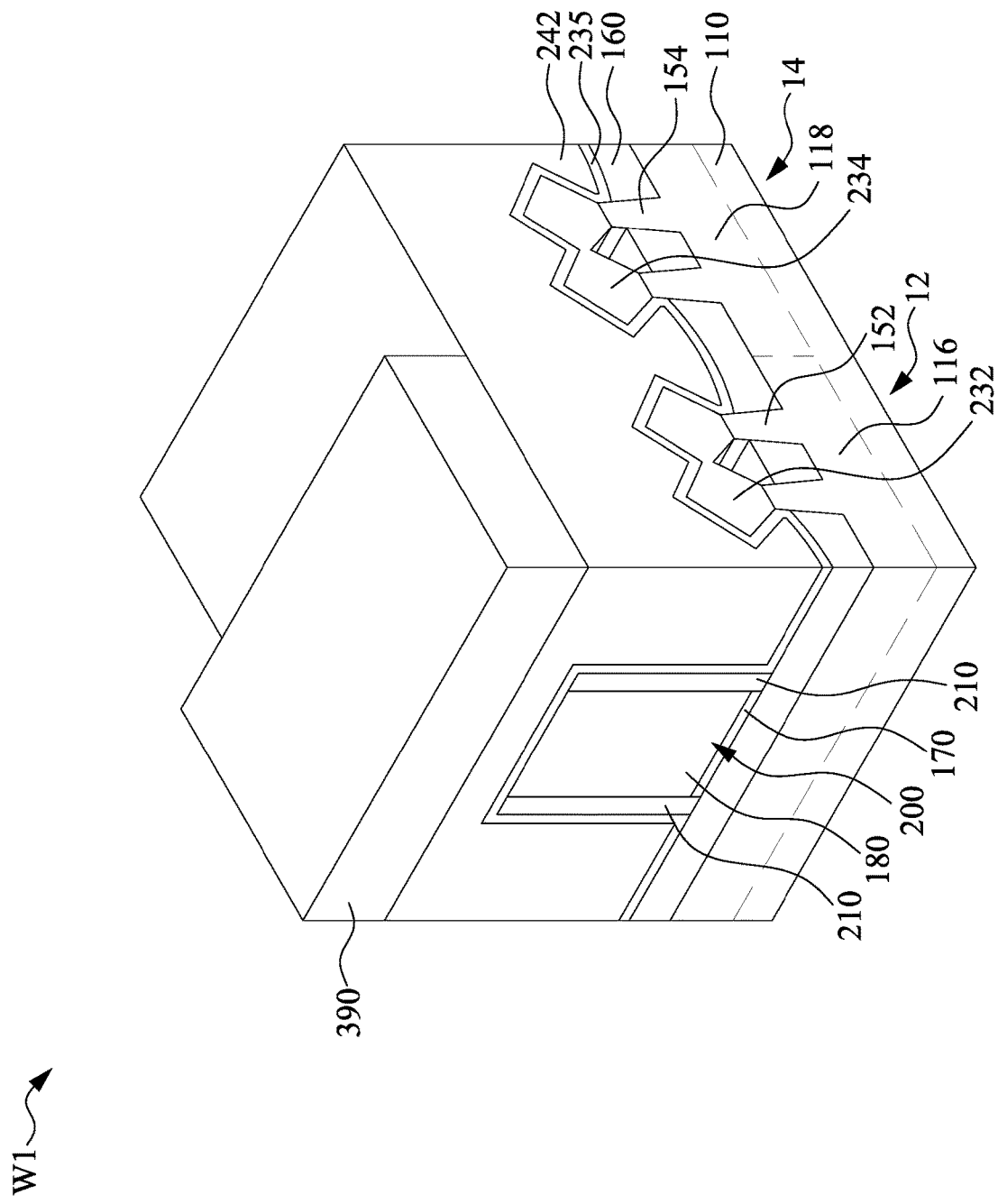
Figure 16B:
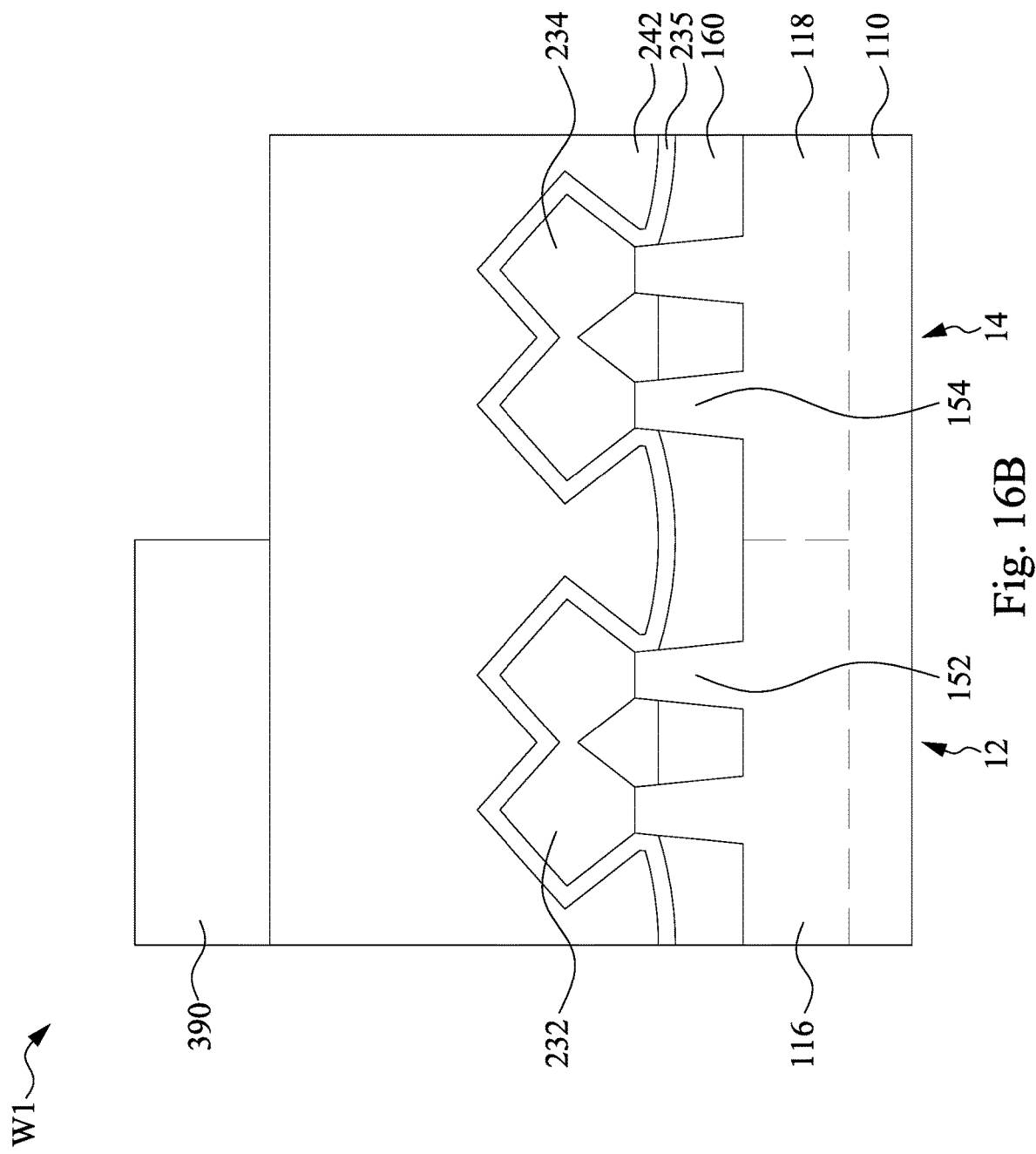

As shown in FIGS. 16A and 16B, a patterned mask layer 390 is formed over the flowable dielectric material 242 and then patterned to form separated mask portions overlapping the P-type well 116. The patterned mask layer 390 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 17A:
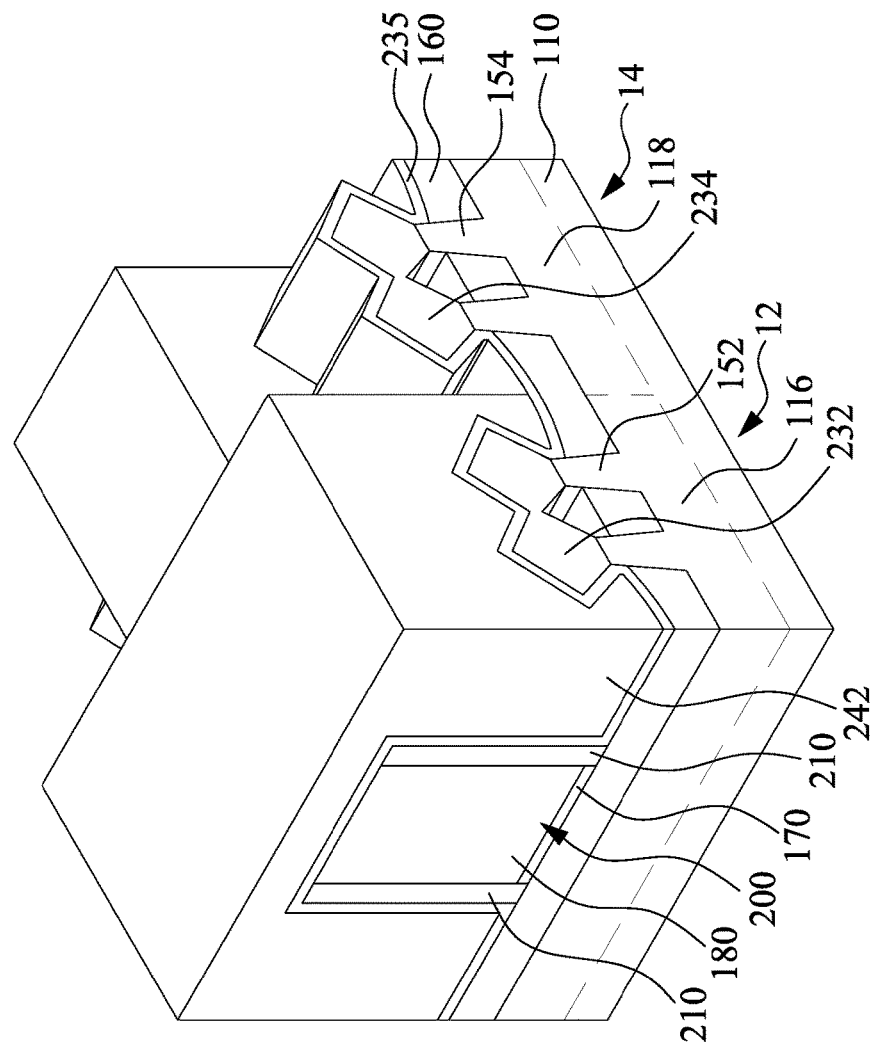
Figure 17B:
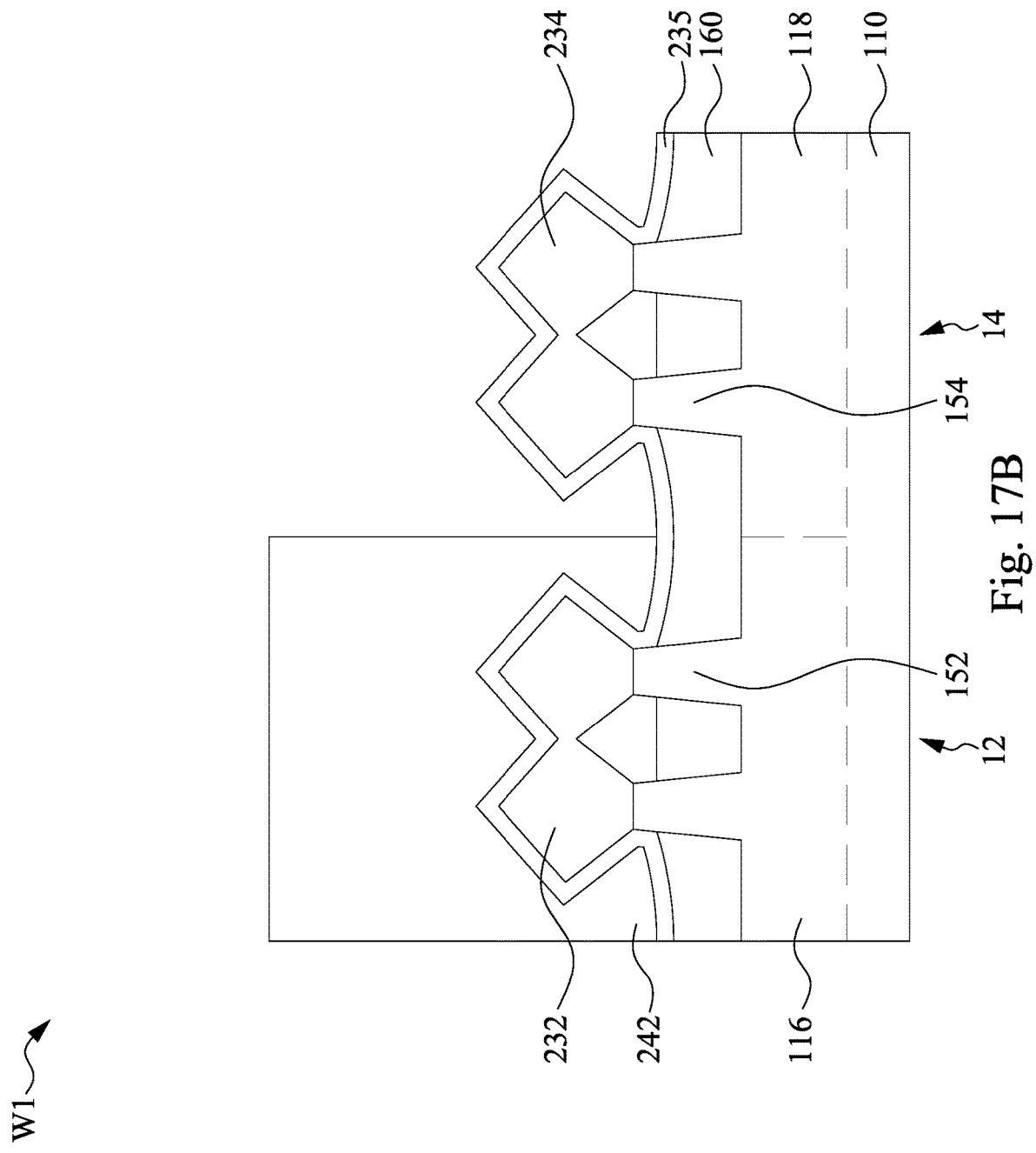

As shown in FIGS. 17A and 17B, one or more etching processes are performed to expose the CESL 235 above the N-type well 118 using the patterned mask 390 as an etching mask, and the patterned mask layer 390 (See FIGS. 16A and 16B) is removed after the etching.

Figure 18A:
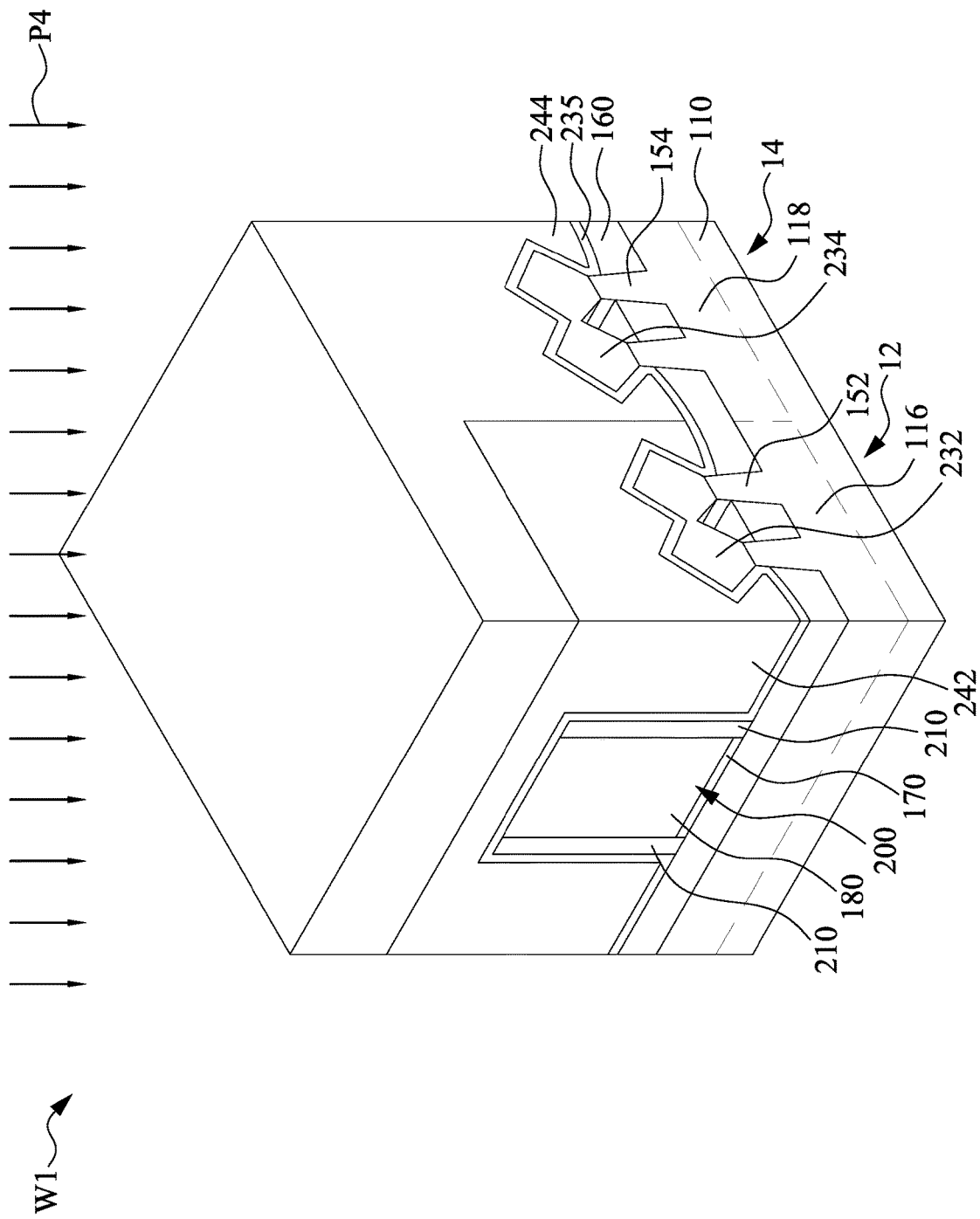
Figure 18B:
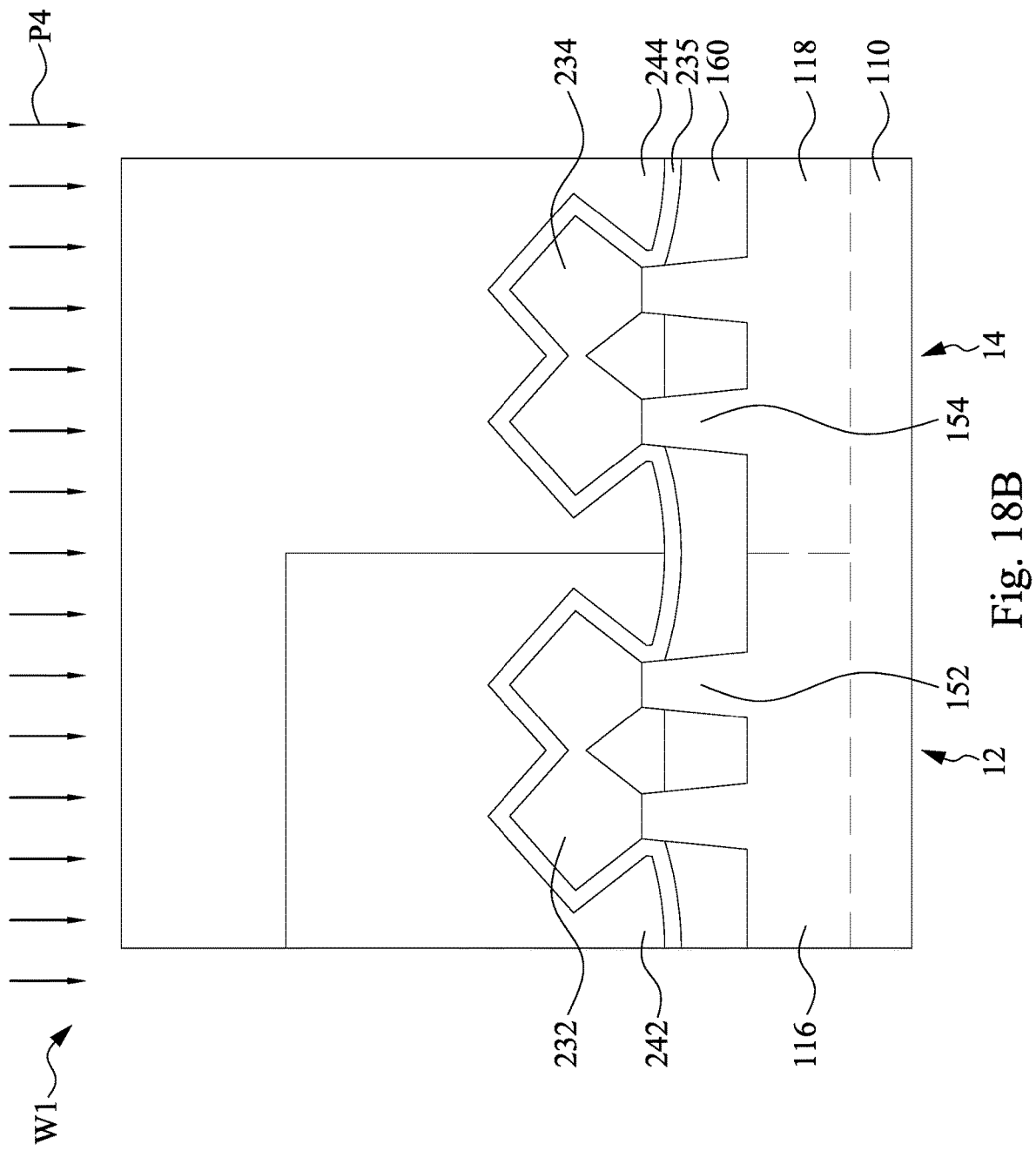

As shown in FIGS. 18A and 18B, a flowable dielectric material 244 is formed over the CESL 235 above the N-type well 118, formed over the flowable dielectric material 244 above the P-type well 116, and is deposited by a deposition process P4.

In some embodiments, the flowable dielectric material 244 can be formed by using a spin on dielectric (SOD) formation process, or by depositing a flowable dielectric by a chemical vapor deposition (CVD) process, such as radical-component CVD. The examples of flowable silicon oxide precursors, include a silicate, a siloxane, a methyl Silses-Quioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

In some embodiments, the flowable dielectric material 244 is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or combinations thereof. In greater detail, the silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$). In some embodiments, the silicon-containing precursor includes carbon. In some embodiments, the silicon-containing precursor includes oxygen, nitrogen, fluorine, hydrogen, or combinations thereof. In some embodiments, a concentration of carbon, oxygen, nitrogen, silicon, fluorine, or hydrogen in the silicon-containing precursor of the flowable dielectric material 244 is different from that in the flowable dielectric material 242 as shown in FIGS. 13A and 13B. For example, a concentration of carbon, oxygen, nitrogen, silicon, fluorine, or hydrogen in the silicon-containing precursor of the flowable dielectric material 244 is less than that in the flowable dielectric material 242 as shown in FIGS. 13A and 13B.

In some embodiments, nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture including a combination of $NH_3$, $N_2$, and $H_2$.

The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor for forming the flowable dielectric material 244 deposited with this technique.

The deposition of the flowable dielectric material 244 may proceed while the temperature of the substrate 110 is maintained at a relatively low temperature. In some embodiments, the flowable dielectric material 244 is deposited on the substrate 110 at low temperature which is maintained by cooling the substrate 110 during the deposition. In some embodiments, the deposition may be performed at a temperature in a range from about −40° C. to about 200° C. In some embodiments, the deposition may be performed at a temperature less than about 100° C.

In some embodiments, the deposition pressure may be in a range from about 100 mTorr to about 10 Torr. In some embodiments, reaction source uses a gaseous environment including a nitride-containing precursor, such as trisilylamine ($Si_3H_9N$, or TSA) and $NH_3$. In some embodiments, the flow rates of $Si_3H_9N$ and $NH_3$ are in the range of about 100 sccm to about 1000 sccm, and of about 100 sccm to about 2000 sccm, respectively.

The as-deposited flowable dielectric material 244 is capable of filling the narrow and deep gaps and prevents voids and discontinuities in the trenches T (See FIG. 3). The as-deposited flowable dielectric material 244 includes a flowable network of $SiO_AN_BH_C$ (or SiONH). In some embodiments, A is a number in a range from about 0 to about 2, B is a number from about 0.01 to about 1, and C is a number from about 0.01 to about 1.

Figure 19A:
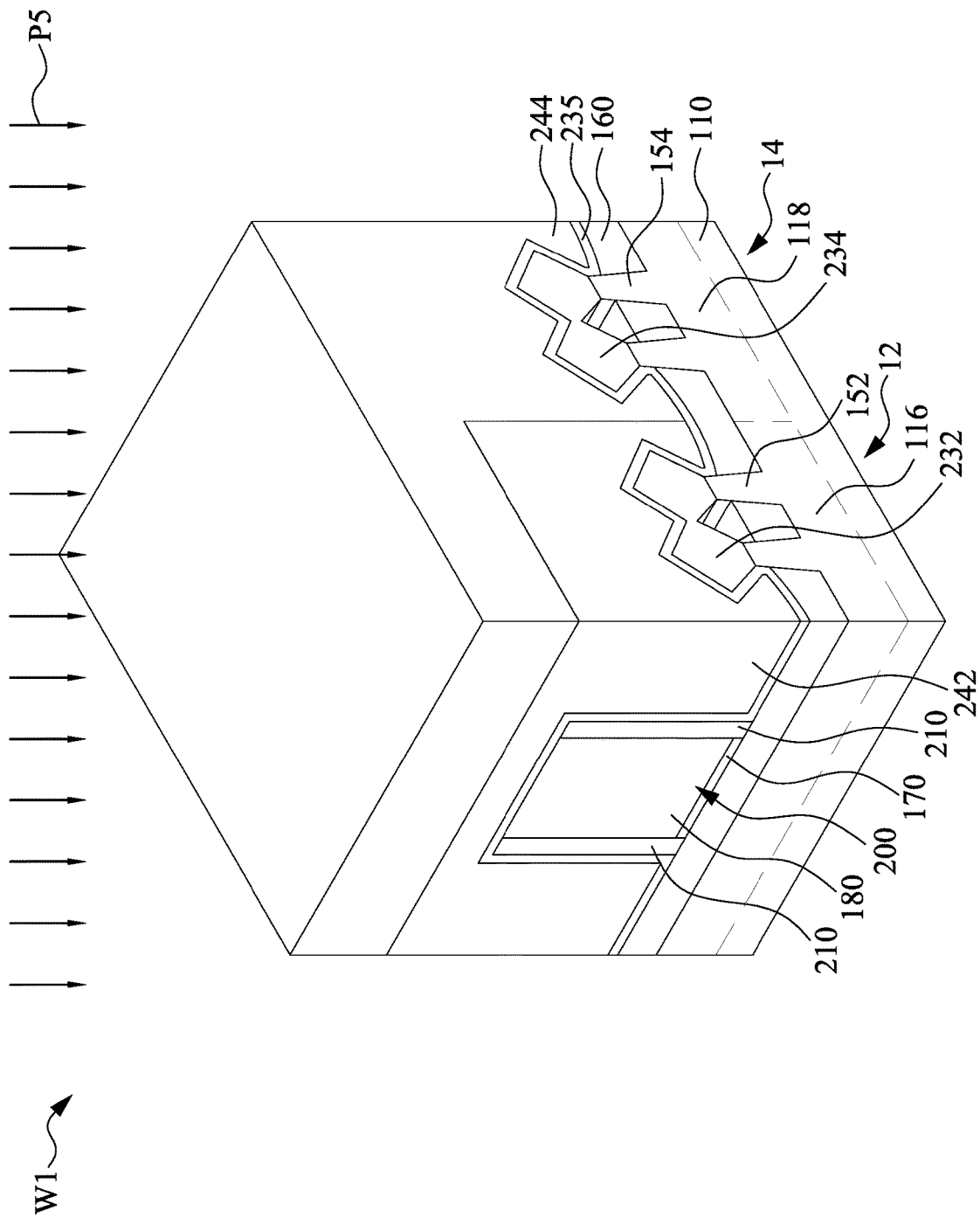
Figure 19B:
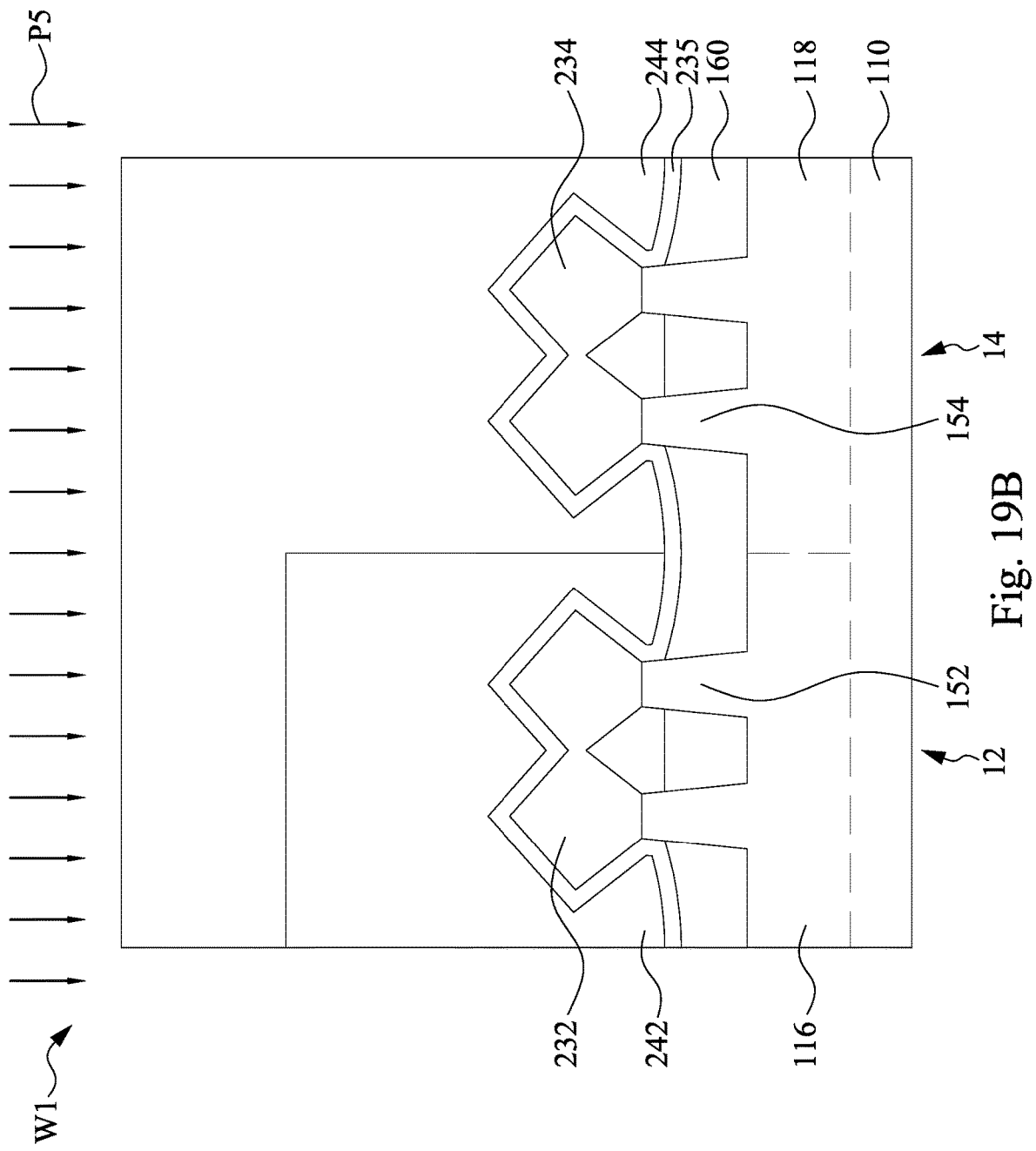

As shown in FIGS. 19A and 19B, after the flowable dielectric material 244 is deposited, an in-situ curing process P5 can be performed on the as-deposited flowable dielectric material 244. In-situ means the curing process P5 is performed in the process chamber for depositing the flowable dielectric material 244. In some embodiments, the curing process P5 can be performed in a different chamber (or ex-situ).

In some embodiments, an oxidizing anneal step of the curing process P5 is operated using ozone ($O_3$) (oxidation treatment) with a flow rate in the range from about 100 sccm to about 5000 sccm, or using steam with a flow rate in a range from about 100 sccm to about 5000 sccm. In some embodiments, a temperature for the curing process P5 may be in a range from about 0° C. to about 50° C. In some embodiments, a temperature for the oxidizing anneal step of the curing process P5 may be in a range from about 0° C. to about 30° C. An excessively temperature of the oxidizing anneal step of the curing process P2 may adversely affects the performance of the semiconductor device.

In some embodiments, the oxidizing anneal step of the curing process P5 for the flowable dielectric material 244 above the N-type well 118 may be performed at a temperature different from that of the oxidizing anneal step of the curing process P2 for the flowable dielectric material 242 above the P-type well 116 as shown in FIGS. 14A and 14B. For example, the oxidizing anneal step of the curing process P5 for the flowable dielectric material 244 above the N-type well 118 may be performed at a temperature less than that of the oxidizing anneal step of the curing process P2 for the flowable dielectric material 242 above the P-type well 116 as shown in FIGS. 14A and 14B.

Alternatively, steam can be used during the curing process, instead of $O_3$. In some embodiments, a pressure range for the oxidizing anneal step of the curing process P5 may be from about 1 Torr to about 760 Torr. In some embodiments, the duration of the oxidizing anneal step of the curing process P5 may be in a range from about 10 seconds to about 2 hrs. In some embodiments, the duration of the oxidizing anneal step of the curing process P5 for the flowable dielectric material 244 above the N-type well 118 may be different from that of the oxidizing thermal anneal process of the curing process P2 for the flowable dielectric material 242 above the P-type well 116 as shown in FIGS. 14A and 14B. For example, the duration of the oxidizing anneal step of the curing process P5 for the flowable dielectric material 244 above the N-type well 118 may be less than that of the oxidizing thermal anneal process of the curing process P2 for the flowable dielectric material 242 above the P-type well 116 as shown in FIGS. 14A and 14B. As such, the oxidizing anneal step of the curing process P5 increases the oxygen content of the as-deposited flowable dielectric layer 244, which is made of a network of $SiO_AN_BH_C$ (or SiONH), and most of NH ions and H ions of the flowable dielectric layer 244 can be removed.

In some embodiments, after the oxidizing anneal described above is performed, a steam anneal process step of the curing process P5 may performed on the substrate 110. The steam ($H_2O$) converts the SiONH network to SiOH and SiO network. In some embodiments, the steam anneal process step of the curing process P5 is conducted in a furnace. In some embodiments, the steam anneal process step of the curing process P5 may be at a temperature in a range from about 150° C. to about 700° C. The steam anneal process step of the curing process P5 starts at about 150° C. and ramps up the temperature gradually to a predetermined temperature of about 300° C. to about 700° C. In some embodiments, the steam anneal process step of the curing process P5 may be at a temperature in a range from about 150° C. to about 600° C. The steam anneal process step of the curing process P5 starts at about 150° C. and ramps up the temperature gradually to a predetermined temperature of about 400° C. to about 600° C. An excessively temperature of the steam anneal step of the curing process P2 may adversely affects the performance of the semiconductor device. In some embodiments, the steam anneal process step of the curing process P5 for the flowable dielectric material 244 above the N-type well 118 may be performed at a temperature different from that of the steam anneal process step of the curing process P2 for the flowable dielectric material 242 above the P-type well 116 as shown in FIGS. 14A and 14B. For example, the steam anneal process step of the curing process P5 for the flowable dielectric material 244 above the N-type well 118 may be performed at a temperature less than that of the steam anneal process step of the curing process P2 for the flowable dielectric material 242 above the P-type well 116 as shown in FIGS. 14A and 14B.

In some embodiments, the pressure of the steam anneal process step of the curing process P5 may be in a range from about 500 Torr to about 800 Torr. The flow rate of steam may be in a range from about 1 slm to about 20 slm. The duration of the steam anneal process step of the curing process P5 may be in a range from about 20 minutes to about 2 hours. In some embodiments, the duration of the steam anneal step of the curing process P5 for the flowable dielectric material 244 above the N-type well 118 may be different from that of the steam anneal process step of the curing process P2 for the flowable dielectric material 242 above the P-type well 116 as shown in FIGS. 14A and 14B. For example, the duration of the steam anneal step of the curing process P5 for the flowable dielectric material 244 above the N-type well 118 may be less than that of the steam anneal process step of the curing process P2 for the flow able dielectric material 242 above the P-type well 116 as shown in FIGS. 14A and 14B. The steam thermal anneal of the curing process P5 converts the SiONH network in the flowable dielectric material 244 to a network of SiOH and SiO. As such, the steam anneal process step of the curing process P5 causes the flowable dielectric material 244 to shrink. The duration and the temperature of the steam anneal process step of the curing process P5 affect the amount of shrinkage.

In some embodiments, after the steam anneal process step described above, a "dry" (without steam) thermal anneal process of the curing process P5 may be conducted to convert the SiOH and SiO network into SiO (or $SiO_2$) network. In some embodiments, the dry anneal process step of the curing process P5 may be performed after the oxidizing anneal step and prior to the steam anneal process step. During the dry anneal process step of the curing process P5, steam is not used. In some embodiments, an inert gas, such as $N_2$, is used during the dry anneal process step of the curing process P5. In some embodiments, the peak anneal temperature of the dry anneal process step of the curing process P5 may be in a range from about 300° C. to about 700° C. In some embodiments, the peak anneal temperature of the dry anneal process step of the curing process P5 may be in a range from about 400° C. to about 600° C. An excessively temperature of the dry anneal step of the curing process P2 may adversely affects the performance of the semiconductor device. In some embodiments, the dry anneal process step of the curing process P5 for the flowable dielectric material 244 above the N-type well 118 may be performed at a temperature different from that of the dry anneal process step of the curing process P2 for the flowable dielectric material 242 above the P-type well 116 as shown in FIGS. 14A and 14B. For example, the dry anneal process step of the curing process P5 for the flowable dielectric material 244 above the N-type well 118 may be performed at a temperature less than that of the dry anneal process step of the curing process P2 for the flowable dielectric material 242 above the P-type well 116 as shown in FIGS. 14A and 14B.

In some embodiments, the dry anneal process step of the curing process P5 is conducted in a furnace. In some embodiments, the pressure of the dry anneal process step of the curing process P5 may be in a range from about 500 Torr to about 800 Torr. The gas or gases used for the dry anneal process step of the curing process P5 may include an inert gas, such as $N_2$, Ar, He or combinations thereof. The duration of the dry anneal process step of the curing process P5 is a range from about 30 minutes to about 3 hours. In some embodiments, the duration of the dry anneal step of the curing process P5 for the flowable dielectric material 244 above the N-type well 118 may be different from that of the dry anneal process step of the curing process P2 for the flowable dielectric material 242 above the P-type well 116 as shown in FIGS. 14A and 14B. For example, the duration of the dry anneal step of the curing process P5 for the flowable dielectric material 244 above the N-type well 118 may be less than that of the dry anneal process step of the curing process P2 for the flowable dielectric material 242 above the P-type well 116 as shown in FIGS. 14A and 14B. The dry anneal process step of the curing process P5 converts the network of SiOH and SiO in the flowable dielectric material 244 to a network of SiO (or $SiO_2$). As such, the dry anneal process step may also cause the flowable dielectric material 244 to shrink further. The duration and temperature of the dry anneal process step affect the amount of shrinkage.

The steam anneal step and the dry anneal process step of the curing process P5 cause the flowable dielectric material 244 to shrink. In some embodiments, the volume of the flowable dielectric material 244 shrinks in a range from about 2% to about 20%. In some embodiment, a porosity of the flowable dielectric material 244 is different from a porosity of the flowable dielectric material 242. For example, a porosity of the flowable dielectric material 244 is greater than a porosity of the flowable dielectric material 242. In greater detail, the duration of the steam anneal step and the dry anneal process step affect the amount of shrinking. In some embodiments, after the dry anneal process step, the flowable dielectric material 244 is converted to cured $SiO_2$. In some embodiments, shrink amount of the flowable dielectric material 244 during the curing process P5 is less than that of the flowable dielectric material 242 during the curing process P2. Because of the shrinkage difference between the flowable dielectric materials 242 and 244, the flowable dielectric materials 242 and 244 may form a distinguishable interface therebetween. In some embodiments, the flowable dielectric materials 242 and 244 may form a vertical interface vertically aligned with the interface between the P-type well 116 and the N-type well 118.

Due to the shrinkage of the flowable dielectric material 244, the flowable dielectric material 244 may exert a predetermined compressive stress on the epitaxial source/drain structure 234, in which the compressive stress exerted on the p-type source/drain structure 234 by the flowable dielectric material 244 is less than the compressive stress exerted on the n-type source/drain structure 232 by the flowable dielectric material 242. In some embodiments, the flowable dielectric material 244 may provide no or negligible compressive stress to the p-type epitaxial source/drain structure 234, thereby alleviating the negative impacts on carrier mobility and performance of the PMOS 14 caused by an excessively large compressive stress. In some embodiments where the shrink amount of the flowable dielectric material 242 is greater than that of the flowable dielectric material 244 during the curing process P5, the shrinkage of flowable dielectric material 242 may exert a tensile stress on the flowable dielectric material 244, which in turn exerts a tensile stress on the p-type epitaxial source/drain structure 234 and the underlying fins 154, thus improving the carrier mobility of PMOS 14.

In some embodiments, the PMOS 14 and NMOS 12 obtain different stress values from the flowable dielectric materials 242 and 244. The different stress values transferred to channel regions may cause different stress values in the semiconductor fins 152 and 154 due to different types of majority carrier. The flowable dielectric materials 242 and 244 are able to increase and maintain the stress values in the semiconductor fins 152 and 154.

In some embodiments, an UV curing step may replace the oxidizing anneal step of the curing process P5. In some embodiments, the UV curing step may be performed in-situ with the oxidizing anneal step of the curing process P5. In some embodiments, the UV curing step and the oxidizing anneal step of the curing process P5 may be performed ex-situ. A processing temperature range of the UV curing step may be in a range from about 0° C. to about 50° C. In some embodiments, a processing duration of the UV curing step of the curing process P2 may be in a range from about 10 secs to about 10 mins. In some embodiments, a processing duration of the UV curing step with the oxidizing anneal step may be in a range from about 10 secs to about 60 mins. An excessively processing temperature and/or an excessively processing duration of the UV curing step of the curing process P2 may adversely affects the performance of the semiconductor device. In some embodiments, the curing process P5 may be performed only one time after the deposition process P4 to reduce the process time. In some embodiments, the deposition process P4 and the curing process P5 can be alternately performed.

In some embodiments, the processing temperature range of the UV curing step of the curing process P5 for the flowable dielectric material 244 above the N-type well 118 may be different from that of the UV curing step of the curing process P2 for the flowable dielectric material 242 above the P-type well 116 as shown in FIGS. 14A and 14B. For example, the processing temperature range of the UV curing step of the curing process P5 for the flowable dielectric material 244 above the N-type well 118 may be less than that of the UV curing step of the curing process P2 for the flowable dielectric material 242 above the P-type well 116 as shown in FIGS. 14A and 14B. In some embodiments, the processing duration of the UV curing step of the curing process P5 for the flowable dielectric material 244 above the N-type well 118 may be different from that of the UV curing step of the curing process P2 for the flowable dielectric material 242 above the P-type well 116 as shown in FIGS. 14A and 14B. For example, the processing duration of the UV curing step of the curing process P5 for the flowable dielectric material 244 above the N-type well 118 may be less than that of the UV curing step of the curing process P2 for the flowable dielectric material 242 above the P-type well 116 as shown in FIGS. 14A and 14B.

Figure 20A:
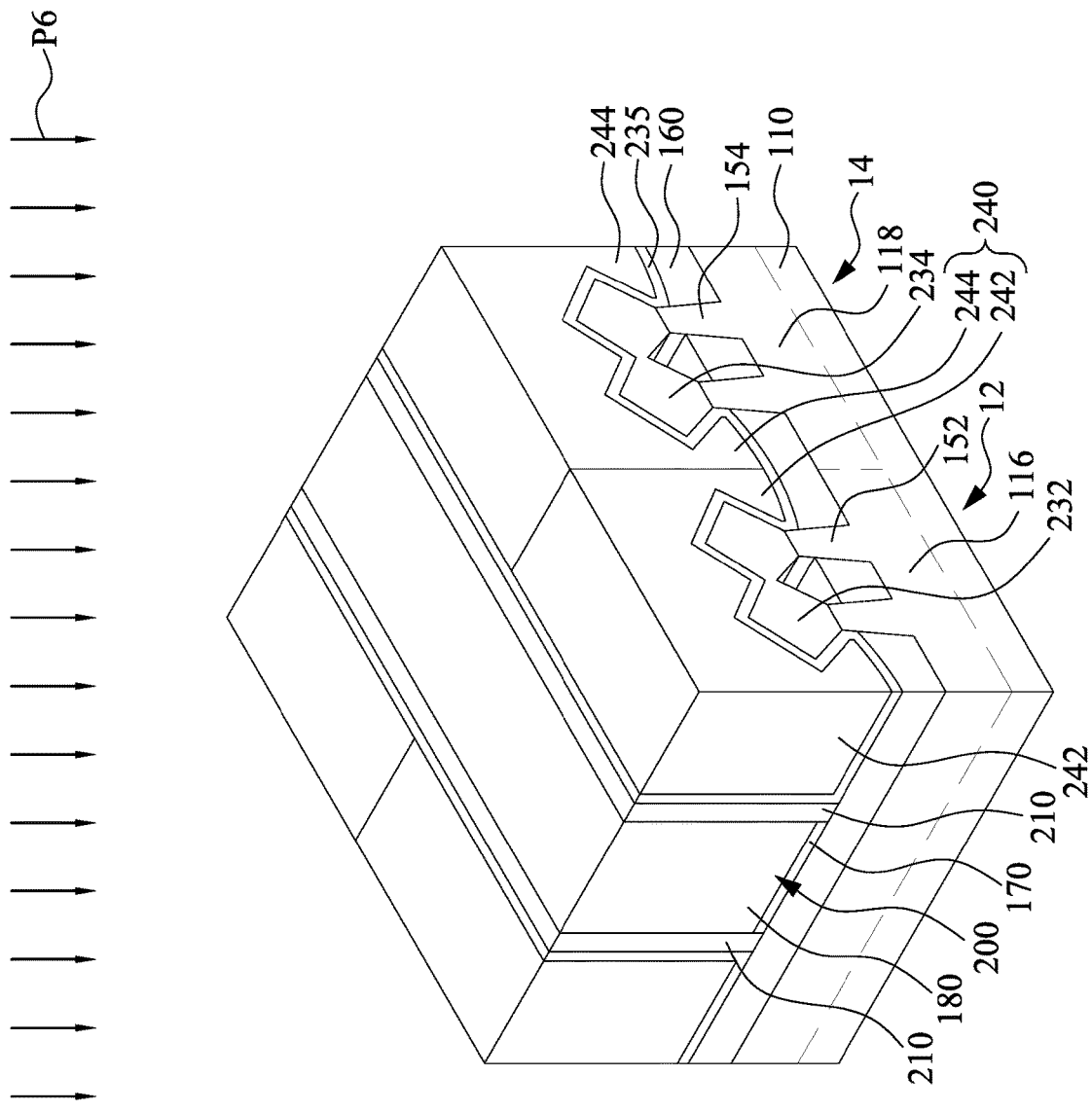

As shown in FIGS. 20A and 20B, a planarization process P6 such as chemical mechanical polish (CMP) is performed to remove portions of the flowable dielectric materials 242 and 244 and the CESL 235 above a top surface of the dummy gate structure 200 or top surfaces of the gate spacers 210, such that the top surface of the dummy gate structure 200 is exposed and the ILD layer 240 is formed. The CMP process may planarize a top surface of the flowable dielectric material 242 and a top surface of the flowable dielectric material 244 with the top surface of the dummy gate structure 200 and/or the gate spacers 210.

Figure 21:
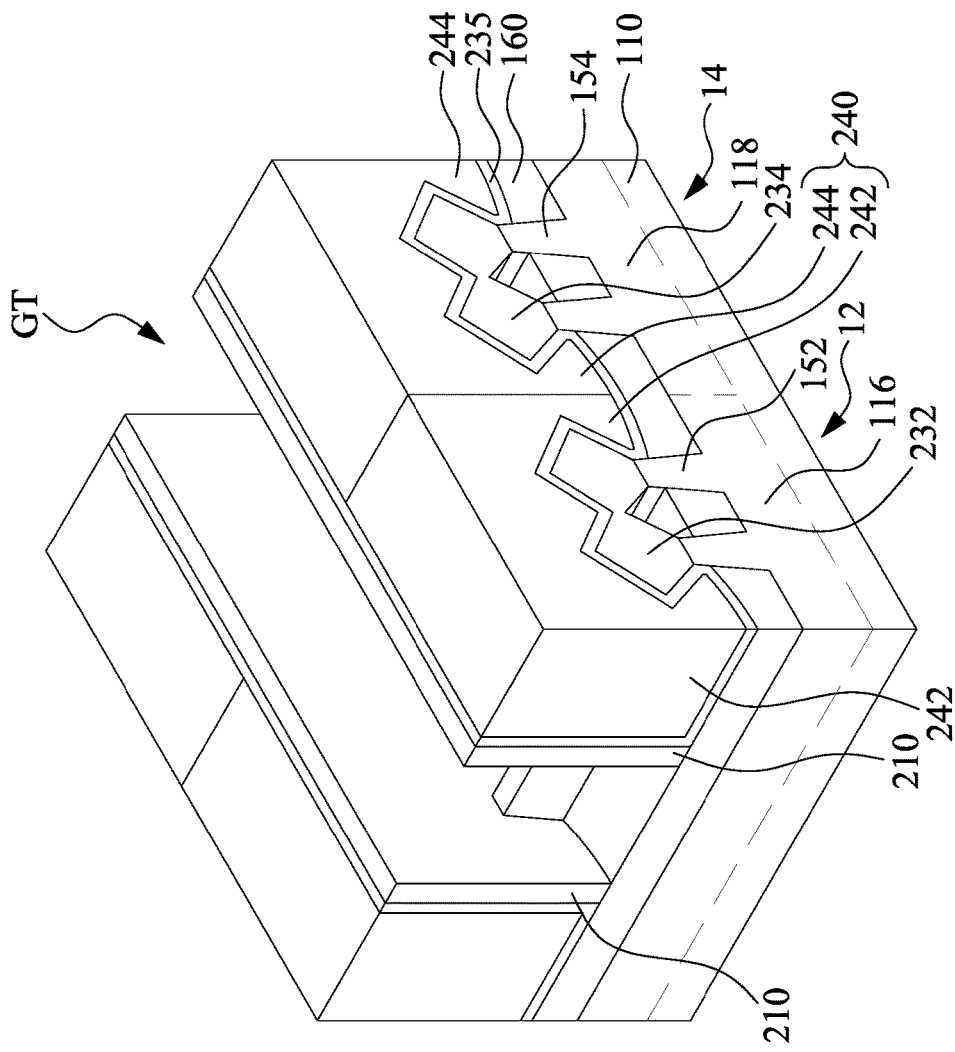

Returning to FIG. 1B, the method M1 then proceeds to block S22 where the dummy gate structures are removed to form gate trenches. With reference to FIG. 21, in some embodiments of block S22, dummy gate structures 200 (as shown in FIG. 20A) is removed to form a gate trench GT with the gate spacers 210 as their sidewalls. Widths of the gate trench GT are associated with the corresponding dummy gate structures 200. In some embodiments, the dummy gate structures 200 are removed by performing a first etching process and performing a second etching process after the first etching process. In some embodiments, the dummy gate electrode layer 180 (as shown in FIG. 20A) is mainly removed by the first etching process, and the gate dielectric layer 170 (as shown in FIG. 20A) is mainly removed by the second etching process that employs a different etchant than that used in the first etching process. In some embodiments, the dummy gate electrode layer 180 is removed, while the gate dielectric layer 170 remains in the gate trenches GT.

Returning to FIG. 1B, the method M1 then proceeds to block S23 where a gate structure is formed in a gate trench. In some embodiments of block S23, with reference to FIGS. 22-26, replacement gate structures RG is formed in the gate trench GT (as shown in FIG. 21). An exemplary method of forming these replacement gate structures may include blanket forming a gate dielectric layer over the wafer W1, forming one or more work function metal layers over the blanket gate dielectric layer, and performing a CMP process to remove excessive materials of the one or more work function metal layers and the gate dielectric layer outside the gate trench.

Figure 22:
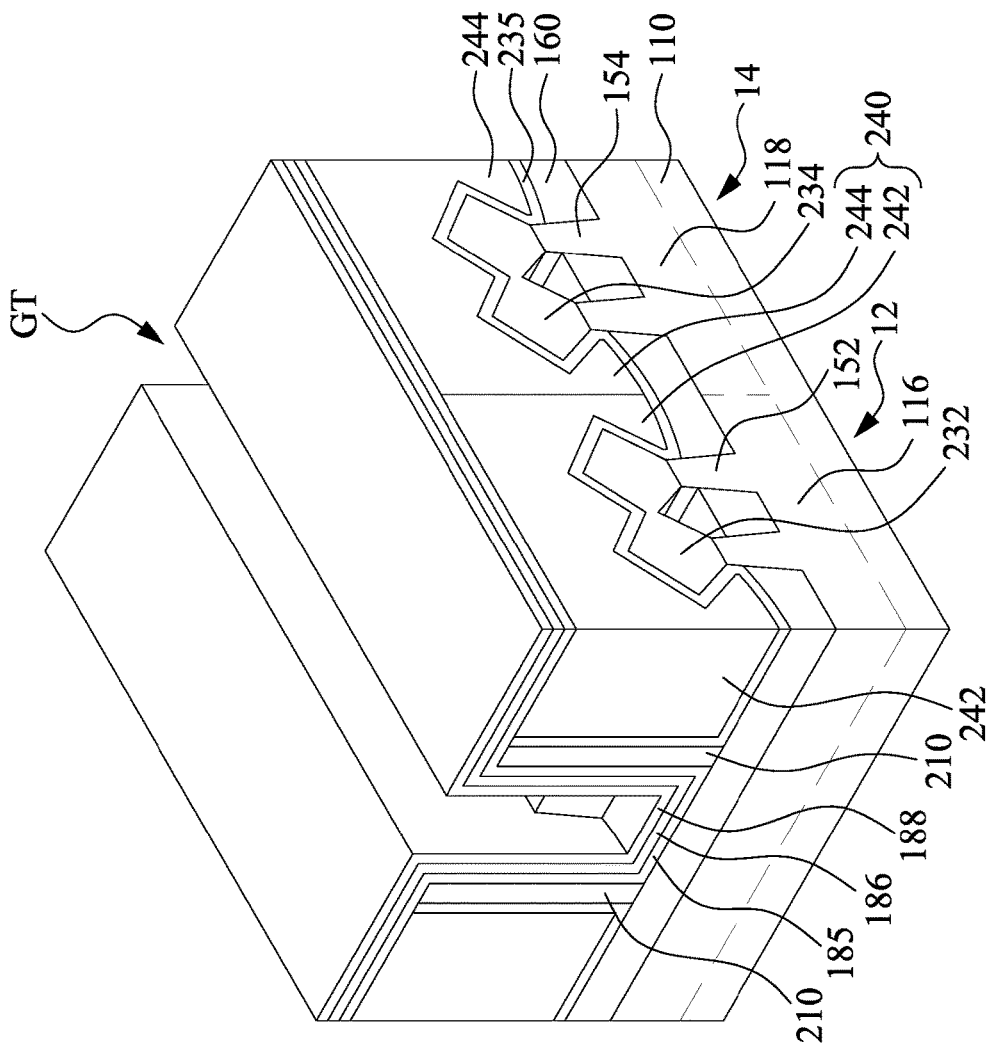

With reference to FIG. 22, a gate dielectric layer 185 can be conformally formed on the structure shown in FIG. 21. A portion of the gate dielectric layer 185 is formed in the gate trench GT and is further formed on the semiconductor fins 152 and 154 and the isolation dielectric 160. The gate dielectric layer 185 can wrap the semiconductor fins 152 and 154.

In some embodiments, the gate dielectric layer 185 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 185 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In some embodiments, the gate dielectric layer 185 may have a multilayer structure such as one layer of silicon oxide (e.g., interfacial layer) and another layer of high-k material. The gate dielectric layer 185 may be formed using chemical vapor deposition (CVD), physical vapor deposition (PVD), atomic layer deposition (ALD), thermal oxide, ozone oxidation, other suitable processes, or combinations thereof.

As shown in FIG. 22, a work function layer 186 can be conformally formed on the gate dielectric layer 185. A portion of the work function layer 186 is formed in the gate trench GT and wraps the semiconductor fins 152 and 154. In some embodiments, the work function layer 186 is in contact with the gate dielectric layer 185. The work function layer 186 can provide a suitable work function value for a gate stack of a semiconductor device, so as to benefit tuning the threshold voltage of the semiconductor device.

In some embodiments, the work function layer 186 may include tantalum nitride (TaN). In some other embodiments, an additional structure, such as a titanium nitride layer, may be formed on the gate dielectric layer 185, and the work function layer 186 is formed on the additional layer. The work function layer 186 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

In some embodiments, the term "work function" refers to the minimum energy (usually expressed in electron volts) needed to remove an electron from a neutral solid to a point immediately outside the solid surface (or energy needed to move an electron from the Fermi energy level into vacuum). Here "immediately" means that the final electron position is far from the surface on the atomic scale but still close to the solid surface on the macroscopic scale.

As shown in FIG. 22, a work function layer 188 can be conformally formed on the work function layer 186. A portion of the work function layer 188 is formed in the gate trench GT and wraps the semiconductor fins 152 and 154. In some embodiments, the work function layer 188 is in contact with the work function layer 186. The work function layer 188 can provide another suitable work function value for the gate stack of the semiconductor device. In some embodiments, the work function layer 188 may include a titanium-containing material, such as, for example, titanium nitride (TiN). In some embodiments, tantalum is absent in the work function layer 188. The work function layer 188 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

Figure 23:
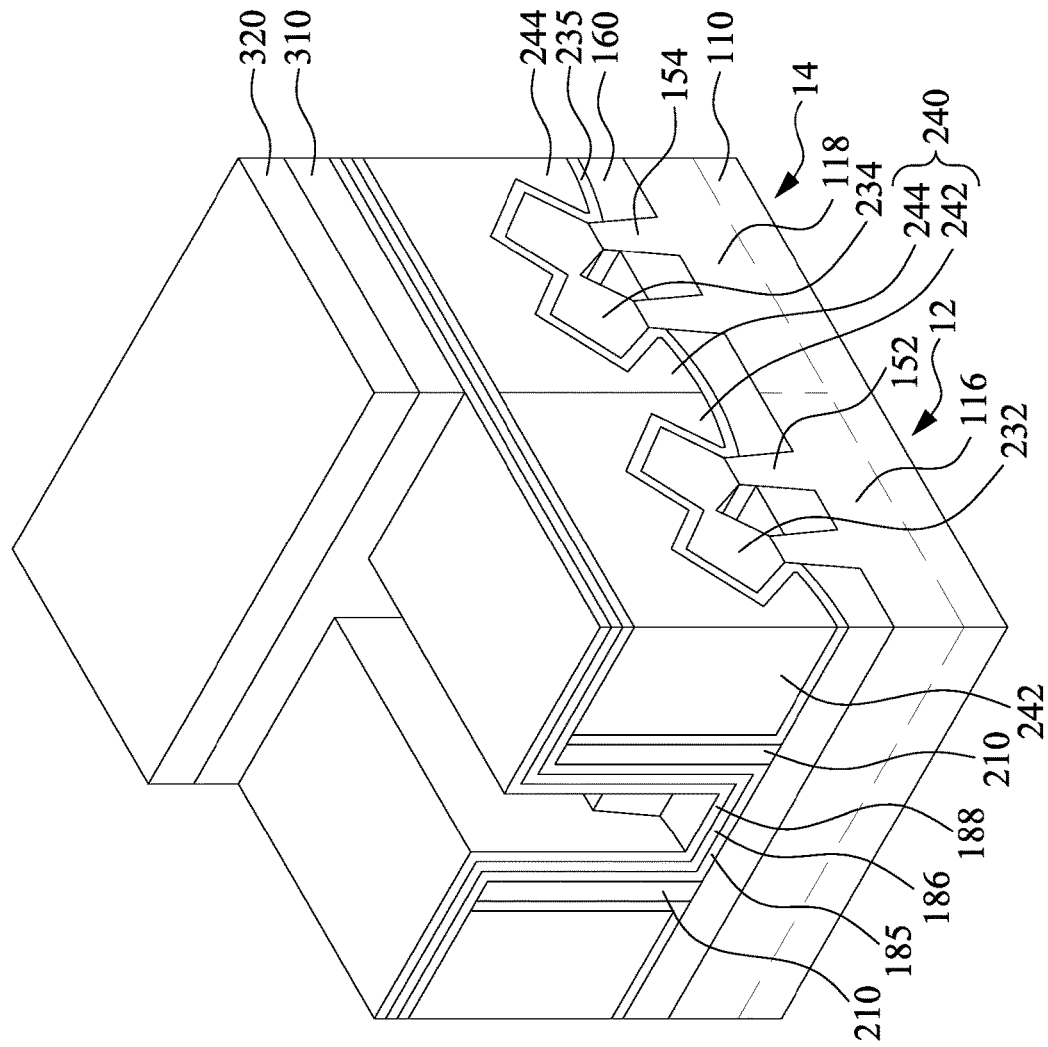

With reference to FIG. 23, a dielectric material 310, e.g. spin-on-glass (SOG), can be formed, covering the work function layers 186 and 188 on the N-type well 118 and the semiconductor fins 154 and filling the gate trench GT, and exposing the work function layers 186 and 188 on the P-type well 116. A photoresist 320 can be defined over the dielectric material 310. The dielectric material 310 and the photoresist 320 can be provided for patterning the work function layer 188. The dielectric material 310 and the photoresist 320 can be defined by, for example, a spin-on process, a photolithographic process, and an etching process.

Figure 24:
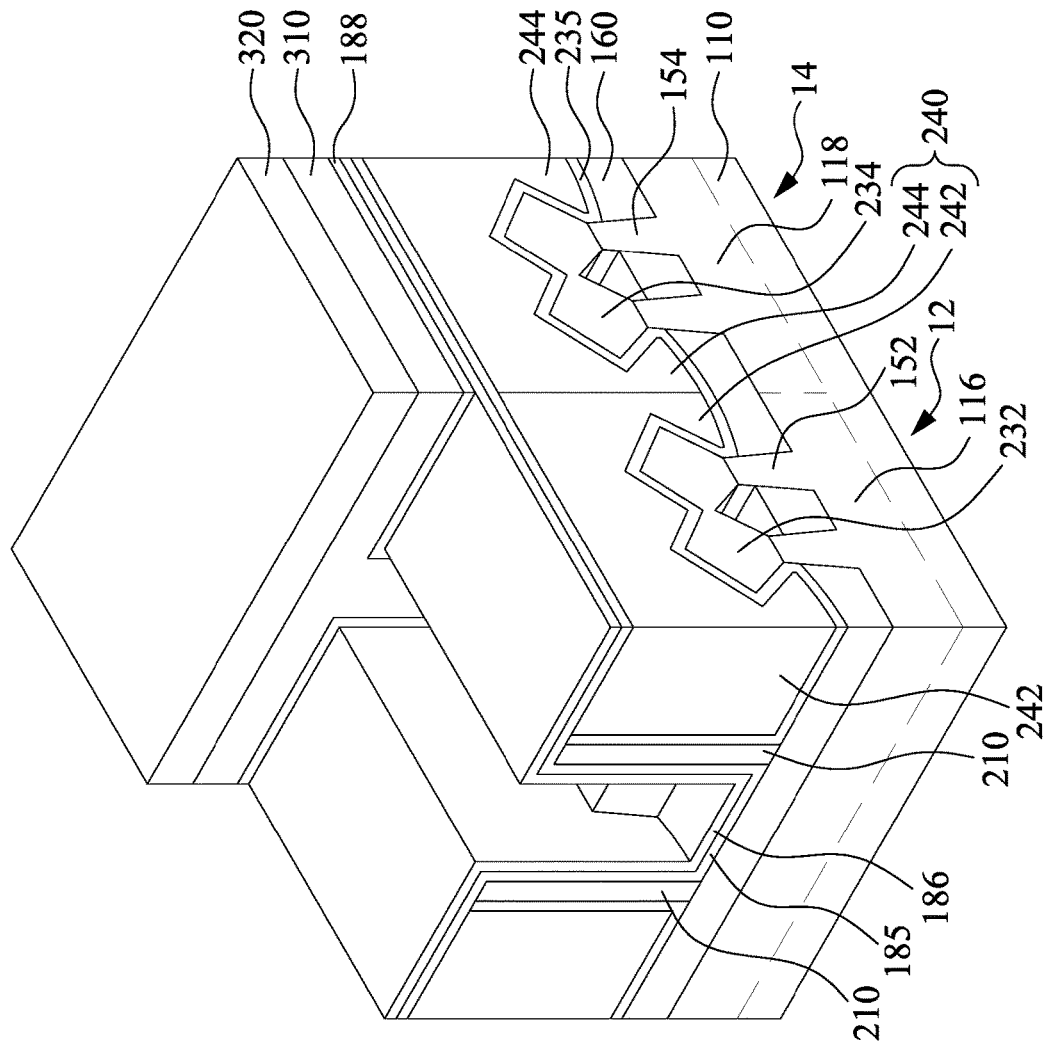

With reference to FIG. 24, the work function layer 188 above the P-type well 116 and the semiconductor fins 152 that are not covered by the dielectric material 310 and the photoresist 320 shown in FIG. 23 can be removed, so that the work function layer 188 can be patterned to remain on the semiconductor fins 154, but not on the semiconductor fins 152. After patterning the work function layer 188, the dielectric material 310 and the photoresist 320 shown in FIG. 24 can be removed by a wet etching process, a dry etching process, or combinations thereof, exposing the remained work function layer 188. After the patterning, the work function layer 186 is present on the semiconductor fins 152 and 154, and the work function layer 188 are present on the semiconductor fins 154, and then the dielectric material 310 and the photoresist 320 are removed.

Figure 25:
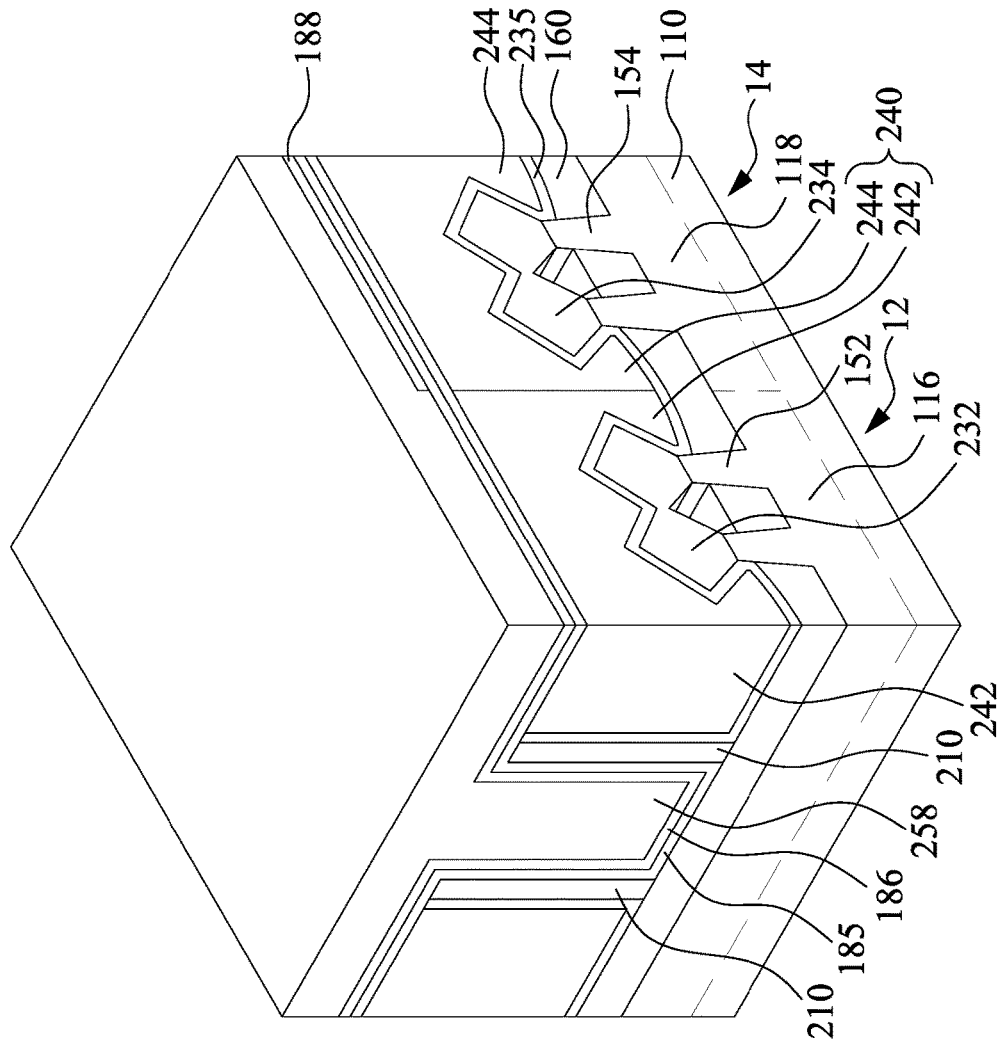

As shown in FIG. 25, a remaining gate trench GT is then filled or overfilled with a filling conductor 258. In some embodiments, the filling conductor 258 includes, for example, tungsten (W). The filling conductor 258 can be formed using ALD, PVD, CVD, or other suitable process. In some other embodiments, the filling conductor 258 includes aluminum (Al), copper (Cu) or other suitable conductive material. In some embodiments, an additional material may be formed on the work function layer 188, and the filling conductor 258 may be formed on the additional material. Such an additional material may be, for example, TiN, which may increase the adhering strength of tungsten and TiAlC.

Figure 26:
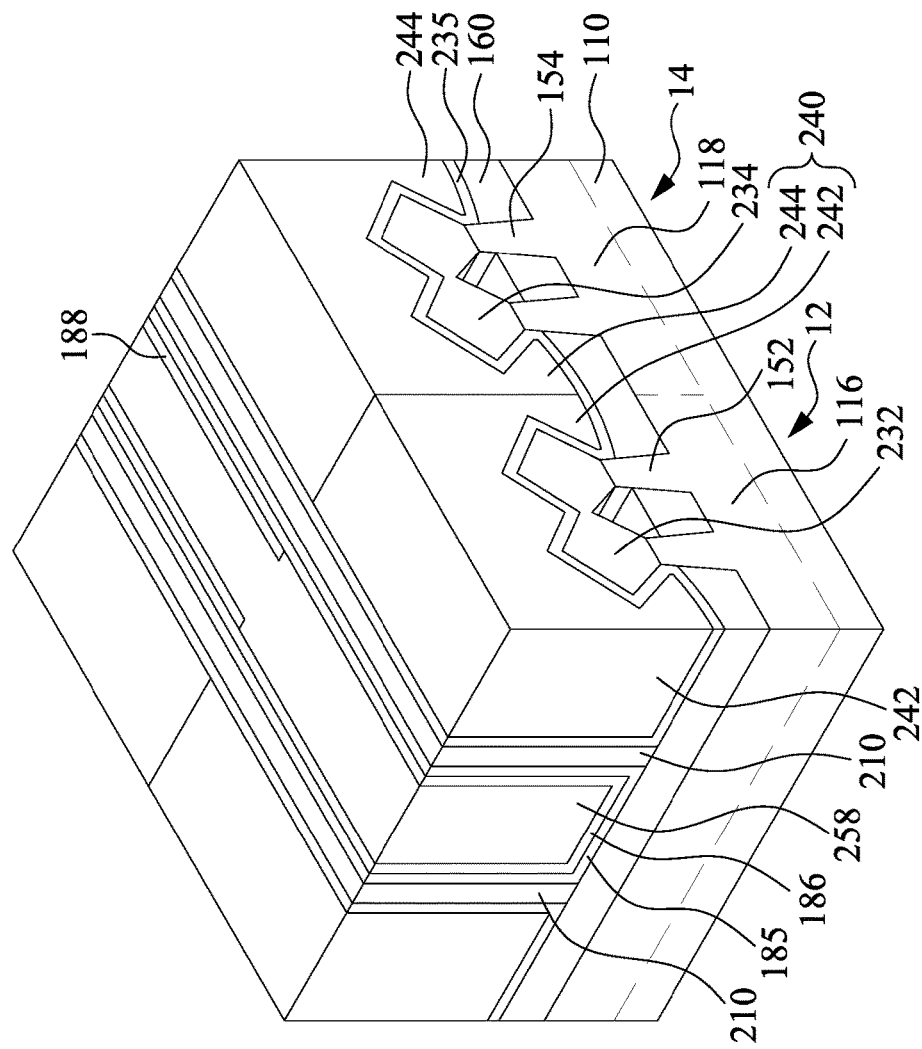

As shown in FIG. 26, a chemical mechanical planarization (CMP) process is applied to remove excessive filling conductor 258, gate dielectric layer 185, and the work function layers 186 and 188 outside the gate trench GT to provide a substantially planar top surface. The remaining work function layers 186 and 188 and the remaining filling conductor 258 form a gate stack G in the recess 181. The gate stack G may be referred to as metal gate electrodes in some cases. It is understood that the formation of the gate stack G mentioned above is illustrative, and is not limiting the present disclosure. In some embodiments, a portion of the gate stack G1 above the P-type well 116 may be referred to as NMOS metal gate electrode G1 and another portion of the gate stack G above the N-type well may be referred to as PMOS metal gate electrodes G2.

Figure 27A:
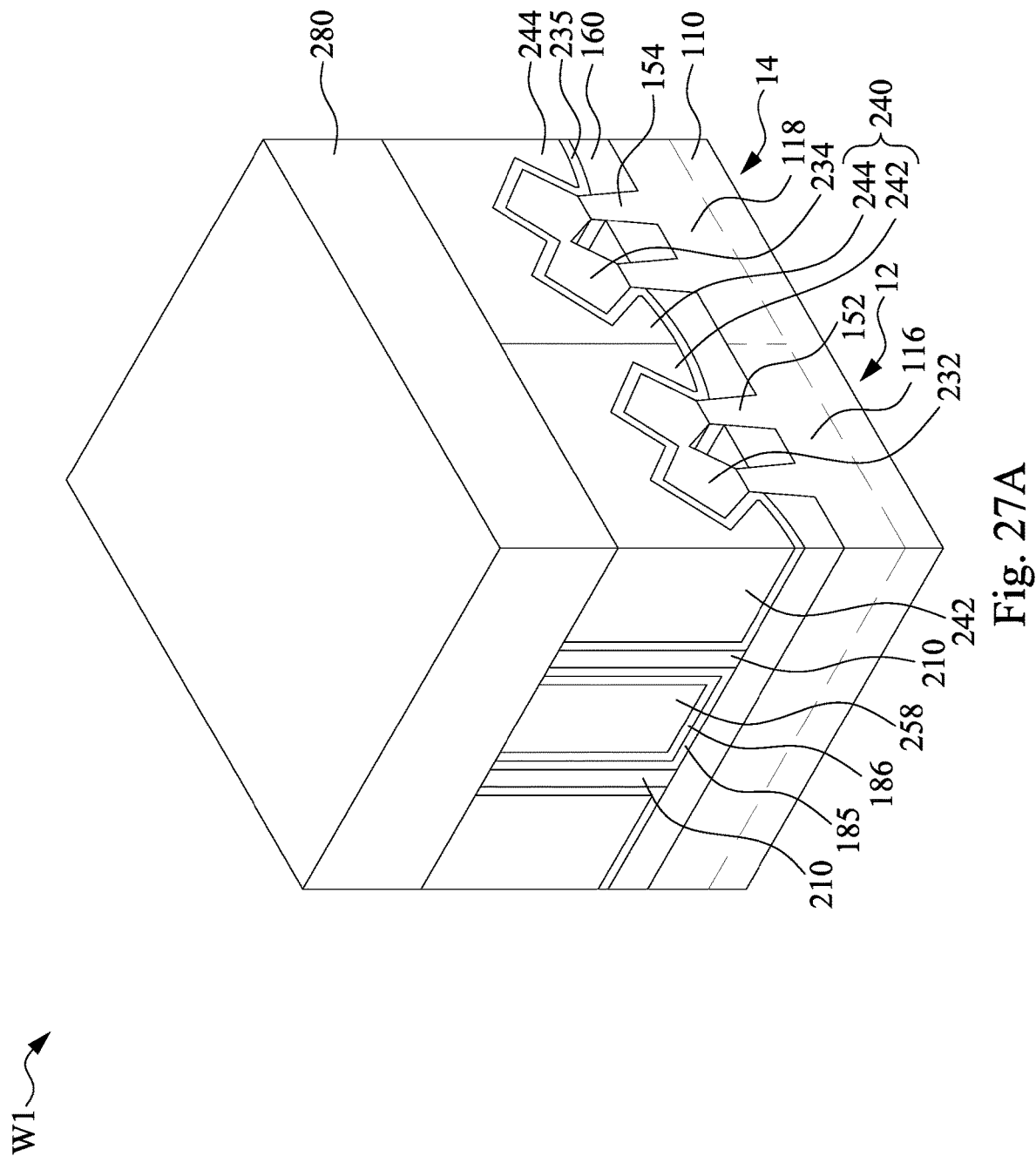
Figure 27B:
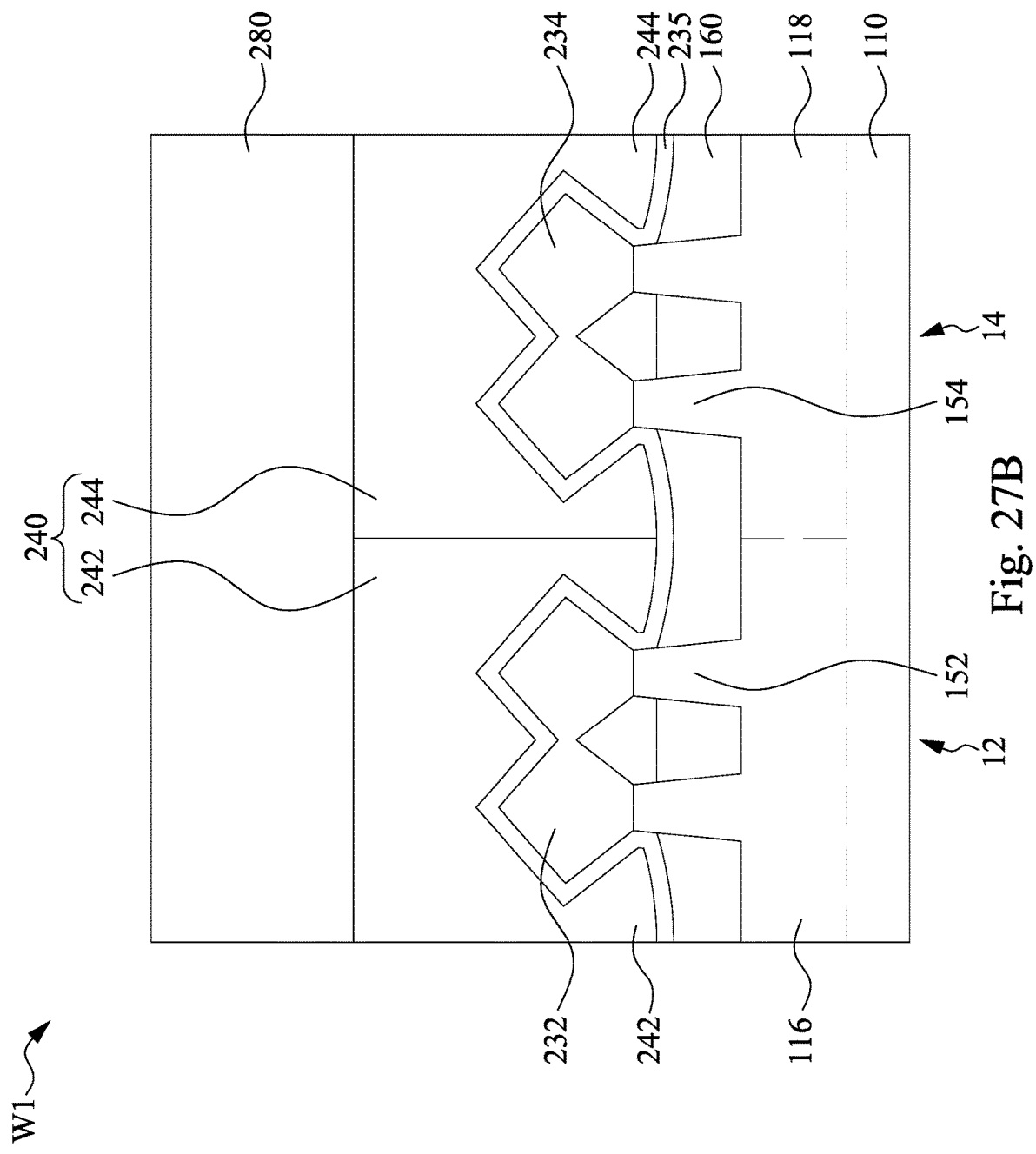

Returning to FIG. 1B, the method M1 then proceeds to block S24 where an interlayer dielectric (ILD) layer is formed over the gate stack an ILD layer. With reference to FIGS. 27A and 27B, in some embodiments of block S24, an interlayer dielectric (ILD) layer 280 is formed over the gate stack G and the ILD layer 240. The ILD layer 280 is made of silicon oxide, silicon nitride, silicon oxynitride, fluoride-doped silicate glass (FSG), or other low-K dielectric materials. In some embodiments, the ILD layer 280 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), in which process gases may include tetraethylorthosilicate (TEOS) and ozone ($O_3$). In yet other embodiments, the ILD layer 280 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the ILD layer 280.

Figure 28:
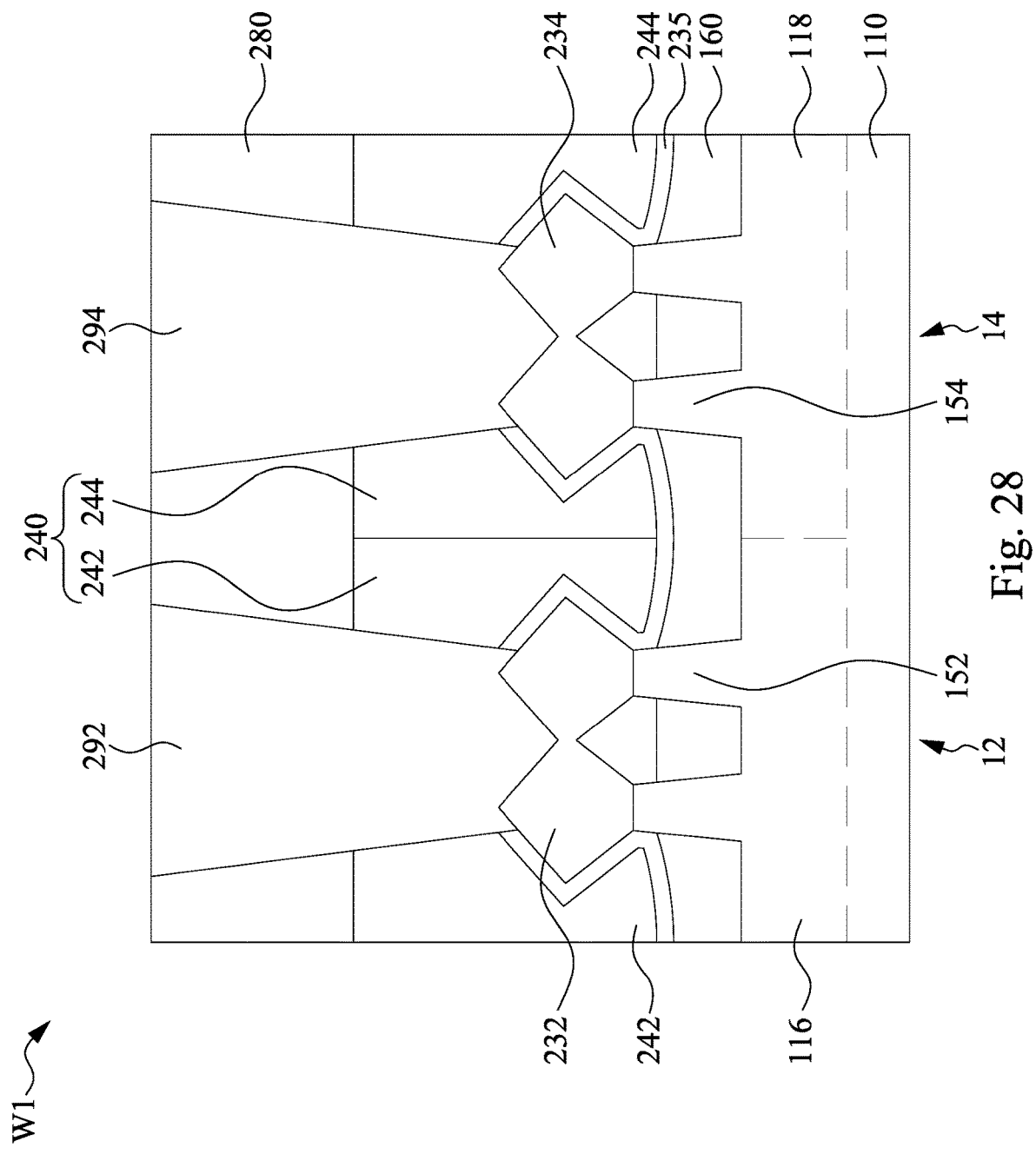

Returning to FIG. 1B, the method M1 then proceeds to block S25 where a gate contact is formed to land on the gate structure. With reference to FIG. 28, in some embodiments of block S25, a first contact hole may be formed by any suitable process in the ILD layer 280, the flowable dielectric materials 242, and the CESL 235, and a second contact hole may be formed by any suitable process in the ILD layer 280, the flowable dielectric materials 244, and the CESL 235. Subsequently, a conductive material layer fills in the first and second contact holes. In some embodiments, the conductive material layer includes TiN, TaN, Ta, Ti, Hf, Zr, Ni, W, Co, Cu, Ag, Al, Zn, Ca, Au, Mg, Mo, Cr, or the like. In some embodiments, the conductive material layer may be formed by CVD, PVD, plating, ALD, or other suitable technique. Subsequently, a planarization process such as chemical mechanical polish (CMP) is performed to remove a portion of the conductive material layer above a top surface of the ILD layer 280. After planarization, source/drain contacts 292 and 294 are formed. The source/drain contact 292 goes through the ILD layer 280, the flowable dielectric materials 242, and the CESL 235 to provide electrical contact to the epitaxial source/drain structures 232. The source/drain contact 294 goes through the ILD layer 280, the flowable dielectric materials 244, and the CESL 235 to provide electrical contact to the epitaxial source/drain structures 234.

Figure 29A:
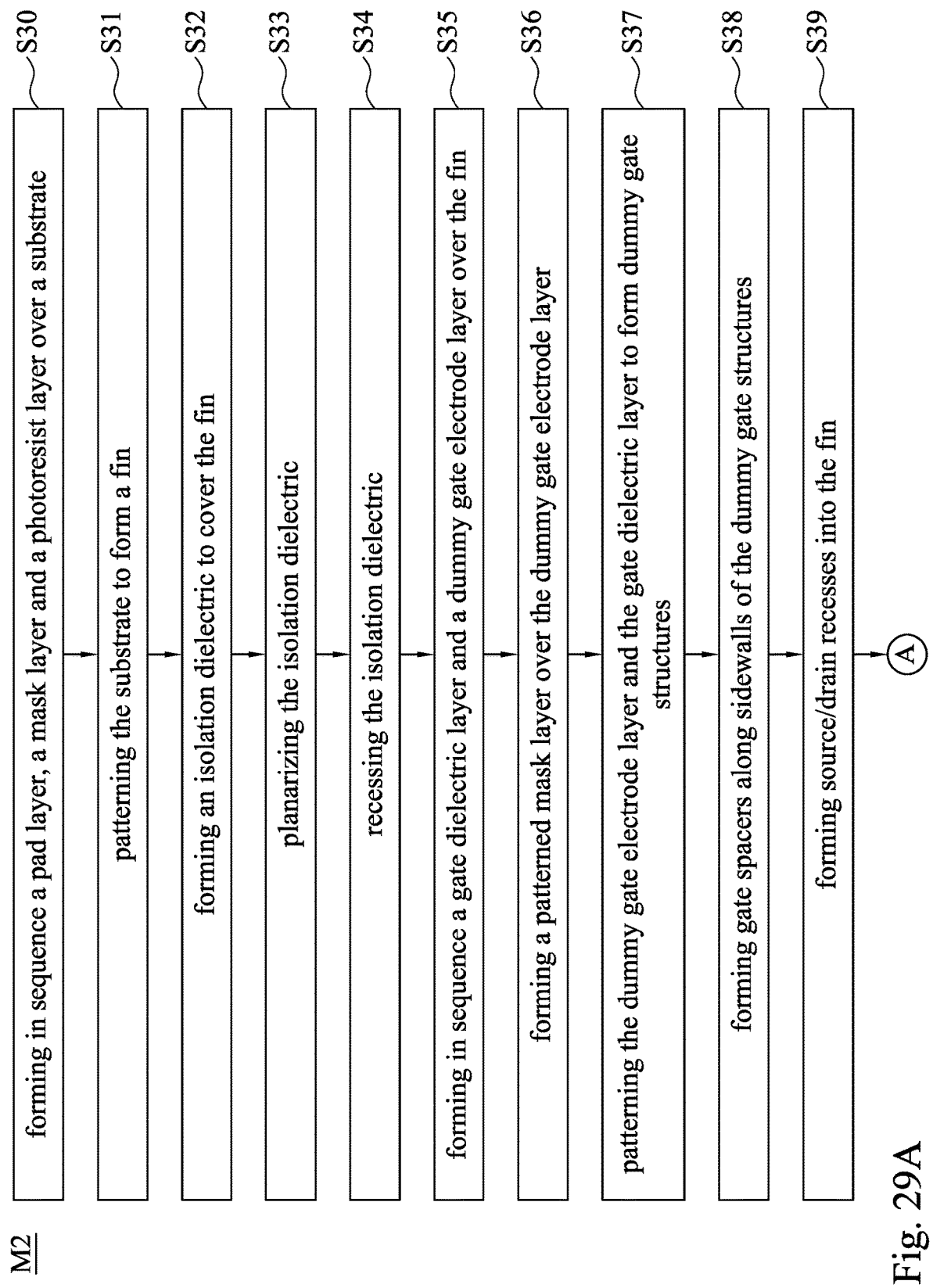
FIGS. 29A to 29B illustrate a block diagram of a method of forming a semiconductor device in accordance with some embodiments.
Figure 29B:
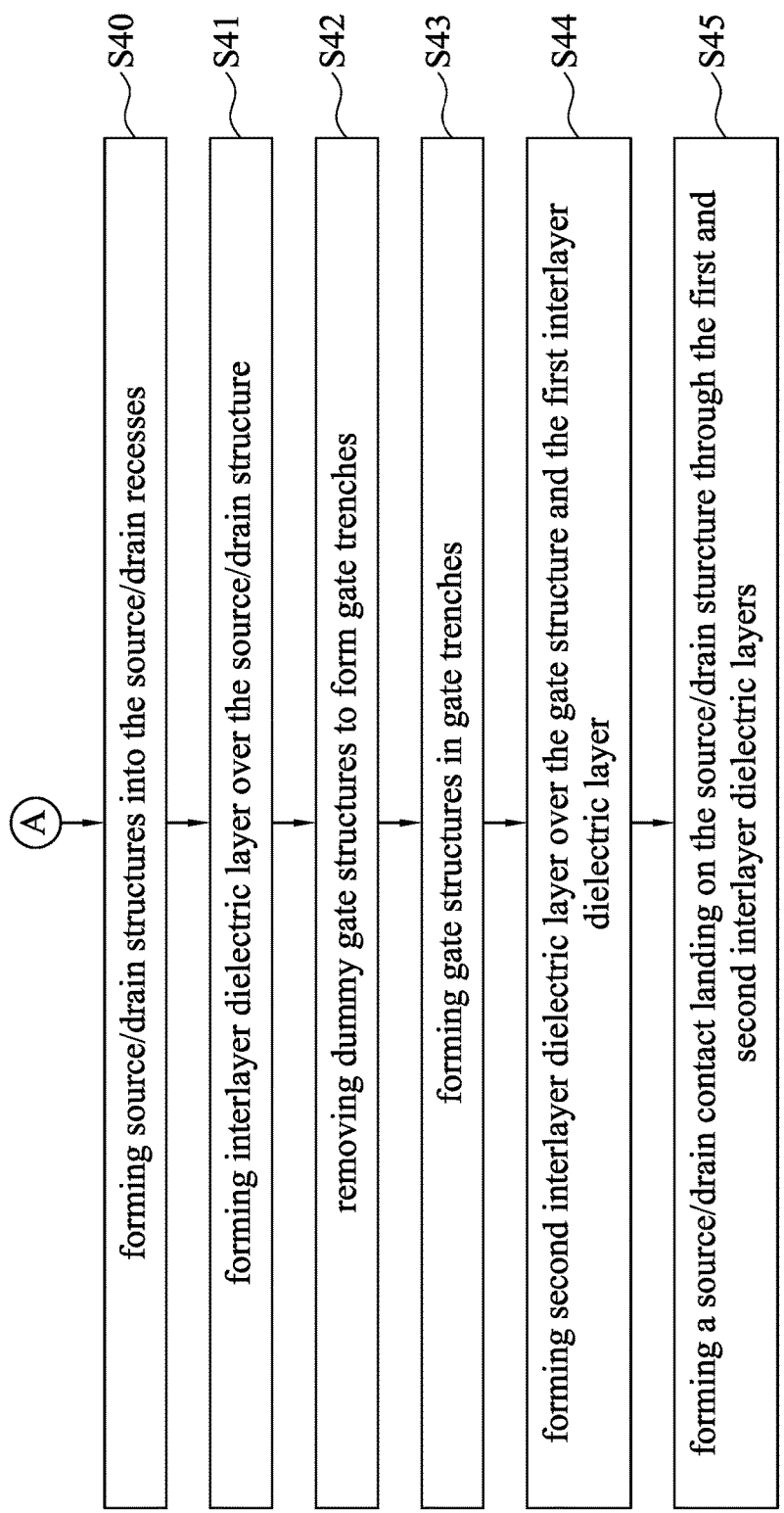

Referring now to FIGS. 29A and 29B, illustrated are an exemplary method M2 for fabrication of a semiconductor device in accordance with some embodiments. The method M2 includes a relevant part of the entire manufacturing process. It is understood that additional operations may be provided before, during, and after the operations shown by FIGS. 29A and 29B, and some of the operations described below can be replaced or eliminated for additional embodiments of the method. The order of the operations/processes may be interchangeable. The method M2 includes fabrication of a FinFET device. However, the fabrication of FinFET device is merely example for describing the manufacturing process according to some embodiments of the present disclosure.

FIGS. 30A to 38 illustrate a wafer W2 at various stages of the method M2 according to some embodiments of the present disclosure. Operations for forming a wafer W2 (may be also referred to as a substrate) before the structure shown in FIGS. 30A and 30B at stages S30-S40 of the method M2 are substantially the same as the operations for forming the wafer W1 shown in FIGS. 2-12B at stages S10-S20 of the method M1, and reference may be made to the foregoing paragraphs for the related detailed descriptions and such descriptions are not provided again herein.

Returning to FIGS. 29A and 29B, the method M2 then proceeds to block S41 where a contact etch stop layer (CESL) and an interlayer dielectric (ILD) layer is formed over the source/drain structures. In certain embodiments of block S31, with reference to FIGS. 30A-37B, the forming of the ILD layer 340 (See FIGS. 37A and 37B) includes deposition processes and curing processes. For example, it may perform a curing process (e.g., FIGS. 31A, 31B, 36A, and 36B) followed by a deposition step (e.g., FIGS. 30A, 30B, 35A, and 35B). In some embodiments, a planarization process (e.g., FIGS. 32A, 32B, 37A, and 37B) may follow the curing process (e.g., FIGS. 31A, 31B, 36A, and 36B).

Figure 30A:
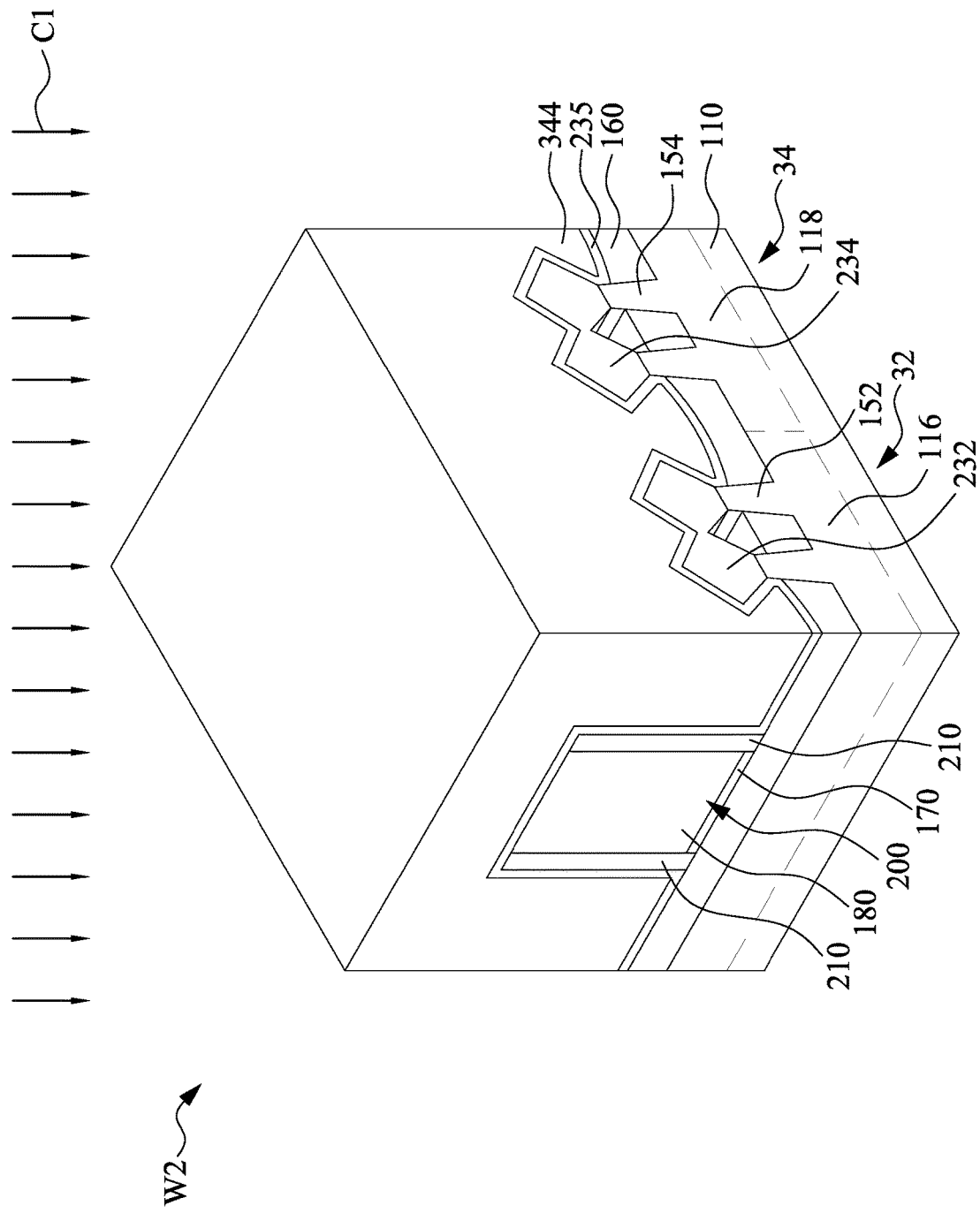
FIGS. 30A to 38 illustrate a wafer at various stages of the method in FIGS. 1A and 1B according to some embodiments of the present disclosure.
Figure 30B:
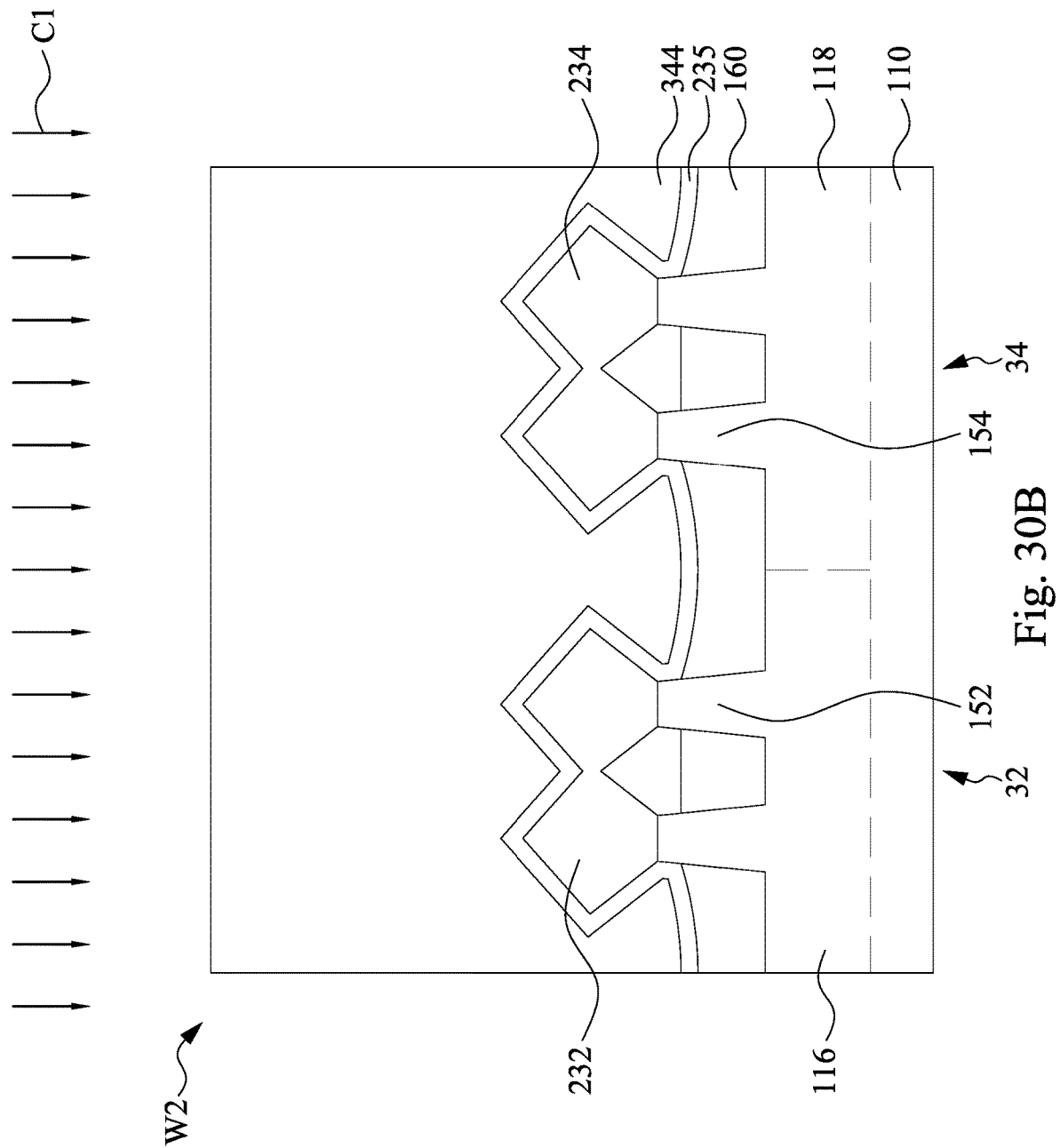

With reference to FIGS. 30A and 30B, a flowable dielectric material 344 is formed over the CESL 235 and is deposited by a deposition process C1. As shown in FIGS. 30A and 30B, the flowable dielectric material 344 overfills the trenches T (See FIG. 3) and above a top surface of the dummy gate structures 200. In some embodiments, material and manufacturing method of the flowable dielectric material 344 may be substantially the same as that of the flowable dielectric material 244 as shown in FIGS. 18A and 18B, and the related detailed descriptions may refer to the foregoing paragraphs, and are not described again herein. In greater detail, the deposition process C1 may be substantially the same as the deposition process P4 as shown in FIGS. 18A and 18B, and the related detailed descriptions may refer to the foregoing paragraphs, and are not described again herein.

In some embodiments, the as-deposited flowable dielectric material 344 is capable of filling the narrow and deep gaps and prevents voids and discontinuities in the trenches T (See FIG. 3). In some embodiments, the as-deposited flowable dielectric material 344 includes a flowable network of $SiO_AN_BH_C$ (or SiONH). In some embodiments, A is a number in a range from about 0 to about 2, B is a number from about 0.01 to about 1, and C is a number from about 0.01 to about 1.

Figure 31A:
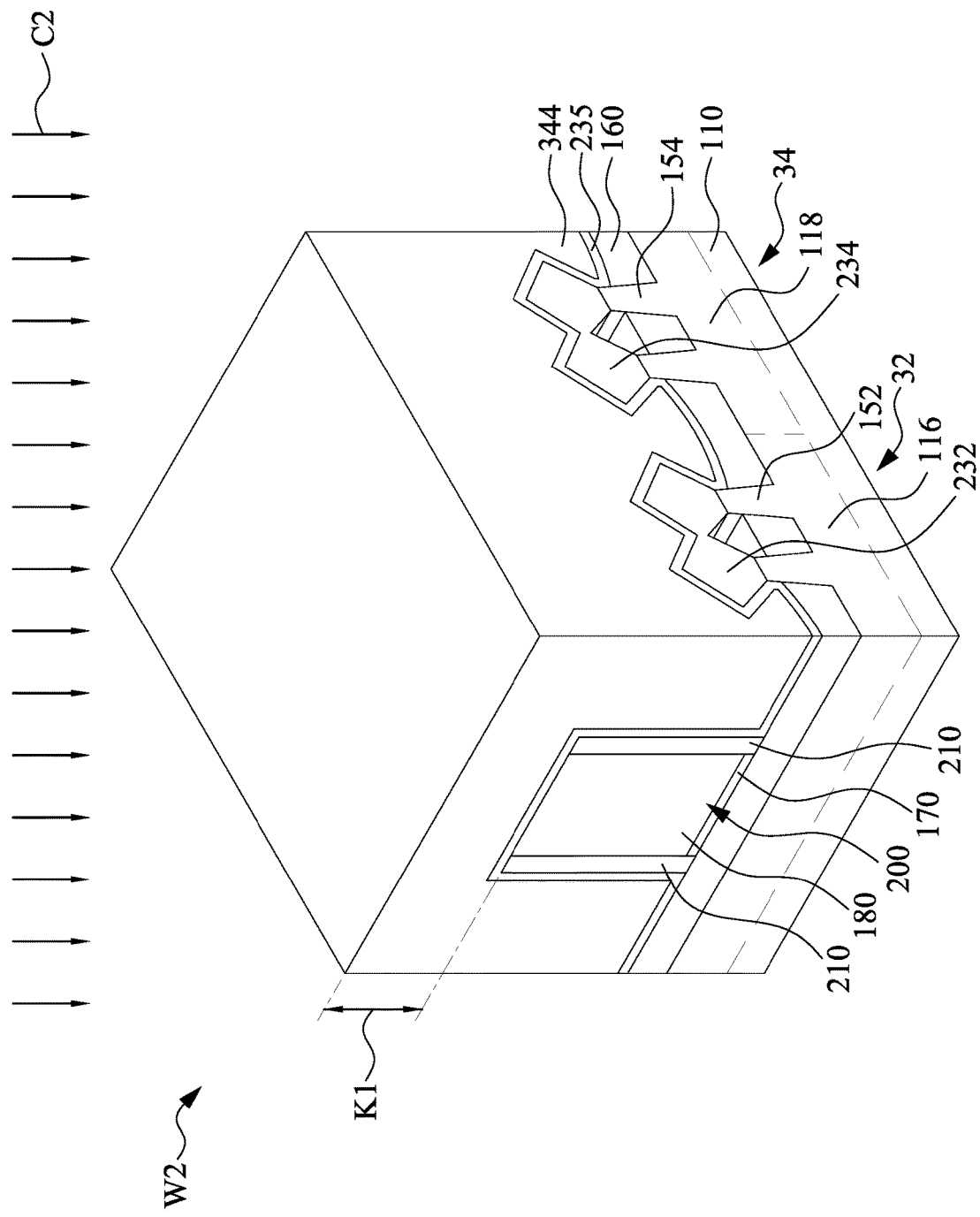
Figure 31B:
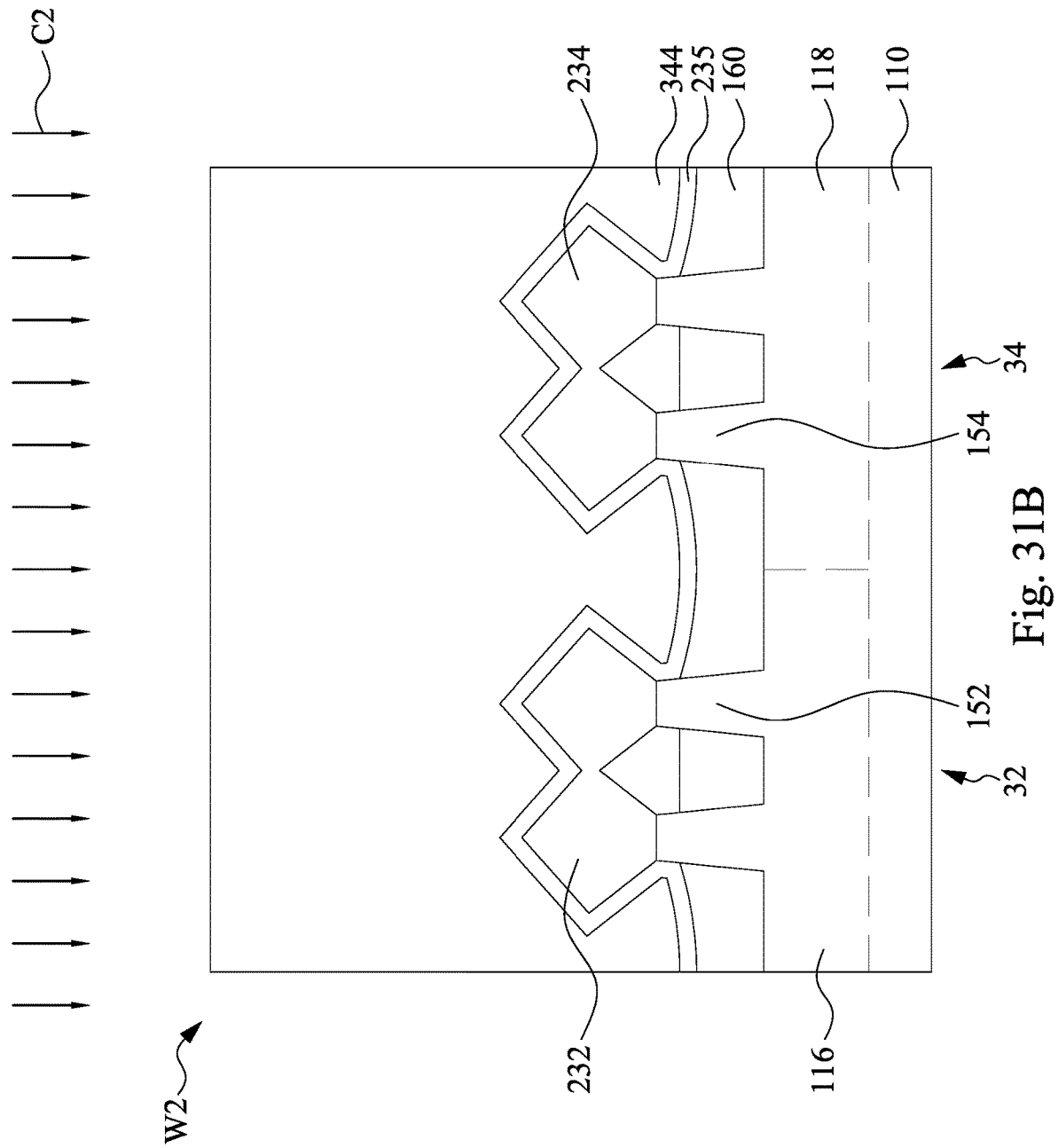

With reference to FIGS. 31A and 31B, after the flowable dielectric material 344 is deposited, an in-situ curing process C2 can be performed on the as-deposited flowable dielectric material 344. In-situ means the curing process C2 is performed in the process chamber for depositing the flowable dielectric material 344. In some embodiments, the curing process C2 can be performed in a different chamber (or ex-situ). In some embodiments, the curing process C2 may be substantially the same as the curing process P5 as shown in FIGS. 19A and 19B, and the related detailed descriptions may refer to the foregoing paragraphs, and are not described again herein.

In some embodiments, after the curing process C2, the SiOH and SiO network may be converted into SiO (or $SiO_2$) network. In greater detail, the curing process C2 may also cause the flowable dielectric material 344 to shrink. The duration and temperature of the dry anneal process step affect the amount of shrinkage. In some embodiments, the volume of the flowable dielectric material 344 shrinks in a range from about 2% to about 20%.

Due to the shrinkage of the flowable dielectric material 344, the flowable dielectric material 344 may exert a predetermined compressive stress on the epitaxial source/drain structure 234. In some embodiments, the flowable dielectric material 344 may provide no or negligible compressive stress to the p-type epitaxial source/drain structure 234, thereby alleviating the negative impacts on carrier mobility and performance of the PMOS 34 caused by an excessively large compressive stress.

Figure 32A:
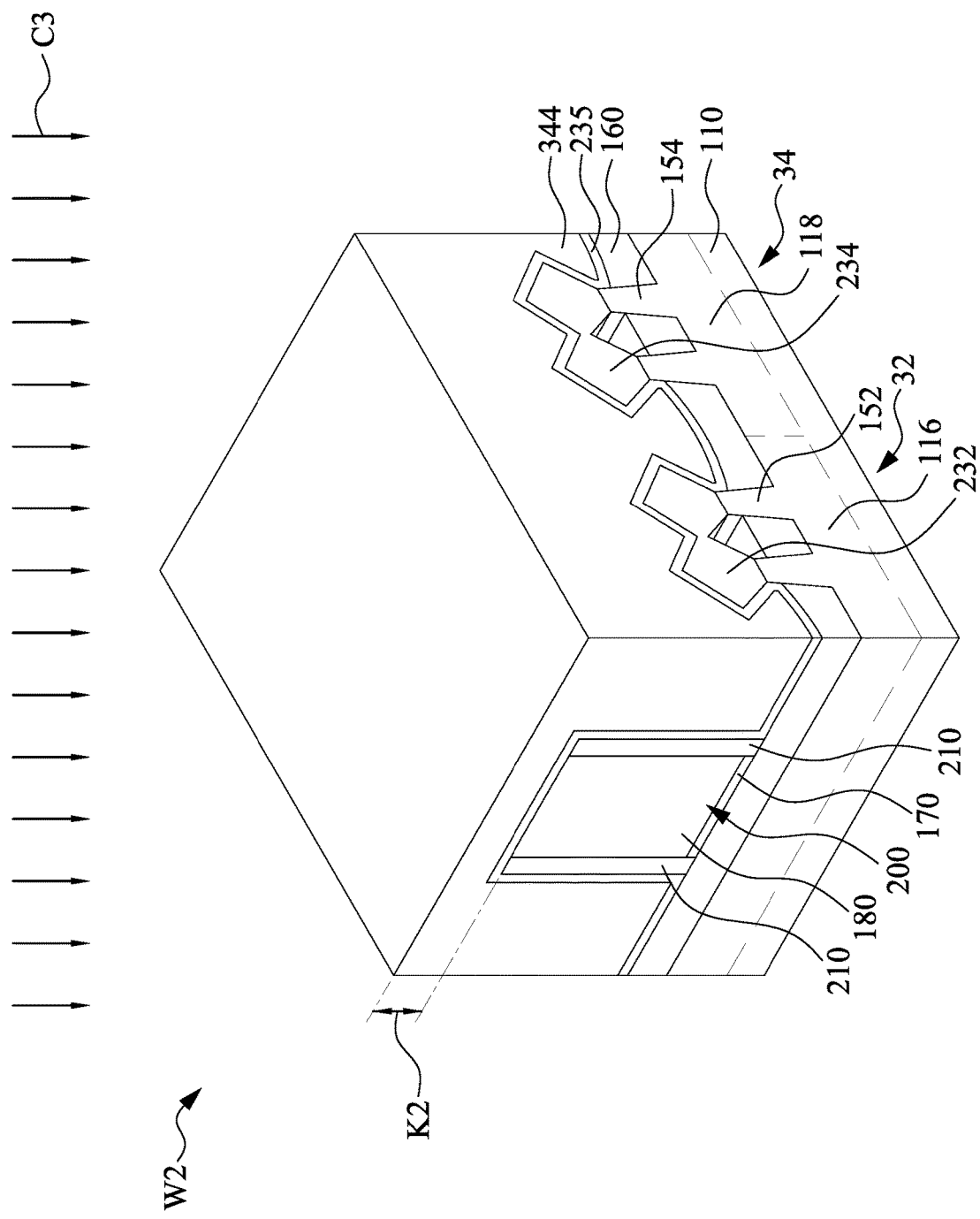
Figure 32B:
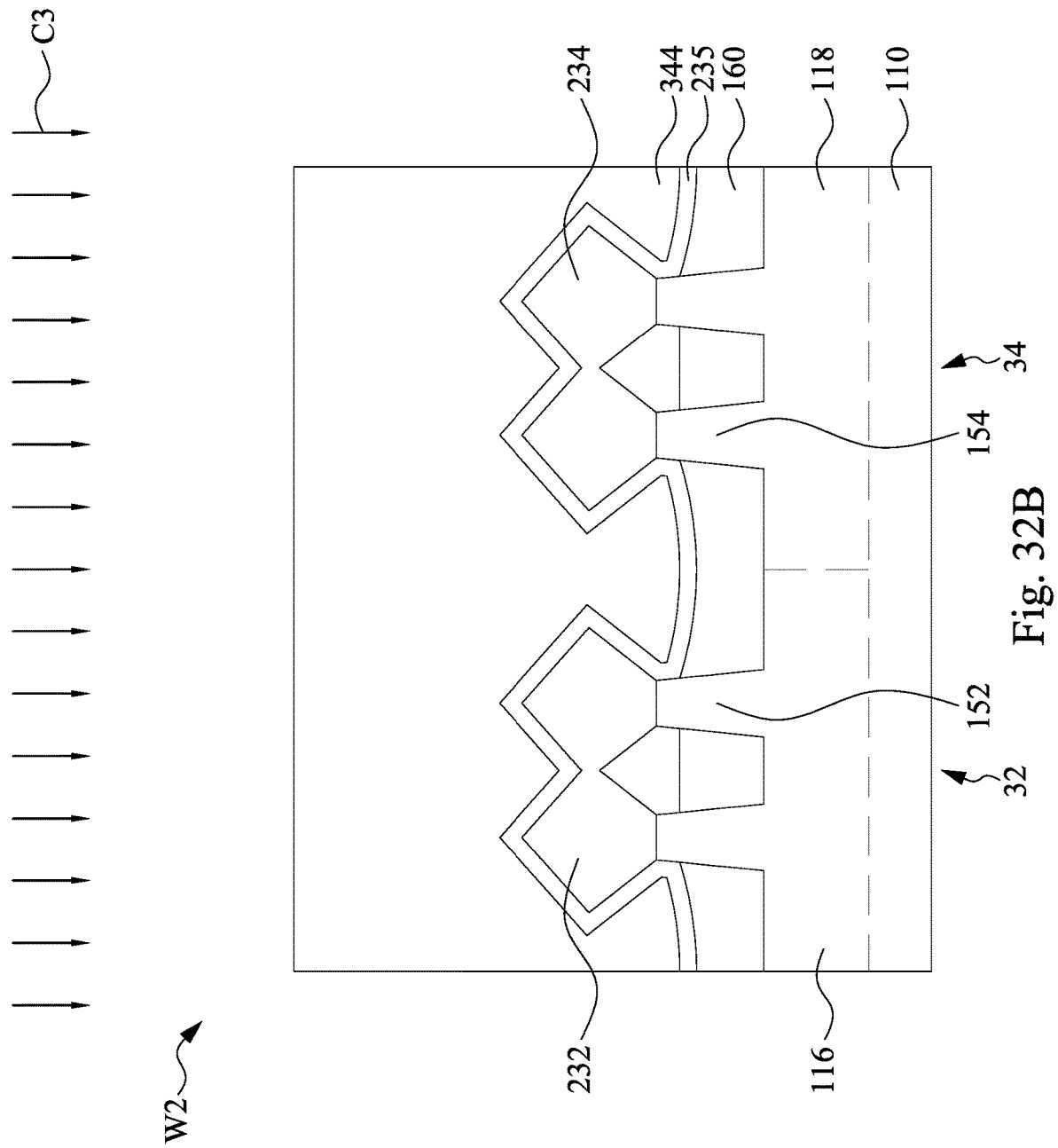

With reference to FIGS. 32A and 32B, a planarization process C3 such as chemical mechanical polish (CMP) is performed to remove a portion of the flowable dielectric material 344, such that the remained portion of the flowable dielectric material 344 remains covering the CESL 235. In some embodiments, the remained portion of the flowable dielectric material 344 has a thickness K2 less than the thickness K1 (See FIG. 31A) to the planarization process C3. In the depicted embodiment, the planarization process C3 stops before the dummy gate structure 200 is exposed. In some other embodiments, the planarization process may be performed until a top surface of the dummy gate structure 200 is exposed.

Figure 33A:
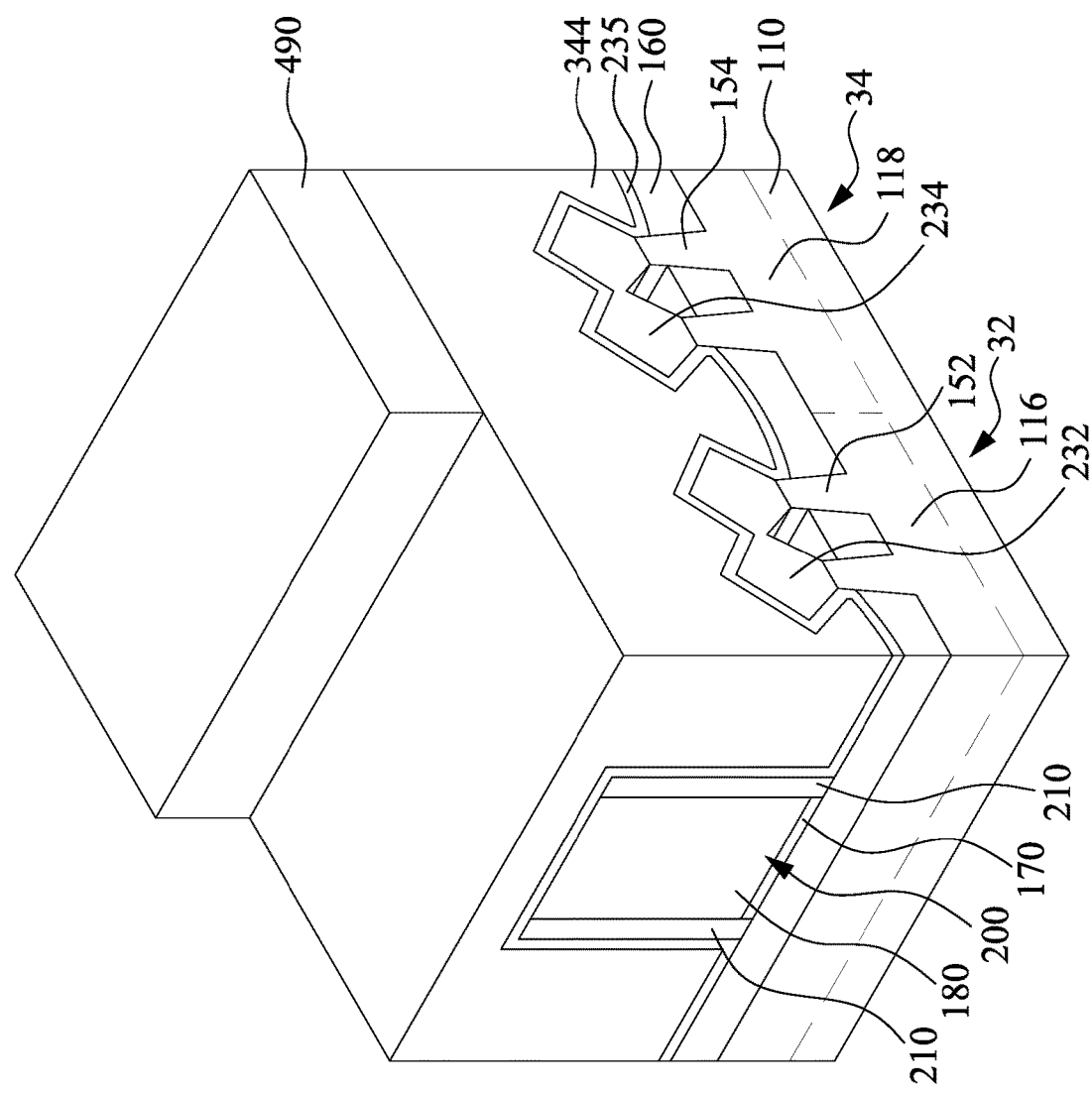
Figure 33B:
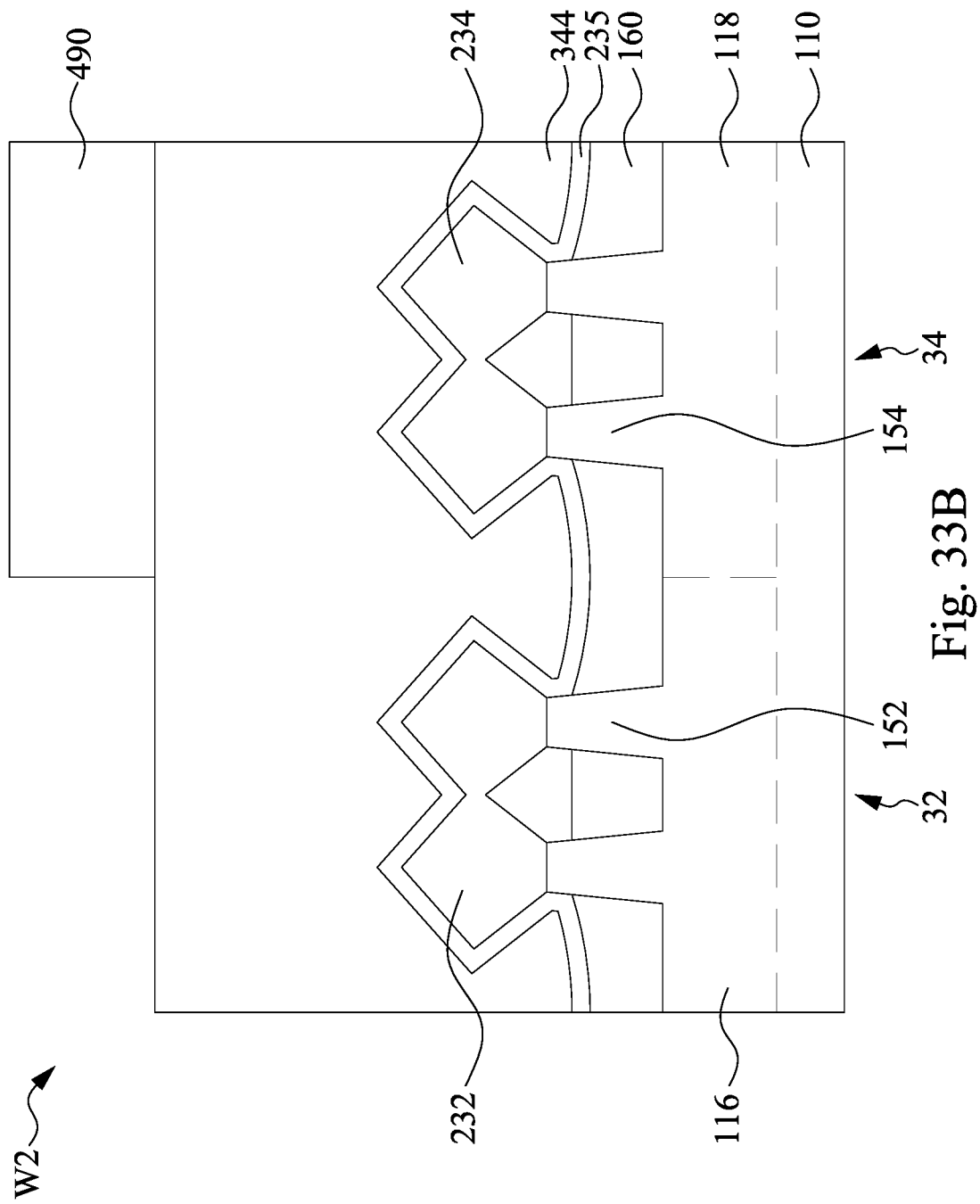

With reference to FIGS. 33A and 33B, a patterned mask layer 490 is formed over the flowable dielectric material 344 and then patterned to form separated mask portions overlapping the N-type well 118. In some embodiments, material and manufacturing method of the patterned mask layer 490 may be substantially the same as that of the patterned mask layer 390 as shown in FIGS. 16A and 16B, and the related detailed descriptions may refer to the foregoing paragraphs, and are not described again herein.

Figure 34A:
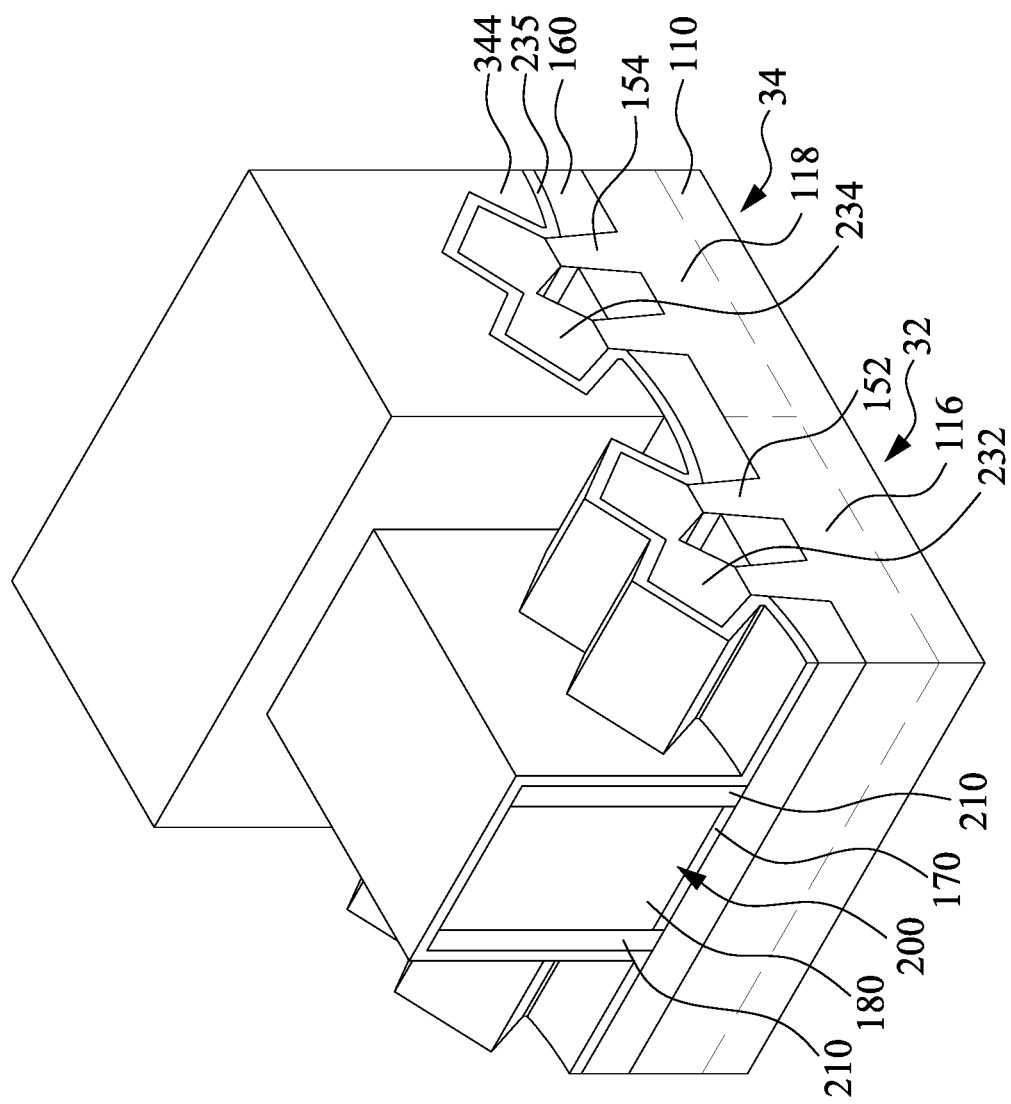
Figure 34B:
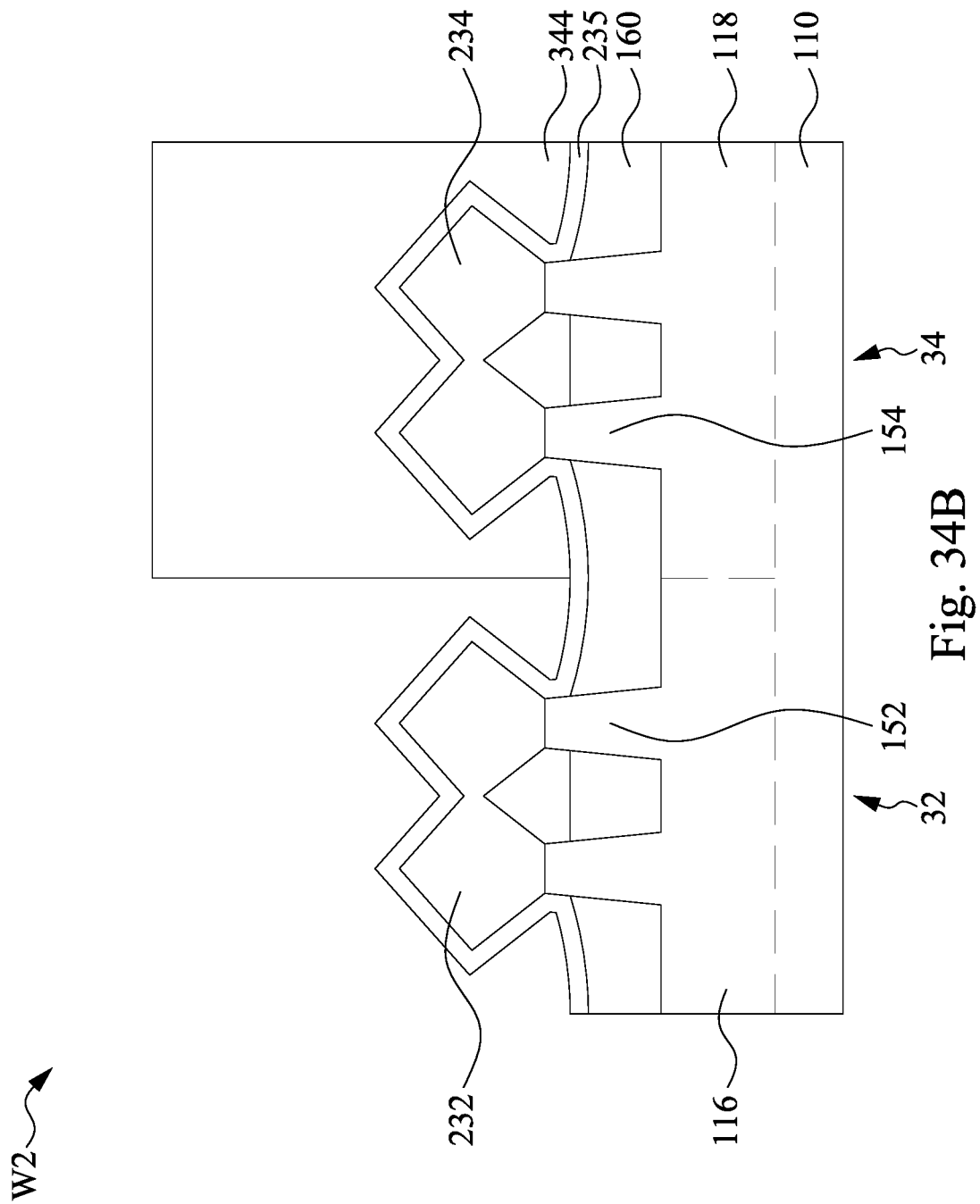

With reference to FIGS. 34A and 34B, one or more etching processes are performed to expose the CESL 235 above the P-type well 116 using the patterned mask 490 as an etching mask, and the patterned mask layer 490 (See FIGS. 33A and 33B) is removed after the etching.

Figure 35A:
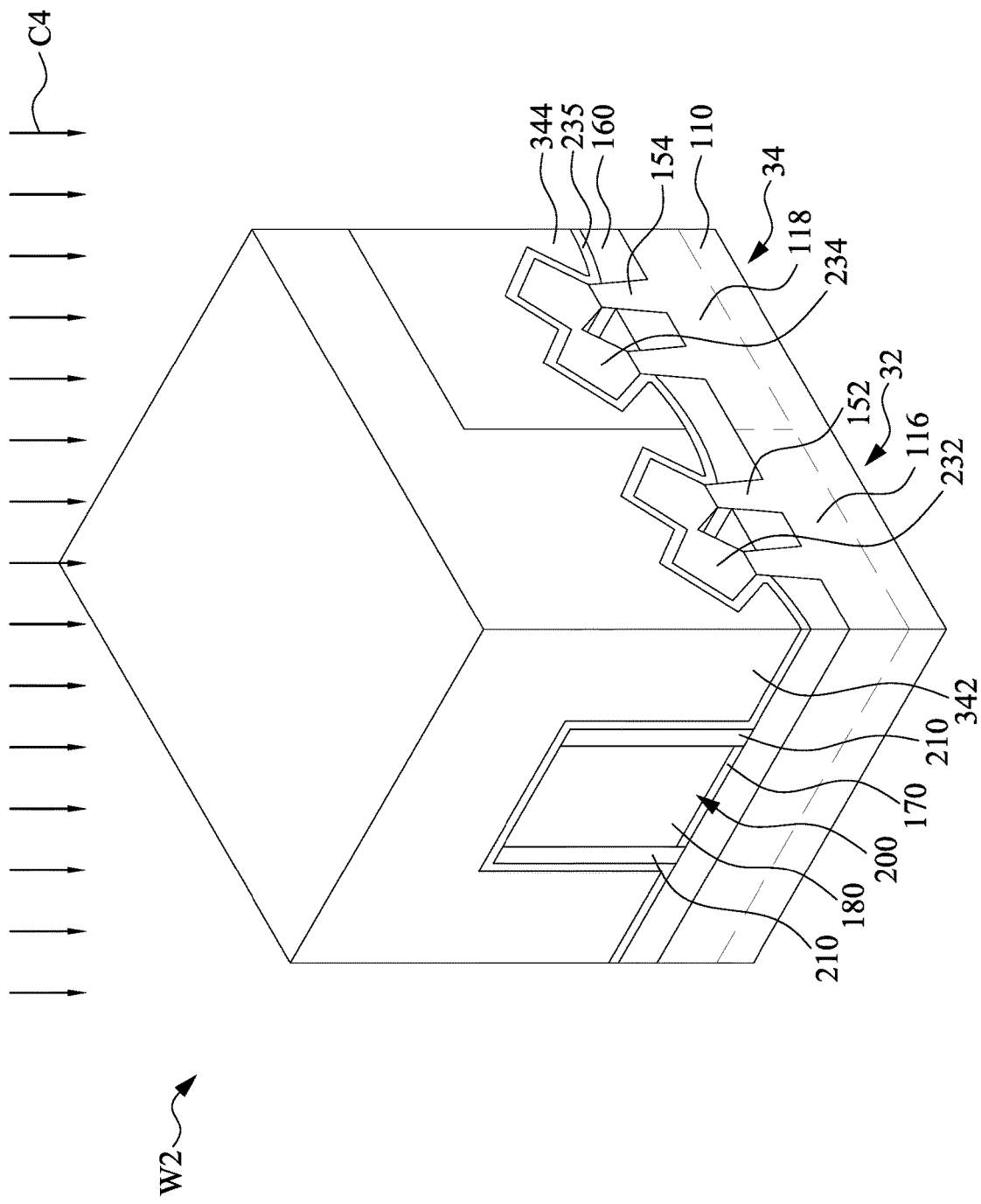
Figure 35B:
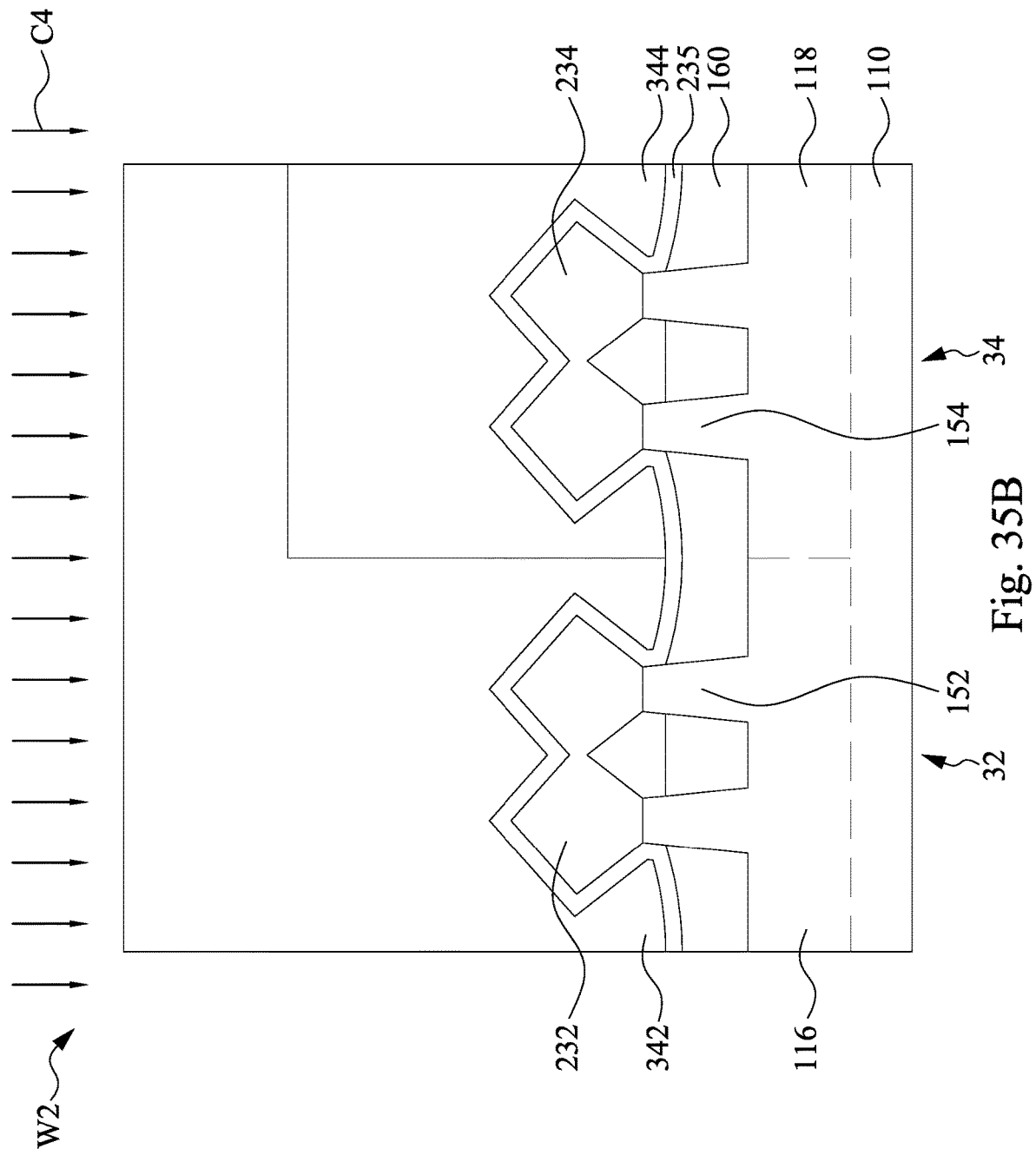

With reference to FIGS. 35A and 35B, a flowable dielectric material 342 is formed over the CESL 235 above the P-type well 116, formed over the flowable dielectric material 344 above the N-type well 118, and is deposited by a deposition process C4. In some embodiments, material and manufacturing method of the flowable dielectric material 342 may be substantially the same as that of the flowable dielectric material 242 as shown in FIGS. 13A and 13B, and the related detailed descriptions may refer to the foregoing paragraphs, and are not described again herein. In greater detail, the deposition process C4 may be substantially the same as the deposition process P1 as shown in FIGS. 13A and 13B, and the related detailed descriptions may refer to the foregoing paragraphs, and are not described again herein.

In some embodiments, the as-deposited flowable dielectric material 342 is capable of filling the narrow and deep gaps and prevents voids and discontinuities in the trenches T (See FIG. 3). The as-deposited flowable dielectric material 342 includes a flowable network of $SiO_AN_BH_C$ (or SiONH). In some embodiments, A is a number in a range from about 0 to about 2, B is a number from about 0.01 to about 1, and C is a number from about 0.01 to about 1.

Figure 36A:
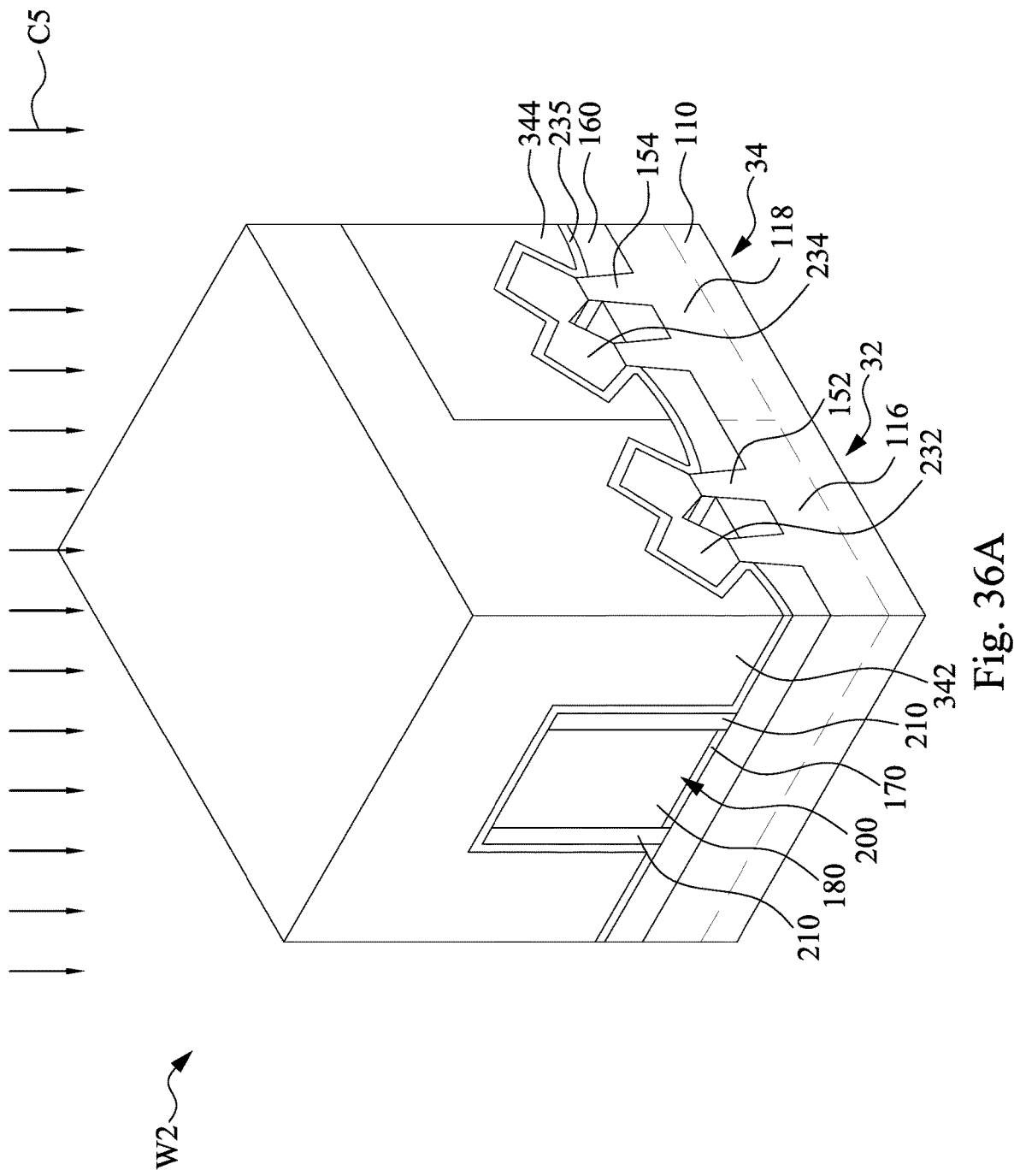
Figure 36B:
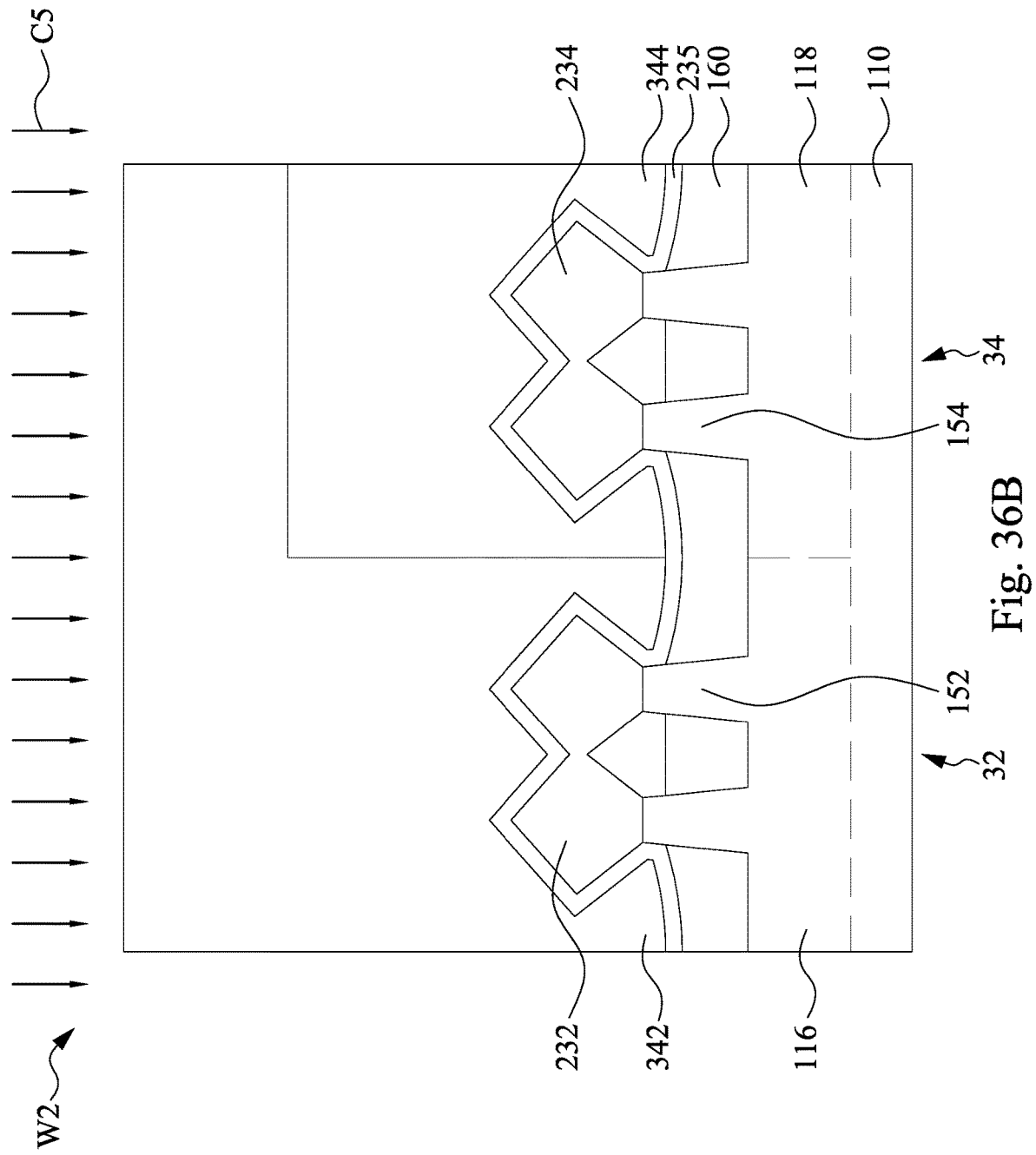

With reference to FIGS. 36A and 36B, after the flowable dielectric material 342 is deposited, an in-situ curing process C4 can be performed on the as-deposited flowable dielectric material 342. In-situ means the curing process C4 is performed in the process chamber for depositing the flowable dielectric material 342. In some embodiments, the curing process C4 can be performed in a different chamber (or ex-situ). In some embodiments, the curing process C4 may be substantially the same as the curing process P2 as shown in FIGS. 14A and 14B, and the related detailed descriptions may refer to the foregoing paragraphs, and are not described again herein.

In some embodiments, after the curing process C4, the SiOH and SiO network may be converted into SiO (or $SiO_2$) network. In greater detail, the curing process C4 may also cause the flowable dielectric material 342 to shrink. The duration and temperature of the dry anneal process step affect the amount of shrinkage. In some embodiments, the volume of the flowable dielectric material 342 shrinks in a range from about 5% to about 20%. In some embodiments, shrink amount of the flowable dielectric material 344 during the curing process C2 is less than that of the flowable dielectric material 342 during the curing process C5. Because of the porosity difference between the flowable dielectric materials 342 and 344, the flowable dielectric materials 342 and 344 may form a distinguishable interface therebetween. In some embodiments, the flowable dielectric materials 342 and 344 may form a vertical interface vertically aligned with the interface between the P-type well 116 and the N-type well 118.

Due to the shrinkage of the flowable dielectric material 342, the flowable dielectric material 342 may exert a pre-determined compressive stress on the epitaxial source/drain structure 232, in which the compressive stress exerted on the n-type source/drain structure 232 by the flowable dielectric material 342 is greater than the compressive stress exerted on the p-type source/drain structure 234 by the flowable dielectric material 344. The epitaxial source/drain structure 232 may transfer the compressive stress into the semiconductor fins 152 (i.e., channel regions). As such, the compressive stress provided by the flowable dielectric material 342 transfers to the semiconductor fins 152 via the source/drain structure 232, thereby enhancing carrier mobility and performance of the PMOS 32. In some embodiments where the shrink amount of the flowable dielectric material 342 is greater than that of the flowable dielectric material 344 during the curing process C5, the shrinkage of flowable dielectric material 342 may exert a tensile stress on the flowable dielectric material 344, which in turn exerts a tensile stress on the p-type epitaxial source/drain structure 234 and the underlying fins 154, thus improving the carrier mobility of PMOS 34.

In some embodiments, the PMOS 32 and NMOS 34 obtain different stress values from the flowable dielectric materials 342 and 344. The different stress values transferred to channel regions may cause different stress values in the semiconductor fins 152 and 154 due to different types of majority carrier. The flowable dielectric materials 342 and 344 are able to increase and maintain the stress values in the semiconductor fins 152 and 154.

Figure 37B:
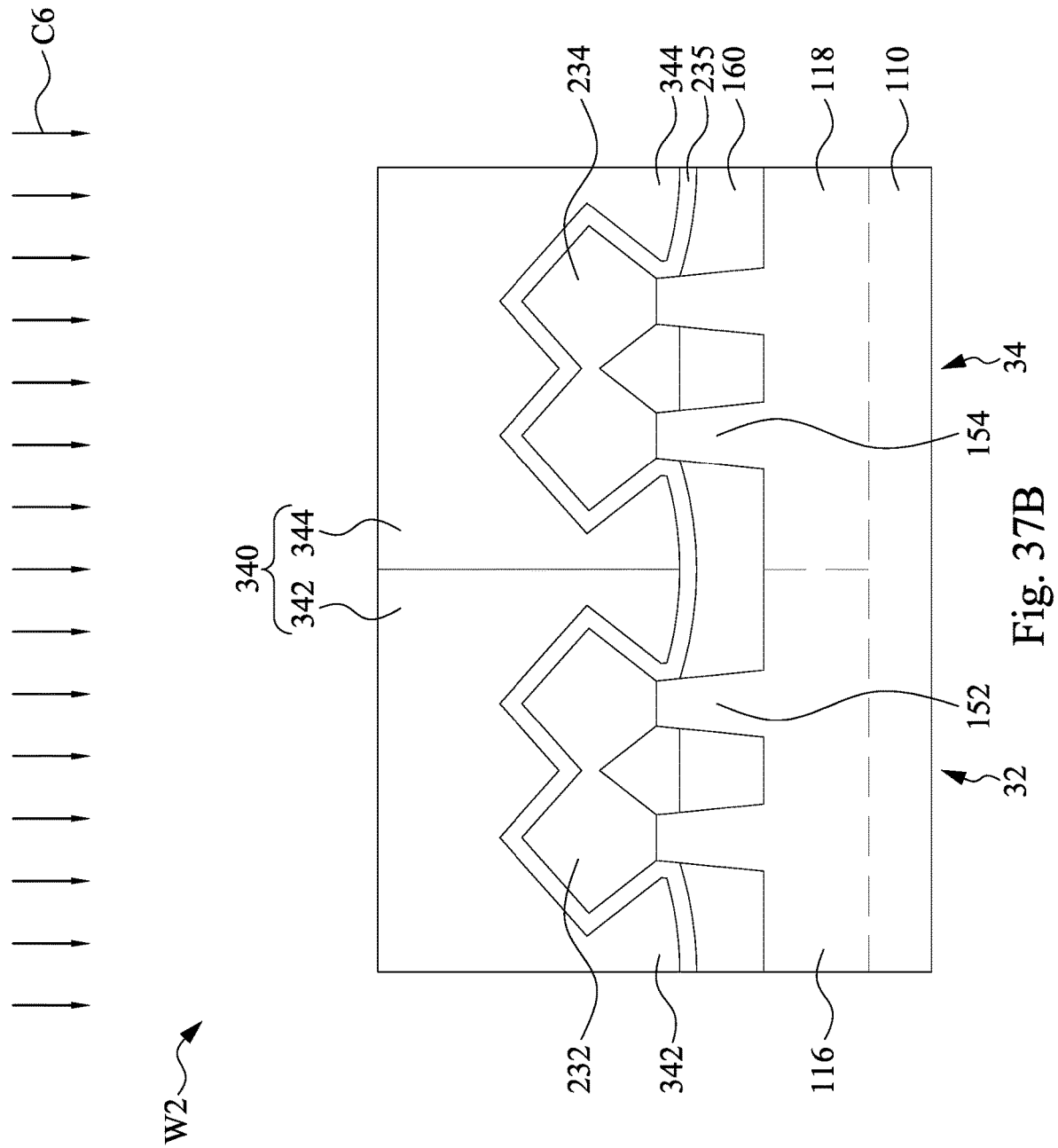
Figure 38:
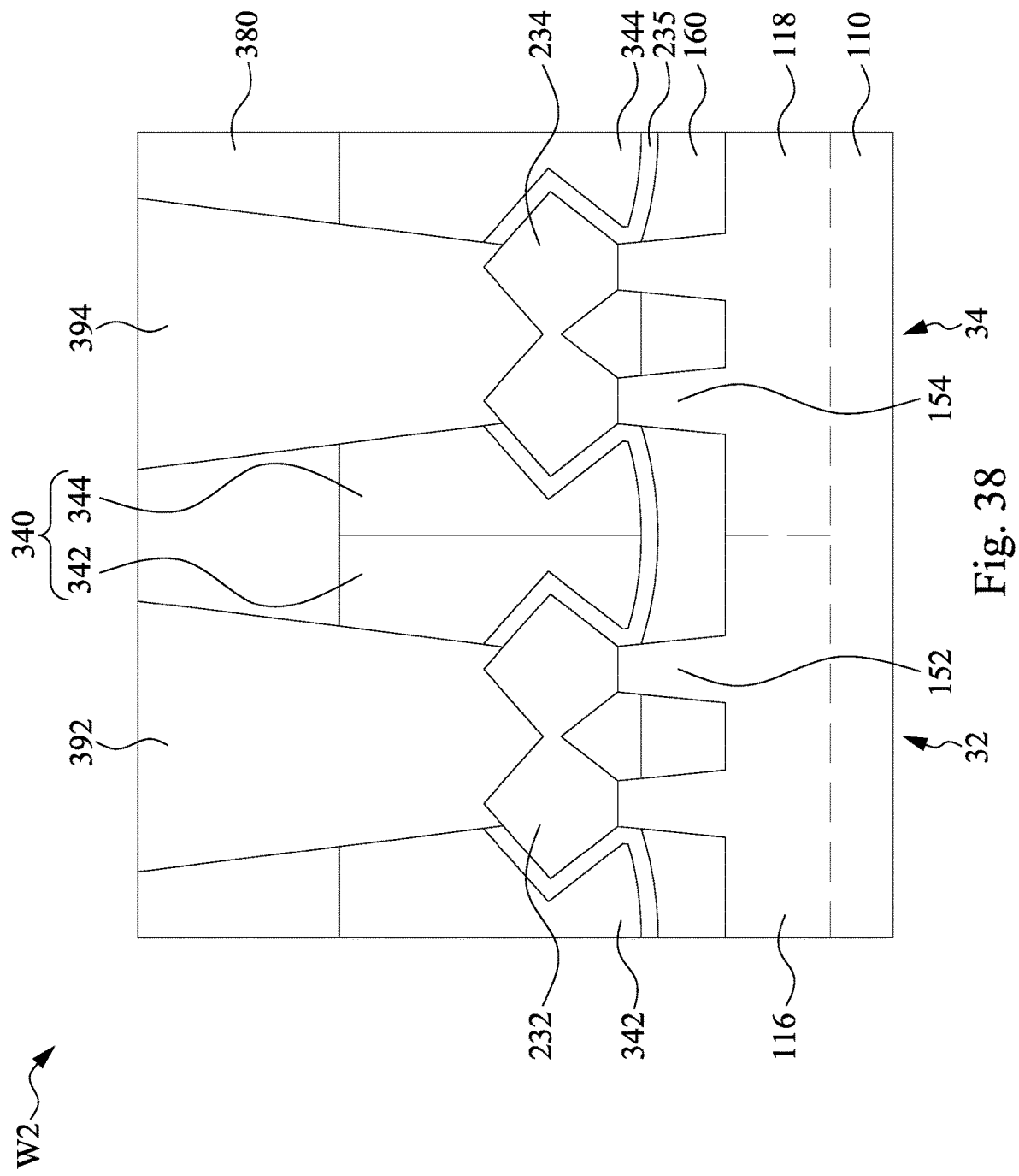

With reference to FIGS. 37A and 37B, a planarization process C6 such as chemical mechanical polish (CMP) is performed to remove portions of the flowable dielectric materials 342 and 344 and the CESL 235 above a top surface of the dummy gate structure 200 or top surfaces of the gate spacers 210, such that the top surface of the dummy gate structure 200 is exposed and the ILD layer 340 is formed. The CMP process may planarize a top surface of the flowable dielectric material 344 and a top surface of the flowable dielectric material 342 with the top surface of the dummy gate structure 200 and/or the gate spacers 210.

Operations for forming a wafer W2 (may be also referred to as a substrate) after the structure shown in FIGS. 37A and 37B at stages S42-S44 of the method M2 are substantially the same as the operations for forming the wafer W1 shown in FIGS. 21-28 at stages S22-S24 of the method M1, and reference may be made to the foregoing paragraphs for the related detailed descriptions and such descriptions are not provided again herein. Returning to FIG. 38, a source/drain contact 392 goes through an ILD layer 380, the flowable dielectric materials 342, and the CESL 235 to provide electrical contact to the epitaxial source/drain structures 232. The source/drain contact 394 goes through the ILD layer 380, the flowable dielectric materials 344, and the CESL 235 to provide electrical contact to the epitaxial source/drain structures 234. In some embodiments, material and manufacturing method of the source/drain contacts 392 and 394 and the ILD layer 380 may be substantially the same as that of the source/drain contacts 292 and 294 and the ILD layer 280 as shown in FIG. 28, and the related detailed descriptions may refer to the foregoing paragraphs, and are not described again herein.

Figure 39A:
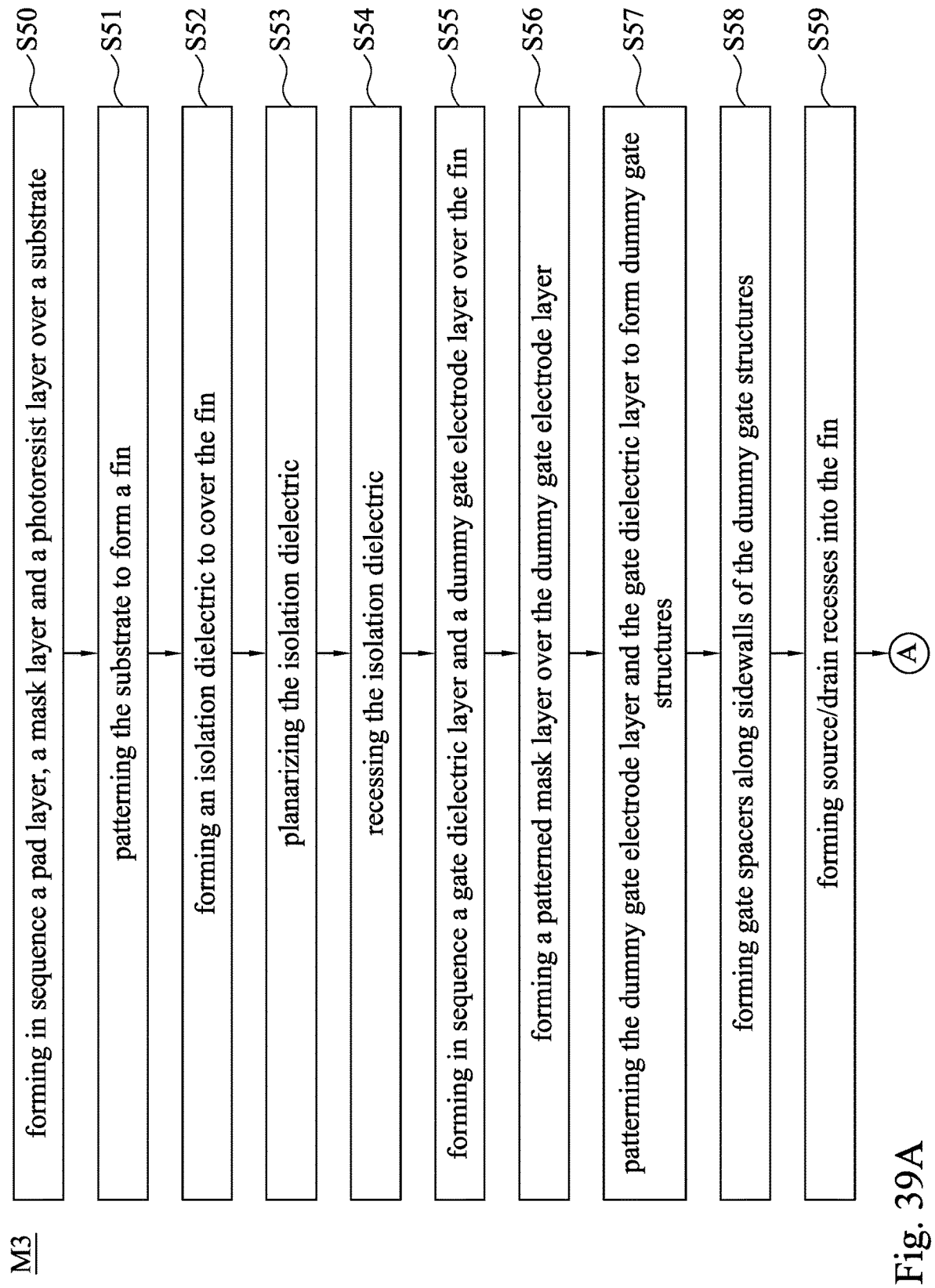
FIGS. 39A to 39B illustrate a block diagram of a method of forming a semiconductor device in accordance with some embodiments.
Figure 39B:
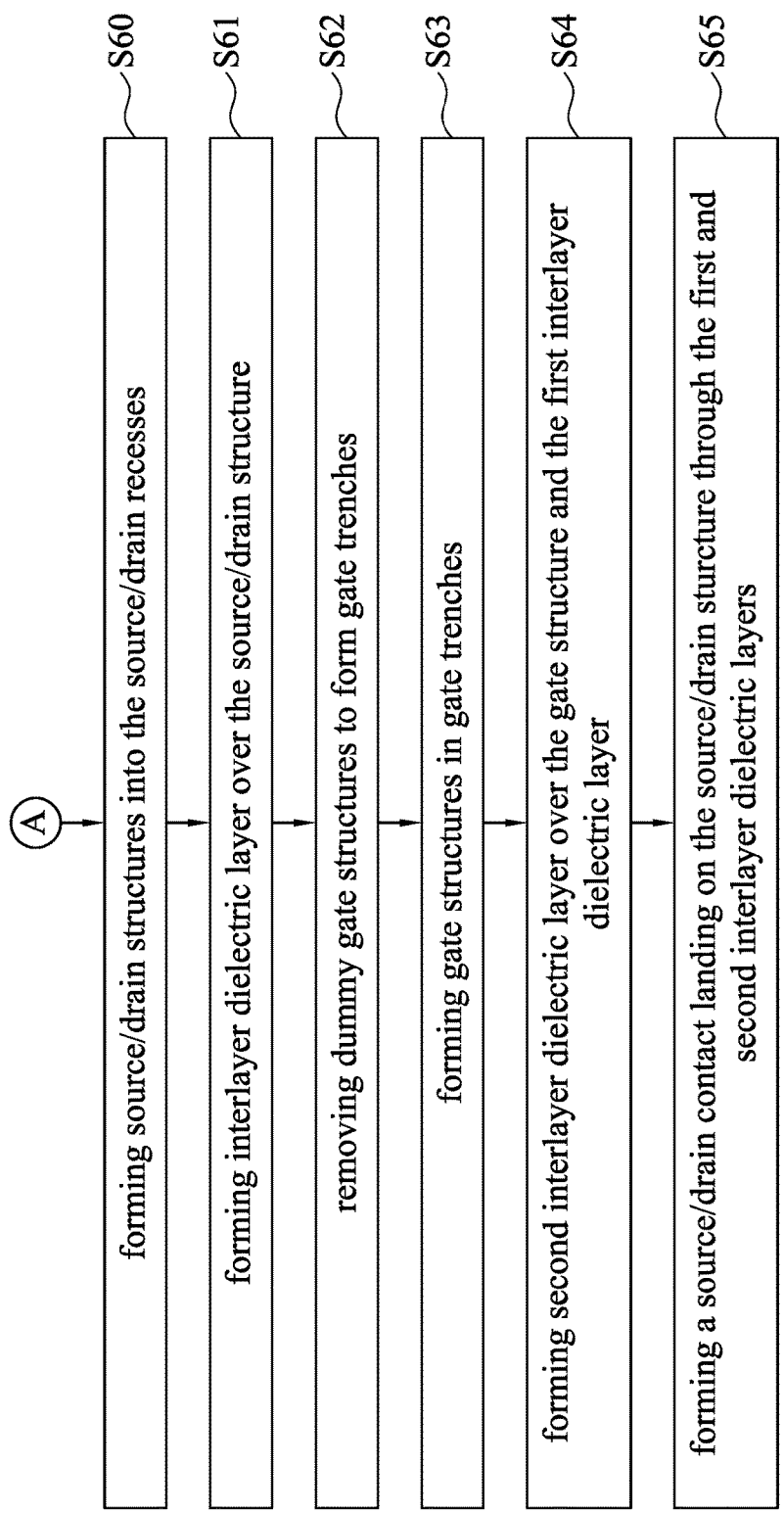

Referring now to FIGS. 39A and 39B, illustrated are an exemplary method M3 for fabrication of a semiconductor device in accordance with some embodiments. The method M3 includes a relevant part of the entire manufacturing process. It is understood that additional operations may be provided before, during, and after the operations shown by FIGS. 39A and 39B, and some of the operations described below can be replaced or eliminated for additional embodiments of the method. The order of the operations/processes may be interchangeable. The method M3 includes fabrication of a FinFET device. However, the fabrication of FinFET device is merely example for describing the manufacturing process according to some embodiments of the present disclosure.

FIGS. 40A to 45 illustrate a wafer W3 at various stages of the method M3 according to some embodiments of the present disclosure. Operations for forming a wafer W2 (may be also referred to as a substrate) before the structure shown in FIGS. 39A and 39B at stages S50-S60 of the method M3 are substantially the same as the operations for forming the wafer W1 shown in FIGS. 2-12B at stages S10-S20 of the method M1, and reference may be made to the foregoing paragraphs for the related detailed descriptions and such descriptions are not provided again herein.

Figure 40A:
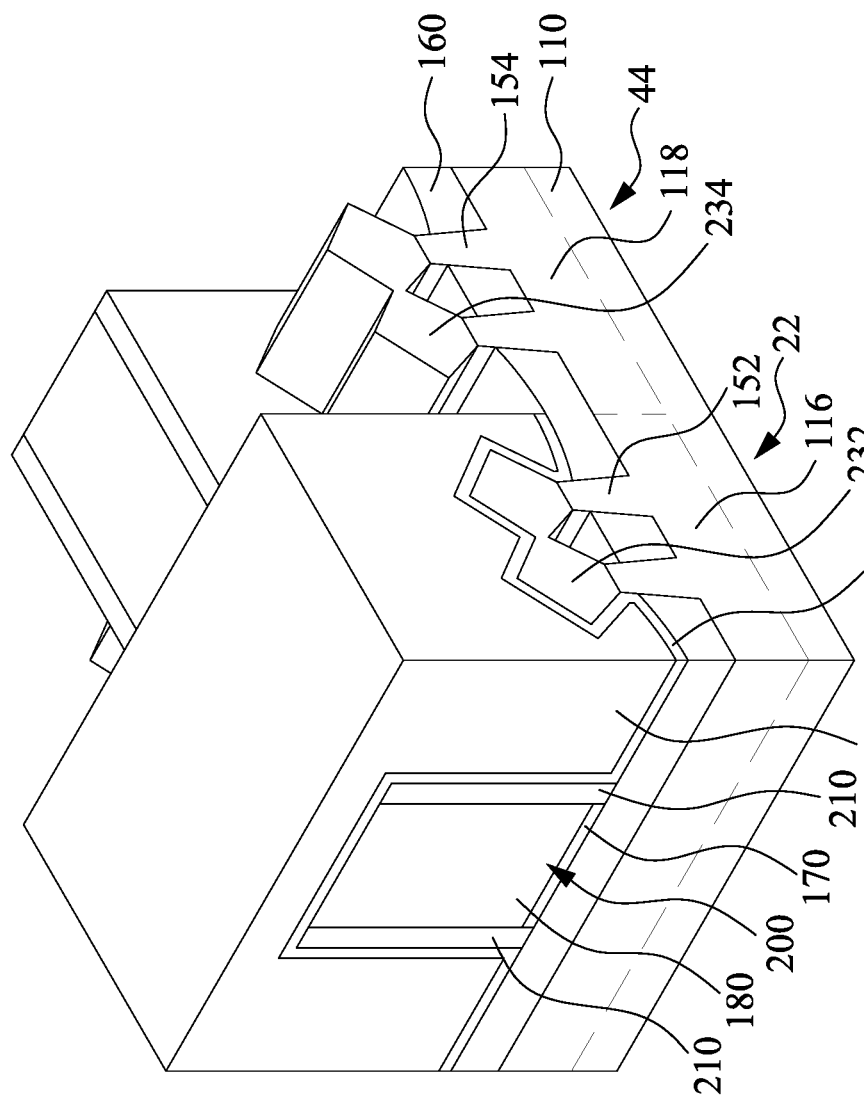
FIGS. 40A to 45 illustrate a wafer at various stages of the method in FIGS. 1A and 1B according to some embodiments of the present disclosure.
Figure 40B:
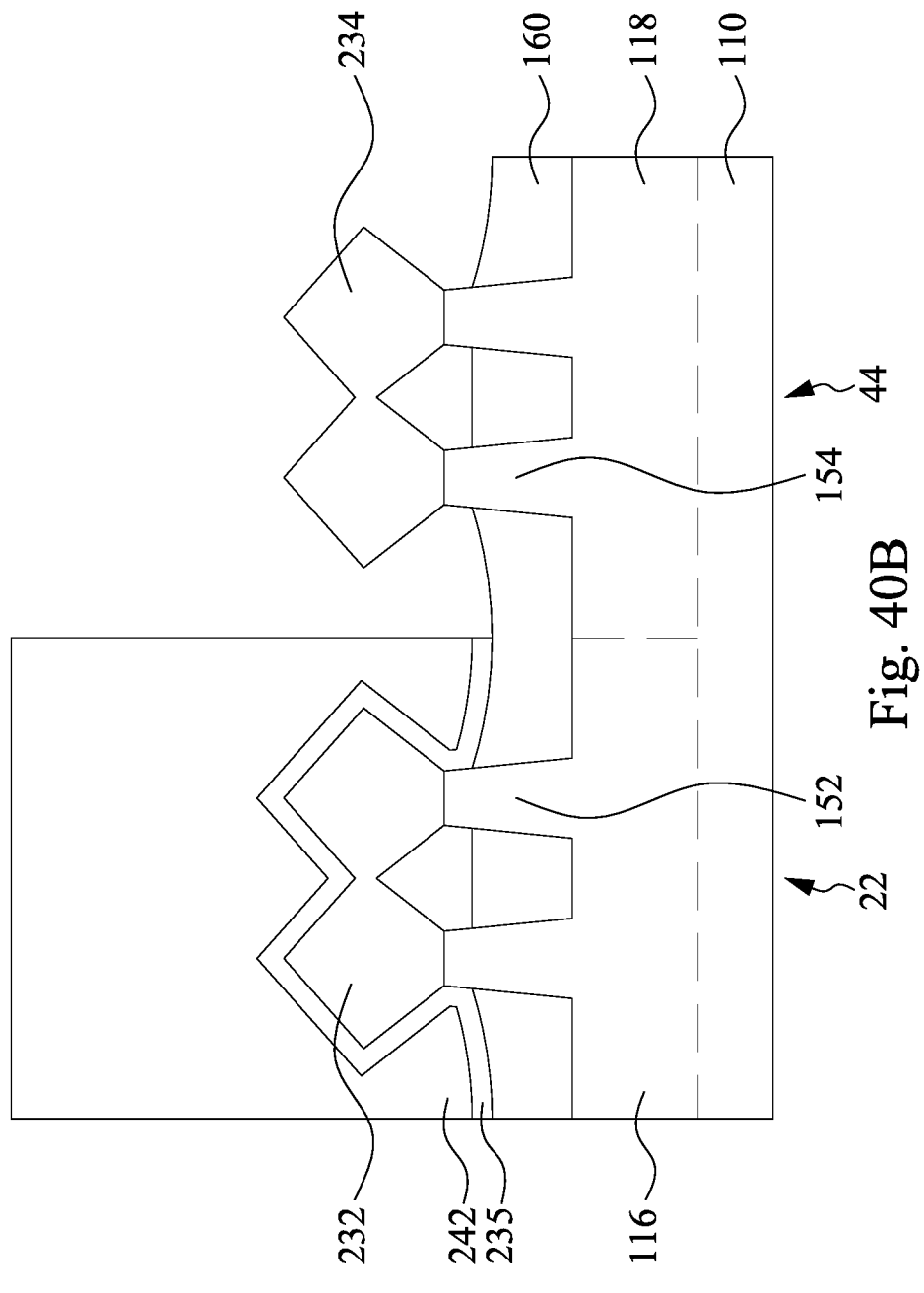

Returning to FIGS. 39A and 39B, the method M3 then proceeds to block S61 where contact etch stop layers (CESLs) and an interlayer dielectric (ILD) layer is formed over the source/drain structures. With reference to FIGS. 40A and 40B, a patterned mask layer (not shown) is formed over the flowable dielectric material 242 and then patterned to form separated mask portions overlapping the P-type well 116. One or more etching processes are performed to expose the epitaxial source/drain structure 234 and the CESL 235 above the N-type well 118 using the patterned mask as an etching mask, such that portions of the flowable dielectric material 244 and the above the N-type well 118 are removed, and the patterned mask layer is removed after the etching.

Figure 41A:
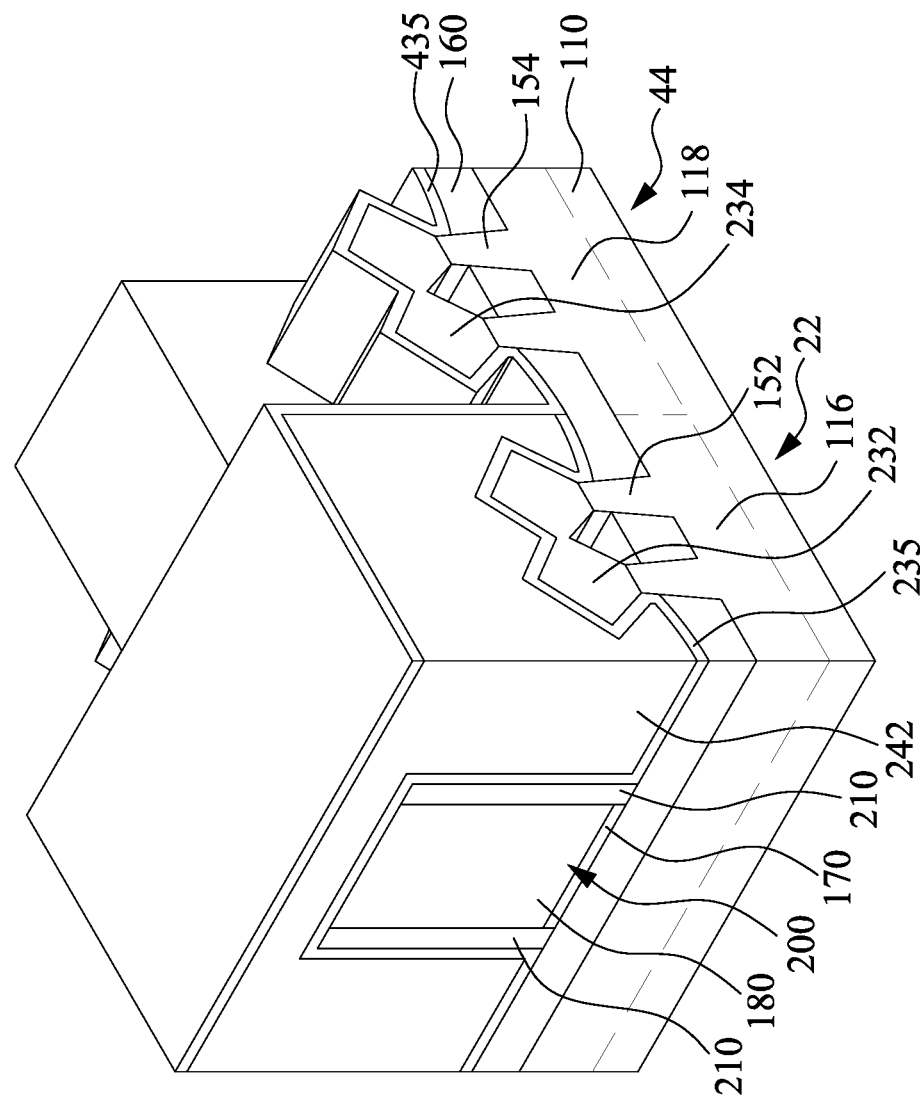
Figure 41B:
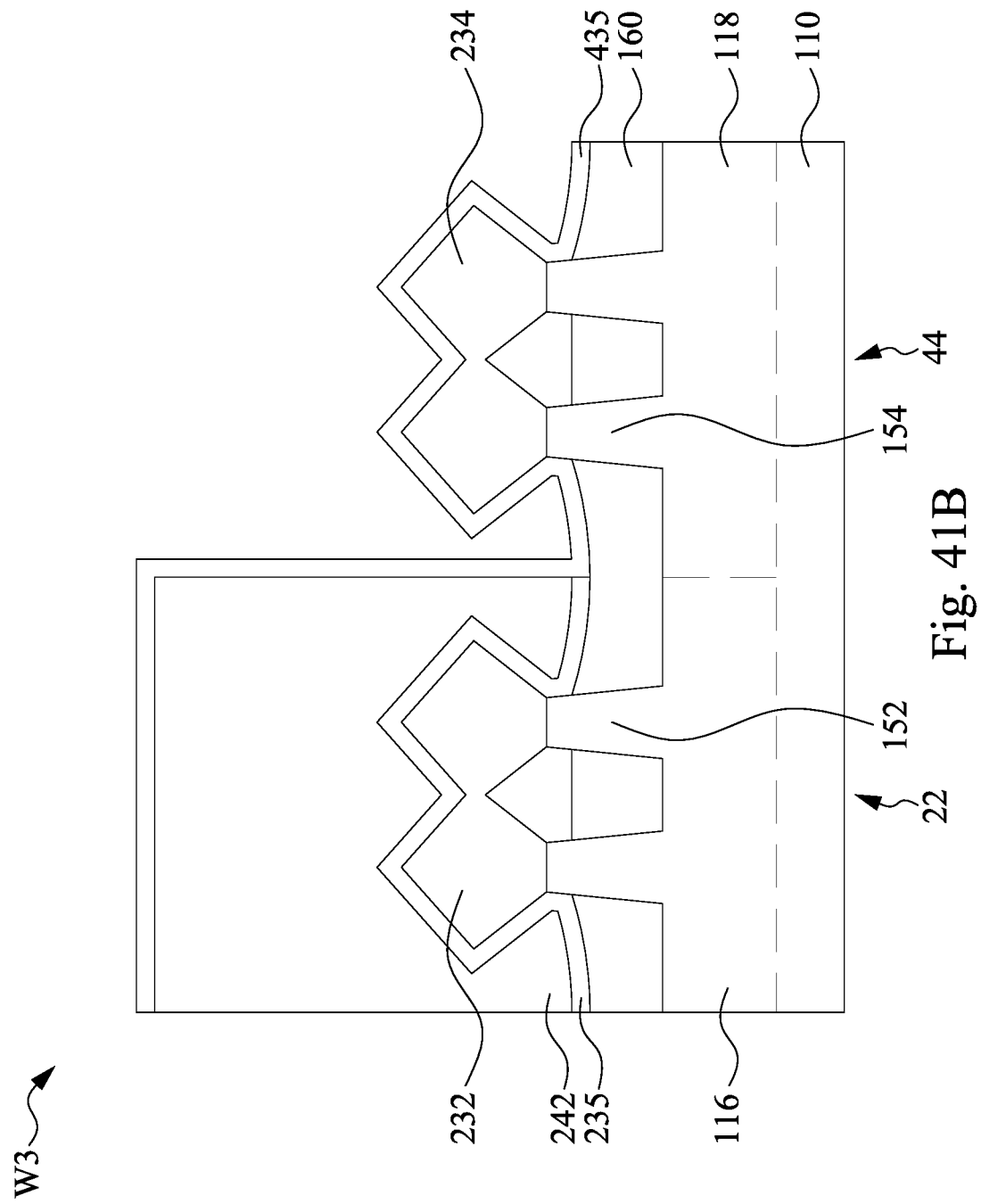

With reference to FIGS. 41A and 41B, a CESL 435 is formed over the epitaxial source/drain structure 234, the dummy gate structures 200 above the N-type well 118, the gate spacers 210 above the N-type well 118, and the flowable dielectric material 242 above the P-type well 116. In some embodiments, the CESL 435 lines a sidewall of the flowable dielectric material 242. In some embodiments, material and manufacturing method of the CESL 435 may be substantially the same as that of the CESL 235 as shown in FIGS. 13A and 13B, and the related detailed descriptions may refer to the foregoing paragraphs, and are not described again herein. In some embodiments, the CESL 435 is made of a material different from that of the CESL 235 as shown in FIGS. 13A and 13B. In some embodiments, a processing temperature range of forming the CESL 435 may be in a range from about 300° C. to about 800° C. In some embodiments, a processing duration of forming the CESL 435 may be in a range from about 1 hr to about 3 hrs. In some embodiments, the CESL 435 may form a distinguishable interface with the CESL 235 if they are formed from different materials and/or different process conditions.

In some embodiments, the processing temperature range of forming the CESL 435 above the N-type well 118 may be different from that of forming the CESL 235 above the P-type well 116 as shown in FIGS. 13A and 13B. For example, the processing temperature range of forming the CESL 435 above the N-type well 118 may be less than that of forming the CESL 235 above the P-type well 116 as shown in FIGS. 14A and 14B. In some embodiments, the processing duration of forming the CESL 435 above the N-type well 118 may be different from that of the UV curing step of forming the CESL 235 above the P-type well 116 as shown in FIGS. 14A and 14B. For example, the processing duration of forming the CESL 435 above the N-type well 118 may be less than that of forming the CESL 235 above the P-type well 116 as shown in FIGS. 14A and 14B.

Figure 42A:
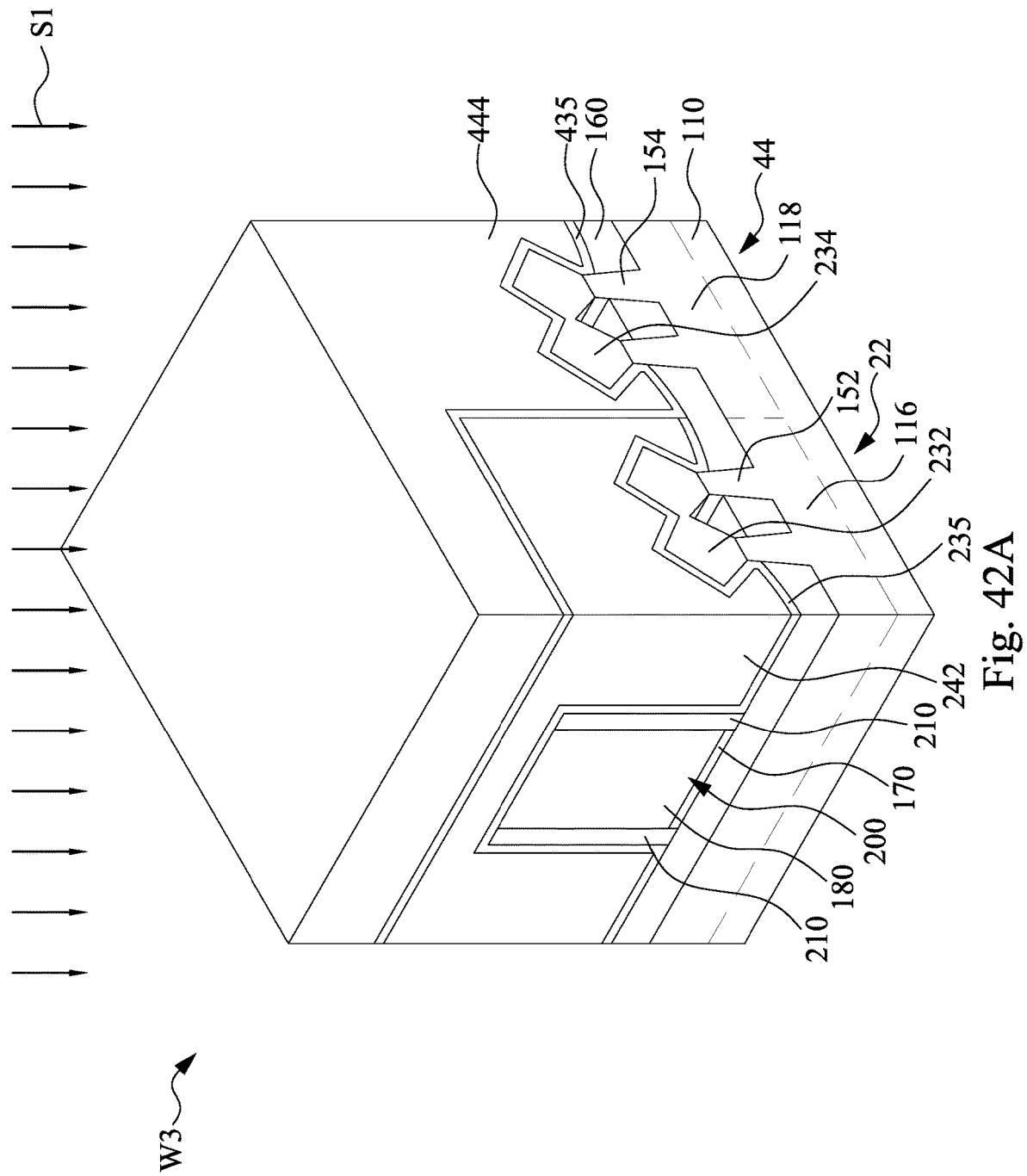
Figure 42B:
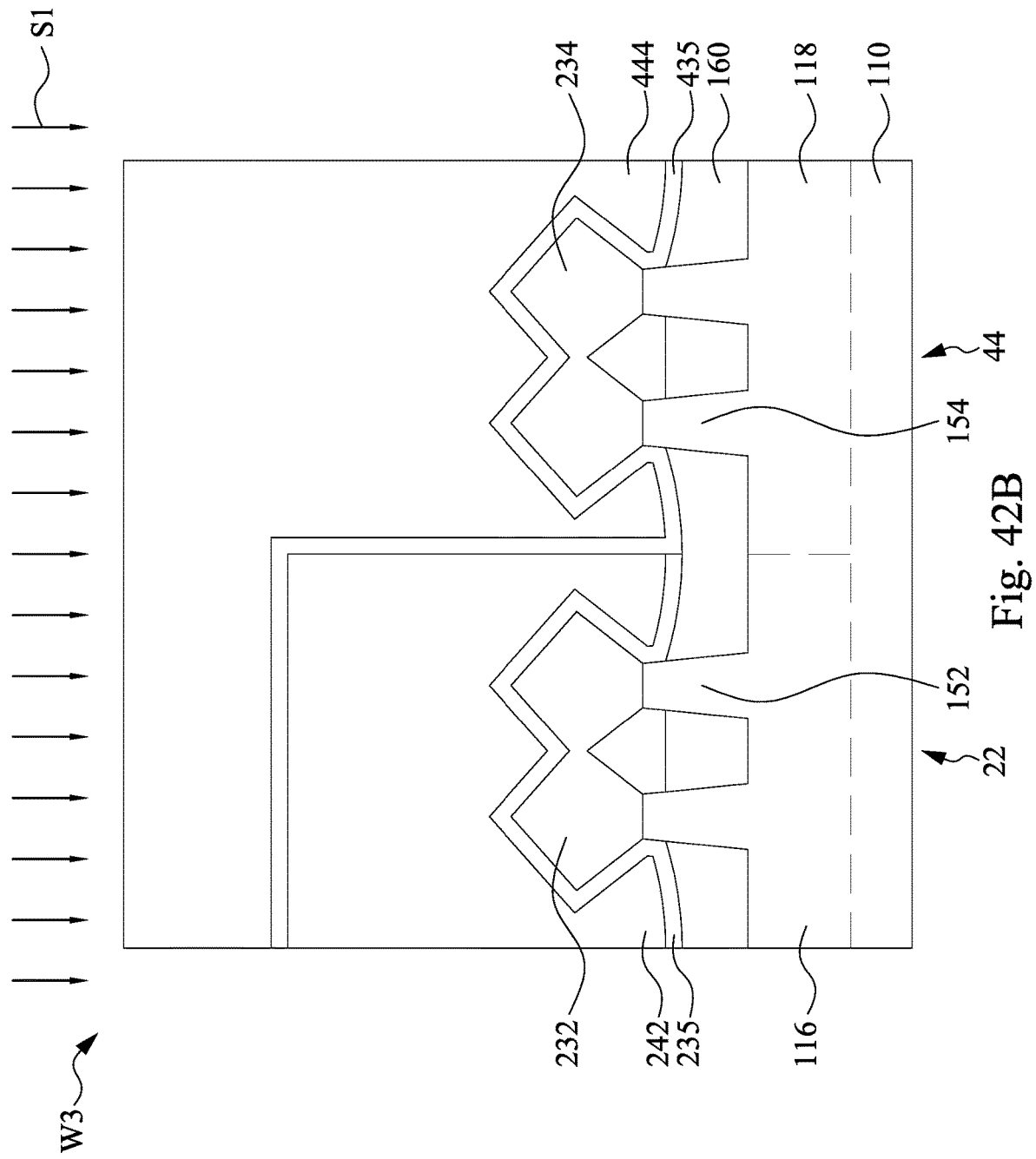

With reference to FIGS. 42A and 42B, a flowable dielectric material 444 is formed over the CESL 435 above the N-type well 118, formed over the flowable dielectric material 444 above the P-type well 116, and is deposited by a deposition process S1. In some embodiments, material and manufacturing method of the flowable dielectric material 444 may be substantially the same as that of the flowable dielectric material 244 as shown in FIGS. 18A and 18B, and the related detailed descriptions may refer to the foregoing paragraphs, and are not described again herein. In greater detail, the deposition process S1 may be substantially the same as the deposition process P4 as shown in FIGS. 18A and 18B, and the related detailed descriptions may refer to the foregoing paragraphs, and are not described again herein.

In some embodiments, the as-deposited flowable dielectric material 444 is capable of filling the narrow and deep gaps and prevents voids and discontinuities in the trenches T (See FIG. 3). The as-deposited flowable dielectric material 444 includes a flowable network of $SiO_A N_B H_C$ (or SiONH). In some embodiments, A is a number in a range from about 0 to about 2, B is a number from about 0.01 to about 1, and C is a number from about 0.01 to about 1.

Figure 43B:
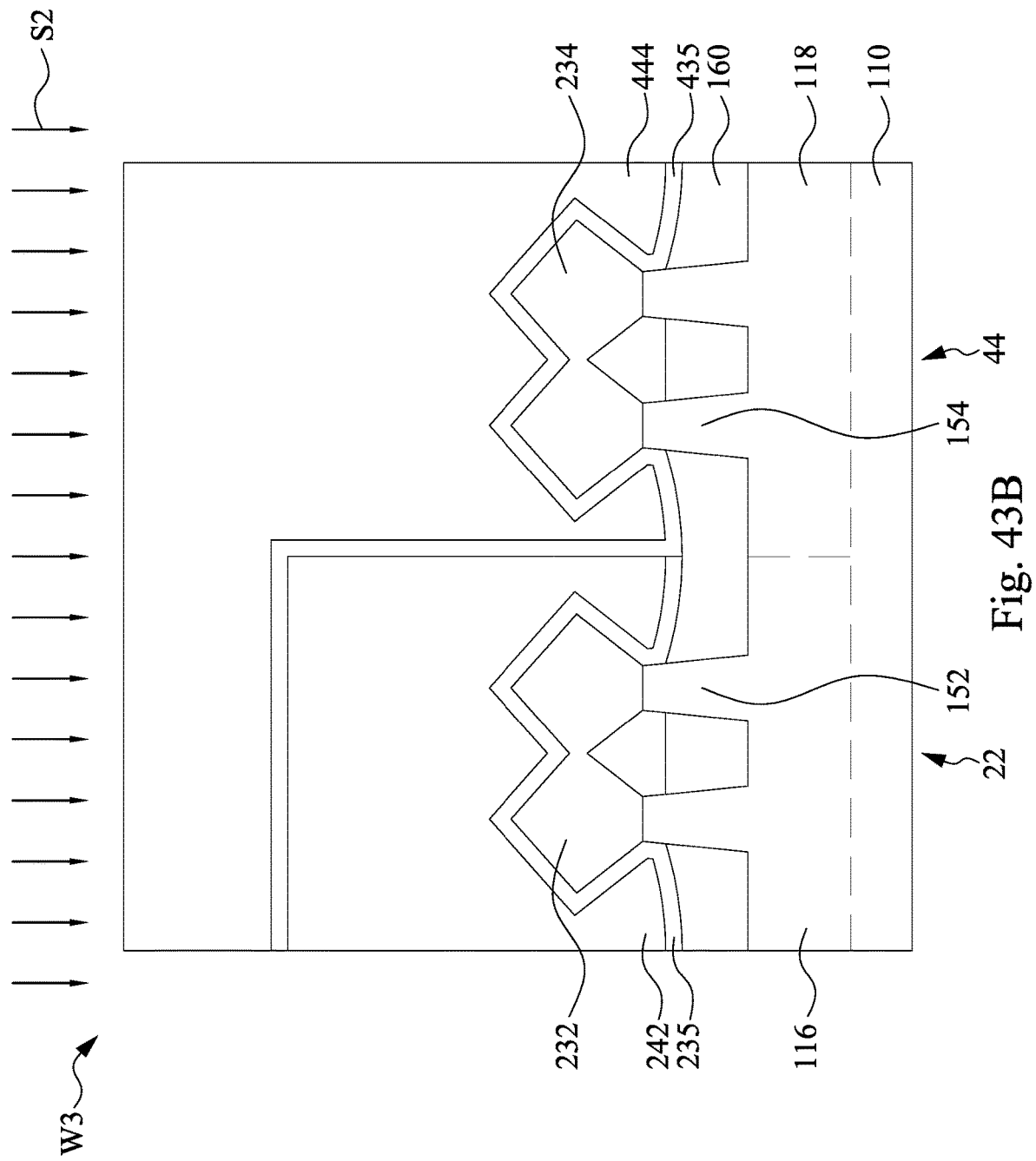

With reference to FIGS. 43A and 43B, after the flowable dielectric material 444 is deposited, an in-situ curing process S2 can be performed on the as-deposited flowable dielectric material 444. In-situ means the curing process S2 is performed in the process chamber for depositing the flowable dielectric material 444. In some embodiments, the curing process S2 can be performed in a different chamber (or ex-situ). In some embodiments, the curing process S2 may be substantially the same as the curing process P5 as shown in FIGS. 19A and 19B, and the related detailed descriptions may refer to the foregoing paragraphs, and are not described again herein.

In some embodiments, after the curing process S2, the SiOH and SiO network may be converted into SiO (or $SiO_2$) network. In greater detail, the curing process S2 may also cause the flowable dielectric material 444 to shrink. The duration and temperature of the dry anneal process step affect the amount of shrinkage. In some embodiments, the volume of the flowable dielectric material 444 shrinks in a range from about 5% to about 20%. In some embodiments, shrink amount of the flowable dielectric material 444 during the curing process S2 is less than that of the flowable dielectric material 242 during the curing process P2. Because of the porosity difference between the flowable dielectric materials 242 and 444, the flowable dielectric materials 242 and 444 may form a distinguishable interface therebetween. In some embodiments, the flowable dielectric materials 242 and 444 may form a vertical interface vertically aligned with the interface between the P-type well 116 and the N-type well 118.

Due to the shrinkage of the flowable dielectric material 444, the flowable dielectric material 444 may exert a predetermined compressive stress on the epitaxial source/drain structure 234, in which the compressive stress exerted on the p-type source/drain structure 234 by the flowable dielectric material 444 is less than the compressive stress exerted on the n-type source/drain structure 232 by the flowable dielectric material 242. In some embodiments, the flowable dielectric material 444 may provide no or negligible compressive stress to the p-type epitaxial source/drain structure 234, thereby alleviating the negative impacts on carrier mobility and performance of the PMOS 44 caused by an excessively large compressive stress. In some embodiments where the shrink amount of the flowable dielectric material 242 is greater than that of the flowable dielectric material 444 during the curing process S2, the shrinkage of flowable dielectric material 242 may exert a tensile stress on the flowable dielectric material 444, which in turn exerts a tensile stress on the p-type epitaxial source/drain structure 234 and the underlying fins 154, thus improving the carrier mobility of PMOS 44.

In some embodiments, the PMOS 44 and NMOS 22 obtain different stress values from the flowable dielectric materials 242 and 444. The different stress values transferred to channel regions may cause different stress values in the semiconductor fins 152 and 154 due to different types of majority carrier. The flowable dielectric materials 242 and 444 are able to increase and maintain the stress values in the semiconductor fins 152 and 154.

Figure 44A:
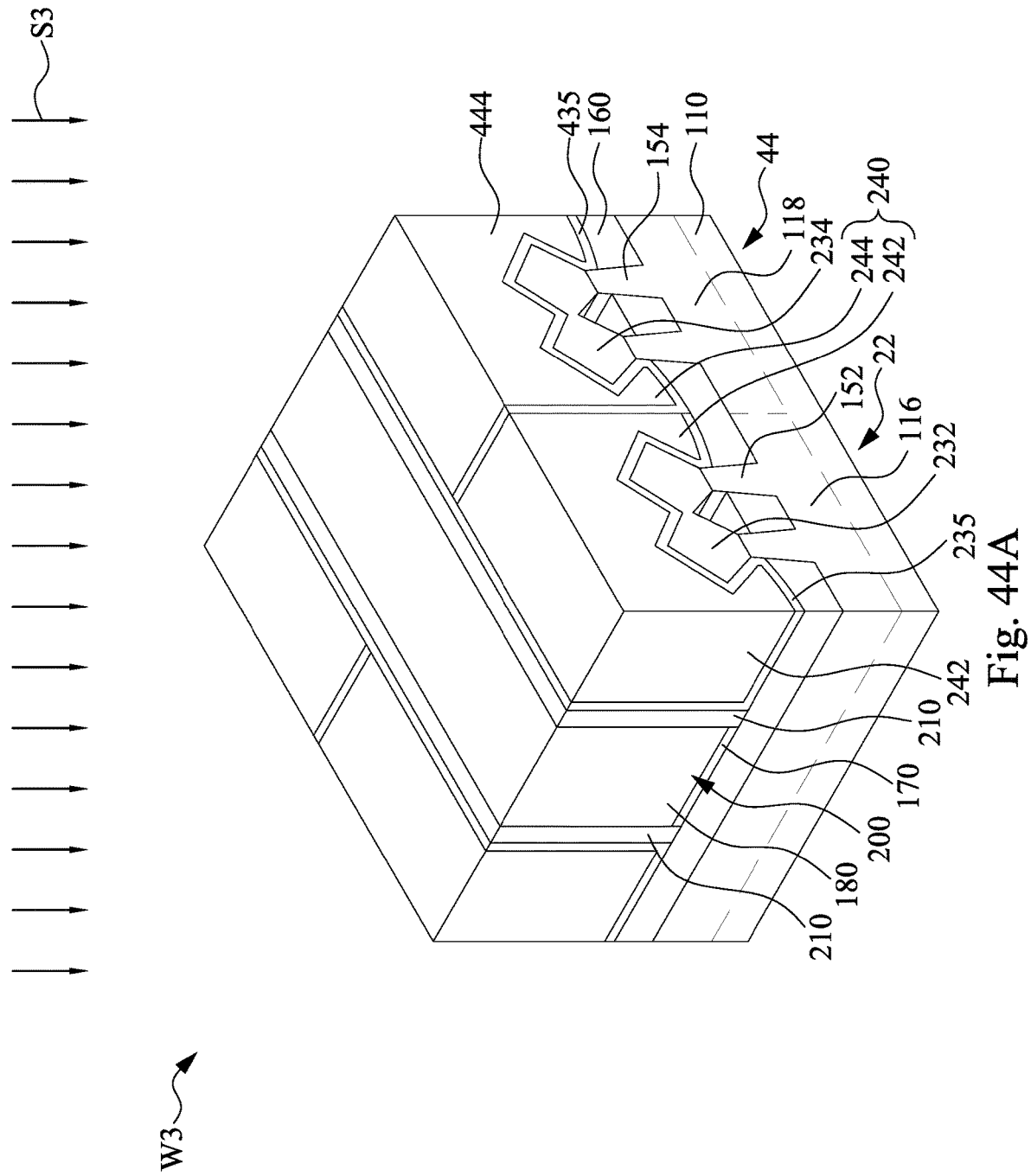
Figure 44B:
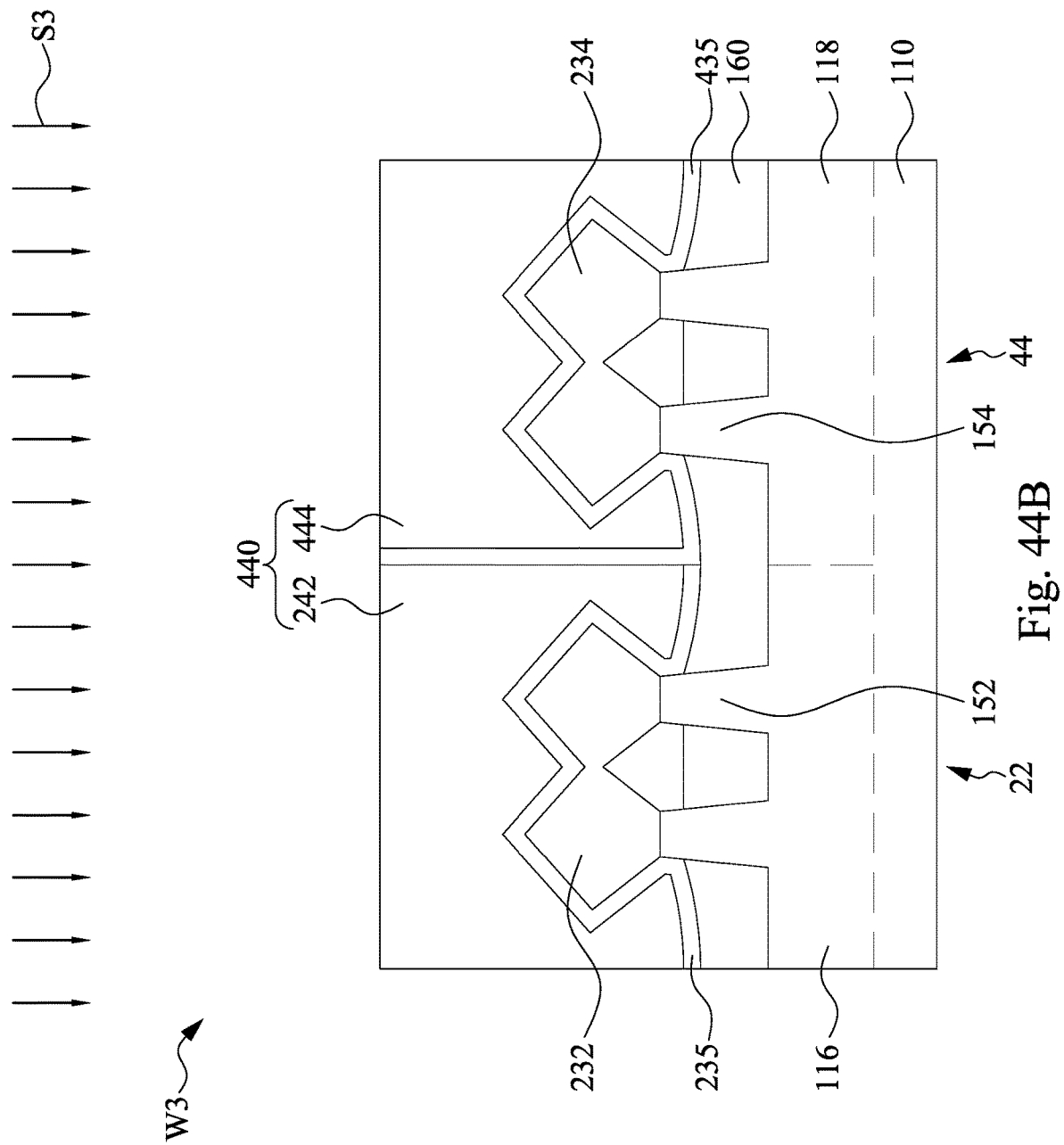
Figure 45:
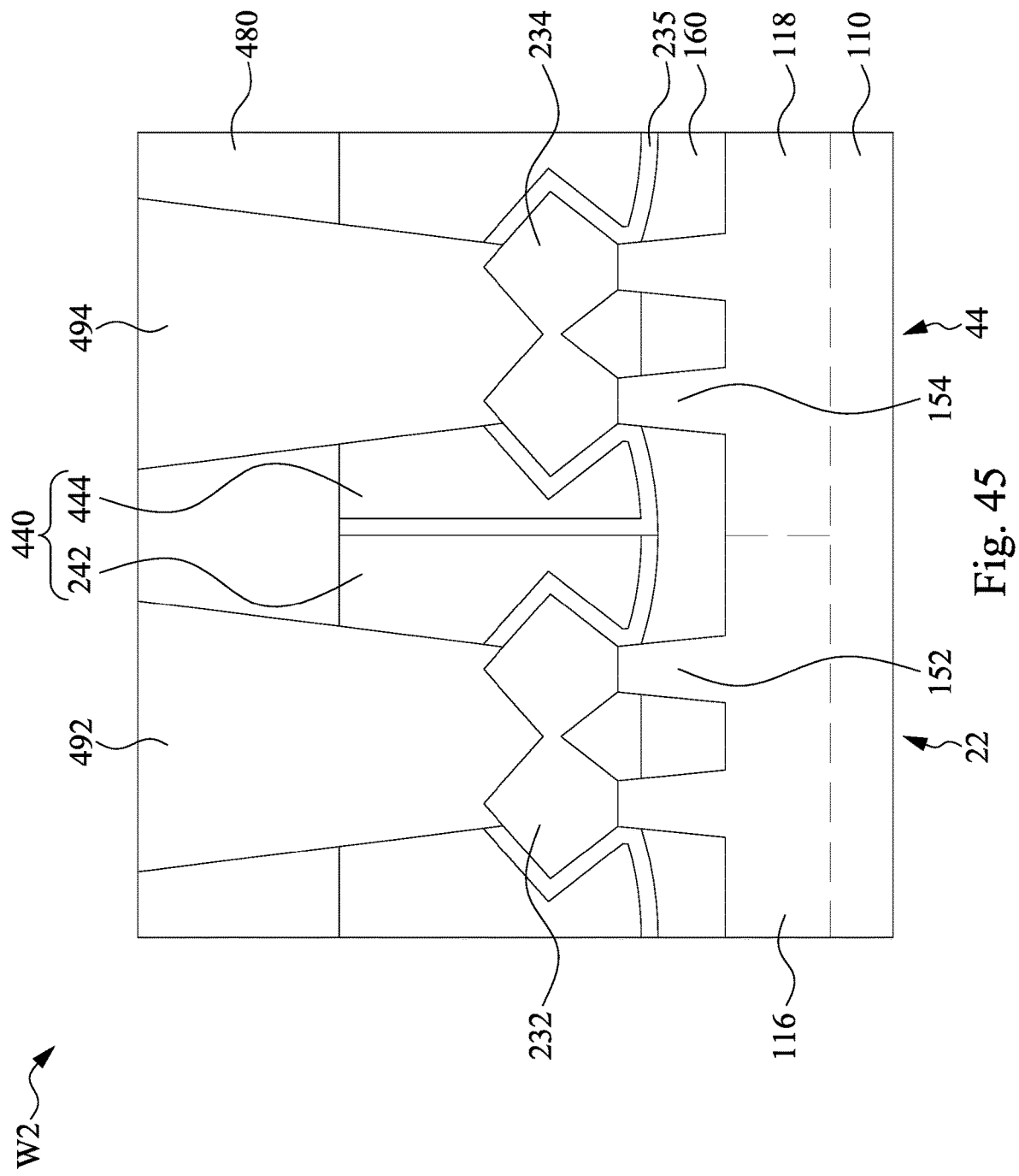

With reference to FIGS. 44A and 44B, a planarization process S3 such as chemical mechanical polish (CMP) is performed to remove portions of the flowable dielectric materials 242 and 444 and the CESLs 235 and 435 above a top surface of the dummy gate structure 200 or top surfaces of the gate spacers 210, such that the top surface of the dummy gate structure 200 is exposed and the ILD layer 440 is formed. The CMP process may planarize a top surface of the flowable dielectric material 444, a top surface of the flowable dielectric material 242, and a top surface of the CESL 435 with the top surface of the dummy gate structure 200 and/or the gate spacers 210.

Operations for forming a wafer W3 (may be also referred to as a substrate) after the structure shown in FIGS. 44A and 44B at stages S42-S44 of the method M3 are substantially the same as the operations for forming the wafer W1 shown in FIGS. 21-28 at stages S22-S24 of the method M1, and reference may be made to the foregoing paragraphs for the related detailed descriptions and such descriptions are not provided again herein. Returning to FIG. 45, a source/drain contact 492 goes through an ILD layer 480, the flowable dielectric materials 442, and the CESL 235 to provide electrical contact to the epitaxial source/drain structures 232. The source/drain contact 494 goes through the ILD layer 480, the flowable dielectric materials 444, and the CESL 435 to provide electrical contact to the epitaxial source/drain structures 234. In some embodiments, material and manufacturing method of the source/drain contacts 492 and 494 and the ILD layer 480 may be substantially the same as that of the source/drain contacts 492 and 494 and the ILD layer 280 as shown in FIG. 28, and the related detailed descriptions may refer to the foregoing paragraphs, and are not described again herein.

According to the aforementioned embodiments, it can be seen that the present disclosure offers advantages in fabricating semiconductor devices. It is understood, however, that other embodiments may offer additional advantages, and not all advantages are necessarily disclosed herein.

An advantage is that stress may enhance carrier mobility and performance of the MOS. Due to the shrinkage of the flowable dielectric material, the flowable dielectric material may exert a predetermined stress on the epitaxial source/drain structure. The epitaxial source/drain structure may transfer the stress into the semiconductor fins (i.e., channel regions). As such, the stress provided by the flowable dielectric material transfers to the semiconductor fins via the source/drain structure, thereby enhancing carrier mobility and performance of the semiconductor device.

In greater detail, because different curing temperatures for first and second flowable dielectric materials may vary the amount of shrinkage of the first and second flow able dielectric materials, a first stress of the first flowable dielectric material of the NMOS may be different from a second stress of the second flowable dielectric material of the PMOS. Hence, when applied in a longitudinal direction (i.e., in the direction of current flow), the first stress may enhance electron mobility (NMOS drive currents) while the second stress may be more suitable for hole mobility (PMOS drive currents) and the performance of the PMOS.

In some embodiments, a method for manufacturing a semiconductor device includes: forming a shallow trench isolation structure surrounding a first semiconductor fin and a second semiconductor fin; forming a dummy gate structure across the first and second semiconductor fins; forming a first flowable dielectric layer over the first and second semiconductor fins; curing the first flowable dielectric layer at a first temperature; removing a first portion of the cured first flowable dielectric layer from above the second semiconductor fin; after removing the first portion of the cured first flowable dielectric layer, forming a second flowable dielectric layer over the second semiconductor fin; curing the second flowable dielectric layer at a second temperature different from the first temperature; and replacing the dummy gate structure with a metal gate structure.

In some embodiments, a method for manufacturing a semiconductor device includes: forming a shallow trench isolation structure surrounding a first semiconductor fin and a second semiconductor fin; forming a gate structure across the first and second semiconductor fins; forming a first flowable dielectric layer over the first and second semiconductor fins; annealing, using a first steam, the first flowable dielectric layer at a first temperature; removing a first portion of the cured first flowable dielectric layer from above the second semiconductor fin; after removing the first portion of the cured first flowable dielectric layer, forming a second flowable dielectric layer over the second semiconductor fin; and annealing, using a second steam, the second flowable dielectric layer at a second temperature temperature, wherein the second temperature is different from the first temperature.

In some embodiments, a semiconductor device includes an N-type fin-like field effect transistor, a P-type fin-like field effect transistor, a shallow trench isolation, a first interlayer dielectric (ILD) layer, and a second ILD layer. The N-type fin-like field effect transistor includes a first semiconductor fin, a gate structure across the first semiconductor fin, and a first source/drain feature in contact with the first semiconductor fin. The P-type fin-like field effect transistor includes a second semiconductor fin, the gate structure across the second semiconductor fin, and a second source/drain feature in contact with the second semiconductor fin. The shallow trench isolation (STI) structure surrounds the first and second semiconductor fins. The first interlayer dielectric (ILD) layer covers the first source/drain feature. The second ILD layer covers the second source/drain feature. A porosity of the second ILD layer might be greater than a porosity of the first ILD layer.

In some embodiments, a semiconductor device includes an N-type fin-like field effect, a P-type fin-like field effect transistor, a shallow trench isolation (STI) structure, a first interlayer dielectric (ILD) layer, and a second ILD layer. The N-type fin-like field effect transistor includes a first semiconductor fin, a gate structure across the first semiconductor fin, and a first source/drain feature in contact with the first semiconductor fin. The P-type fin-like field effect transistor includes a second semiconductor fin, the gate structure across the second semiconductor fin, and a second source/drain feature in contact with the second semiconductor fin. The structure surrounds the first and second semiconductor fins. The first interlayer dielectric (ILD) layer covers the first source/drain feature. The second ILD layer covers the second source/drain feature, wherein a porosity of the second ILD layer is greater than a porosity of the first ILD layer. In some embodiments, the second dielectric layer has a sidewall in contact with a sidewall of the first dielectric layer. In some embodiments, the first and second ILD layers form an interface extending upwardly from above the STI structure. In some embodiments, the first ILD layer is made of silicon oxide. In some embodiments, the second ILD layer is made of a same material as the first ILD layer. In some embodiments, the second ILD layer has a top surface level with a top surface of the first ILD layer. In some embodiments, the second ILD layer has a top surface level with a top surface of the gate structure. In some embodiments, the semiconductor device further includes an etch stop layer over the first and second epitaxial structures and below the first and second ILD layers. In some embodiments, the semiconductor device further includes an etch stop layer over the second source/drain feature and having a vertical portion extending upwardly from the STI structure to between a sidewall of the first ILD layer and a sidewall of the second ILD layer. In some embodiments, the semiconductor device further includes an etch stop layer over the second source/drain feature and non-overlapping with the first source/drain feature.

In some embodiments, a semiconductor device includes a substrate, first and second semiconductor fins, a shallow trench isolation structure, a gate structure, first epitaxial structures, second epitaxial structures, a first dielectric layer, and a second dielectric layer. The first and second semiconductor fins extend upwardly form the substrate. The shallow trench isolation structure laterally surrounds lower portions of the first and second semiconductor fins. The gate structure extends across upper portions of the first and second semiconductor fins. The first epitaxial structures are on the first semiconductor fin and on opposite sides of the gate structure. The second epitaxial structures are on the second semiconductor fin and on opposite sides of the gate structure. The first dielectric layer is over the first epitaxial structures. The second dielectric layer is over the second epitaxial structures and has a sidewall in contact with a sidewall of the first dielectric layer. In some embodiments, the first and second dielectric layers form an interface extending upwardly from above the substrate. In some embodiments, the second dielectric layer has a different porosity than the first dielectric layer. In some embodiments, the second dielectric layer is made of a same material as the first dielectric layer. In some embodiments, the first epitaxial structures is of an N-type field effect transistor and the second epitaxial structures is of a P-type field effect transistor. In some embodiments, the semiconductor device further includes an etch stop layer over the second source/drain feature and non-overlapping with the first source/drain feature.

In some embodiments, a semiconductor device includes a substrate, first and second semiconductor fins, a first gate structure, a second gate structure, first epitaxial structures, second epitaxial structures, a first interlayer dielectric (ILD) layer, an etch stop layer, and a second ILD layer. The first and second semiconductor fins extend upwardly form the substrate. The first gate structure extends across the first semiconductor fin. The second gate structure extends across the second semiconductor fin. The first epitaxial structures are on the first semiconductor fin and on opposite sides of the first gate structure. The second epitaxial structures are on the second semiconductor fin and on opposite sides of the second gate structure. The first interlayer dielectric (ILD) layer is over the first epitaxial structures. The etch stop layer is over the second epitaxial structure. The second ILD layer is over the etch stop layer and separated from the first ILD layer by the etch stop layer. In some embodiments, the first etch stop layer has a vertical portion extending upwardly from the substrate to between a sidewall of the first ILD layer and a sidewall of the second ILD layer. In some embodiments, the semiconductor device further includes a second etch stop layer over the first epitaxial structure and non-overlapping the second epitaxial structures. In some embodiments, the second ILD layer has a different porosity than the first ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an N-type fin-like field effect transistor comprising:
   a first semiconductor fin;
   a gate structure across the first semiconductor fin; and
   a first source/drain feature in contact with the first semiconductor fin;
a P-type fin-like field effect transistor comprising:
   a second semiconductor fin;
   the gate structure across the second semiconductor fin; and
   a second source/drain feature in contact with the second semiconductor fin;
a shallow trench isolation (STI) structure surrounding the first and second semiconductor fins;
a first interlayer dielectric (ILD) layer covering the first source/drain feature; and
a second ILD layer covering the second source/drain feature, wherein a porosity of the second ILD layer is greater than a porosity of the first ILD layer.

2. The semiconductor device of claim 1, wherein the second ILD layer has a sidewall in contact with a sidewall of the first ILD layer.

3. The semiconductor device of claim 1, wherein the first and second ILD layers form an interface extending upwardly from the STI structure.

4. The semiconductor device of claim 1, wherein the first ILD layer is made of silicon oxide.

5. The semiconductor device of claim 1, wherein the second ILD layer is made of a same material as the first ILD layer.

6. The semiconductor device of claim 1, wherein the second ILD layer has a top surface level with a top surface of the first ILD layer.

7. The semiconductor device of claim 1, wherein the second ILD layer has a top surface level with a top surface of the gate structure.

8. The semiconductor device of claim 1, further comprising an etch stop layer over the first and second epitaxial structures and below the first and second ILD layers.

9. The semiconductor device of claim 1, further comprising an etch stop layer over the second source/drain feature and having a vertical portion extending upwardly from the STI structure, the vertical portion of the etch stop layer being between a sidewall of the first ILD layer and a sidewall of the second ILD layer.

10. The semiconductor device of claim 1, further comprising an etch stop layer over the second source/drain feature and non-overlapping with the first source/drain feature.

11. A semiconductor device, comprising:
a substrate;
first and second semiconductor fins extending upwardly form the substrate;
a shallow trench isolation structure laterally surrounding lower portions of the first and second semiconductor fins;
a gate structure extending across upper portions of the first and second semiconductor fins;
first epitaxial structures on the first semiconductor fin and on opposite sides of the gate structure;

second epitaxial structures on the second semiconductor fin and on opposite sides of the gate structure;

a first dielectric layer over the first epitaxial structures; and a second dielectric layer over the second epitaxial structures, the second dielectric layer having a sidewall in contact with a sidewall of the first dielectric layer.

12. The semiconductor device of claim 11, wherein the first and second dielectric layers form a vertical interface.

13. The semiconductor device of claim 11, wherein the second dielectric layer has a different porosity than the first dielectric layer.

14. The semiconductor device of claim 11, wherein the second dielectric layer is made of a same material as the first dielectric layer.

15. The semiconductor device of claim 11, wherein the first epitaxial structures are n-type and the second epitaxial structures are p-type.

16. The semiconductor device of claim 11, further comprising an etch stop layer over the second source/drain feature and non-overlapping with the first source/drain feature.

17. A semiconductor device, comprising:

a substrate;

first and second semiconductor fins extending upwardly form the substrate;

a first gate structure extending across the first semiconductor fin;

a second gate structure extending across the second semiconductor fin;

first epitaxial structures on the first semiconductor fin and on opposite sides of the first gate structure;

second epitaxial structures on the second semiconductor fin and on opposite sides of the second gate structure;

a first interlayer dielectric (ILD) layer over the first epitaxial structures;

a first etch stop layer over the second epitaxial structure; and a second ILD layer over the first etch stop layer and separated from the first ILD layer by the first etch stop layer.

18. The semiconductor device of claim 17, wherein the first etch stop layer has a vertical portion between a sidewall of the first ILD layer and a sidewall of the second ILD layer.

19. The semiconductor device of claim 17, further comprising a second etch stop layer over the first epitaxial structure and non-overlapping the second epitaxial structures.

20. The semiconductor device of claim 17, wherein the second ILD layer has a different porosity than the first ILD layer.

* * * * *